US 12,402,497 B2

United States Patent
Shin et al.

(12) United States Patent
Shin et al.

(10) Patent No.: US 12,402,497 B2
(45) Date of Patent: Aug. 26, 2025

(54) DISPLAY DEVICE

(71) Applicant: Samsung Display Co., LTD., Yongin-si (KR)

(72) Inventors: Dong Hee Shin, Asan-si (KR); Sun Kwun Son, Suwon-si (KR); Na Hyeon Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 630 days.

(21) Appl. No.: 17/689,440

(22) Filed: Mar. 8, 2022

(65) Prior Publication Data

US 2022/0392990 A1  Dec. 8, 2022

(30) Foreign Application Priority Data

Jun. 8, 2021  (KR) .................. 10-2021-0073903

(51) Int. Cl.
*H10K 59/131* (2023.01)
*H10K 59/18* (2023.01)

(52) U.S. Cl.
CPC .......... *H10K 59/131* (2023.02); *H10K 59/18* (2023.02)

(58) Field of Classification Search
CPC ...... H10K 59/18; H10K 59/131; H01L 33/62; G09G 2300/0426
See application file for complete search history.

(56) References Cited

U.S. PATENT DOCUMENTS 10,170,534 B1 *  1/2019  Kim .................. H01L 27/124
10,743,425 B2    8/2020  Park et al.
2019/0198589 A1 *  6/2019  Choi ................ H10K 59/80518
2020/0135835 A1    4/2020  Seo et al.
2020/0168688 A1    5/2020  Lee et al.
2021/0296406 A1 *  9/2021  Fang .................... H10K 59/123
2022/0068998 A1 *  3/2022  Luo ...................... G06F 3/0412
2022/0208909 A1 *  6/2022  Jeon .................... G09F 9/3026

FOREIGN PATENT DOCUMENTS

| KR | 10-2013-0024385 | 3/2013 |
| KR | 10-2018-0078672 | 7/2018 |
| KR | 10-2019-0042168 | 4/2019 |
| KR | 10-2019-0142793 | 12/2019 |
| KR | 10-2020-0008837 | 1/2020 |
| KR | 10-2020-0047933 | 5/2020 |

OTHER PUBLICATIONS

International Search Report corresponding to International Application No. PCT/KR2022/007090 dated Aug. 26, 2022.
Written Opinion corresponding to International Application No. PCT/KR2022/007090, dated Aug. 26, 2022.

* cited by examiner

*Primary Examiner* — Eric K Ashbahian
(74) *Attorney, Agent, or Firm* — KILE PARK REED & HOUTTEMAN PLLC

(57) ABSTRACT

A display device includes a first substrate, an external signal line disposed on the first substrate, a second substrate disposed on the external signal line, the second substrate includes a contact hole exposing a surface of the external signal line, a lower metal layer disposed on the second substrate, the lower metal layer includes a lower connection pattern, a dam pattern disposed on the lower metal layer and adjacent to the contact hole, and a first conductive layer disposed on the lower metal layer, the first conductive layer includes a voltage line and a connection line spaced apart from each other with the dam pattern disposed between the voltage line and the connection line.

20 Claims, 26 Drawing Sheets

110: FOL1, FOL4
120: CWP1, DL1, DL3
150: VSL, DMP1_1, FCNL1
BL: SUB1, BIL1, SUB2, BIL2, BIL3, 110
DAM_4: DAM1, DAM2

110: FOL1, FOL4
120: CWP1, DL1, DL3
150: VSL_2, FCNP_2
FCNP_2: DMP1_2, FCNL1
BL: SUB1, BIL1, SUB2, BIL2, BIL3, 110

110: FOL1, FOL4
120: CWP1, DL1, DL3
150: VSL, FCNP1
FCNP1: DMP1, FCNL1
BL: SUB1, BIL1, SUB2, BIL2, BIL3, 110

110: FOL1
120: CWP1
150: DMP1_1
BL: SUB1, BIL1, SUB2, BIL2, BIL3, 110
DAM_4: DAM3, DAM4

110: FOL1, FOL4
120: CWP1, DL1, DL3
140: GP3
150: VSL, DMP1_1, FCNL1
BL: SUB1, BIL1, SUB2, BIL2, BIL3, 110
DAM_4: DAM1, DAM2

110: FOL1, FOL4
120: CWP1, DL1, DL3
BL: SUB1, BIL1, SUB2, BIL2, BIL3, 110

110: FOL1, FOL4
120: CWP1, DL1, DL3
150: VSL, FCNP1
FCNP1: DMP1, FCNL1
BL: SUB1, BIL1, SUB2, BIL2, BIL3, 110

DISPLAY DEVICE

CROSS-REFERENCE TO RELATED APPLICATION(S)

This application claims priority to and benefits of Korean Patent Application No. 10-2021-0073903 under 35 U.S.C. § 119 filed on Jun. 8, 2021, in the Korean Intellectual Property Office, the entire contents of which are incorporated herein by reference.

BACKGROUND

1. Technical Field

The disclosure relates to a display device.

2. Description of Related Art

As information society develops, demand for a display device for displaying an image is increasing in various forms. For example, a display device is applied to various electronic devices such as a smart phone, a digital camera, a notebook computer, a navigation system, and a smart television. The display device may include a flat panel display device such as a liquid crystal display device, a field emission display device, an organic light-emitting display device, or the like. In this connection, the organic light-emitting display device may include a light-emitting element in which each of pixels of a display panel may emit light in a self-manner and thus may display an image without a backlight unit providing light to the display panel.

In case that the display device is manufactured in a large size, a defect of the light-emitting element may increase due to an increase in the number of pixels, and thus productivity or reliability of the device may decrease. To solve this problem, in a tiled display device, sub-display devices having a relatively small size may be connected to each other to realize a large-sized screen. The tiled display device may include a boundary referred to as a seam between adjacent ones of the sub-display devices due to a non-display area or a bezel area of each of the sub-display devices adjacent to each other. The boundary between the adjacent ones of the sub-display devices may cause a sense of disconnection over an entire screen in case that displaying one image on an entire screen, thereby lowering immersion of a viewer into the image.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device in which a dam pattern including an insulating material is formed in an adjacent area to a contact hole via which an external signal line and a first connection line are connected to each other, such that lines are composed of a same conductive layer in a patterning process for forming the lines, and the lines disposed in the area adjacent to the contact hole are prevented from being short-circuited.

Purposes according to the disclosure are not limited to the above-mentioned purposes. Other purposes and advantages according to the disclosure that are not mentioned may be understood based on the following descriptions, and may be more clearly understood based on embodiments according to the disclosure. Further, it will be readily understood that the purposes and advantages according to the disclosure may be realized in the claims and combinations thereof.

According to an embodiment of the disclosure, a display device may include a first substrate; an external signal line disposed on the first substrate; a second substrate disposed on the external signal line, the second substrate may include a contact hole exposing a surface of the external signal line; a lower metal layer disposed on the second substrate, the lower metal layer may include a lower connection pattern; a dam pattern disposed on the lower metal layer and adjacent to the contact hole; and a first conductive layer disposed on the lower metal layer, the first conductive layer may include a voltage line and a connection line spaced apart from each other with the dam pattern disposed between the voltage line and the connection line.

The connection pattern may be electrically connected to the external signal line through the contact hole of the second substrate.

The lower metal layer may further comprise a data line spaced apart from the lower connection pattern. The connection line may electrically connect the lower connection pattern to the data line.

The dam pattern may include an insulating material.

The device may further comprise a gate insulating layer disposed on the lower metal layer; a second conductive layer disposed on the gate insulating layer; and an interlayer insulating layer disposed on the second conductive layer. The first conductive layer may be disposed on the interlayer insulating layer.

The dam pattern, the gate insulating layer, and the interlayer insulating layer may be disposed on a same layer.

The voltage line may not overlap the gate insulating layer, and the interlayer insulating layer in a thickness direction of the first substrate.

The dam pattern may be disposed on the interlayer insulating layer, and the dam pattern may have a shape protruding upwards from a surface of the interlayer insulating layer.

The voltage line may be disposed on the interlayer insulating layer.

The first conductive layer may further comprise a dummy pattern disposed between the voltage line and the connection line. The dummy pattern may be spaced apart from the voltage line.

The dummy pattern may overlap the contact hole in a plan view.

The dummy pattern and the connection line may be monolithic.

The dam pattern may comprise a first dam pattern disposed between the dummy pattern and the voltage line; and a second dam pattern disposed between the dummy pattern and the connection line. The dummy pattern may be spaced apart from the voltage line, the first dam pattern being disposed between the dummy pattern and the voltage line. The dummy pattern may be spaced apart from the connection line, the second dam pattern being disposed between the dummy pattern and the connection line.

The dam pattern may have a closed loop shape surrounding the contact hole in a plan view.

The first conductive layer may further comprise a dummy pattern disposed in an area formed by the dam pattern.

According to an embodiment of the disclosure, a display device may include a first substrate; an external signal line disposed on the first substrate; a second substrate disposed on the external signal line, the second substrate may include a contact hole extending through the second substrate and overlapping an end of the external signal line in a plan view; a connection pattern overlapping an end of the external signal line in a plan view; a voltage line disposed at a side in a first direction around the contact hole of the second substrate and extending in a second direction intersecting the first direction; a dam pattern disposed between the contact hole of the second substrate and the voltage line and extending in the second direction; and a connection line disposed at an opposite side of the second substrate in the first direction around the contact hole, wherein the connection line is electrically connected to the connection pattern.

The voltage line and the connection line may be disposed on a same layer.

The dam pattern may include an insulating material and may protrude upwards.

The device may further comprise a dummy pattern disposed between the voltage line and the connection line. A width in the second direction of the dam pattern may be greater than a width in the second direction of the dummy pattern.

The connection pattern may be electrically connected to the external signal line through the contact hole of the second substrate.

Details of other embodiments are included in the detailed description and drawings.

In the display device according to embodiments, a patterning process of a conductive layer disposed in a peripheral area around a contact hole extending through a substrate may include processes of exposing and developing a photoresist layer. Due to a step formed by a vertical dimension of the contact hole in an area where the photoresist layer overlaps the contact hole, the photoresist layer may remain in the contact hole and the peripheral area around the contact hole even after the exposure and development processes. In this connection, a dam pattern having a predefined or given thickness may be formed in the peripheral area around the contact hole, such that a portion of the photoresist layer disposed on a top surface of the dam pattern may be removed reliably after the exposure and development processes. Thus, in the patterning process of the conductive layer, the conductive layer disposed on the top surface of the dam pattern may be reliably removed. Therefore, in the patterning process of the conductive layer, lines disposed adjacent to the contact hole may be reliably disconnected from each other and thus may be prevented from being short-circuited therebetween. Thus, reliability of the manufacturing process of the display device may be improved.

Effects of the disclosure are not limited to the above-mentioned effects, and other effects as not mentioned will be clearly understood by those skilled in the art from following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
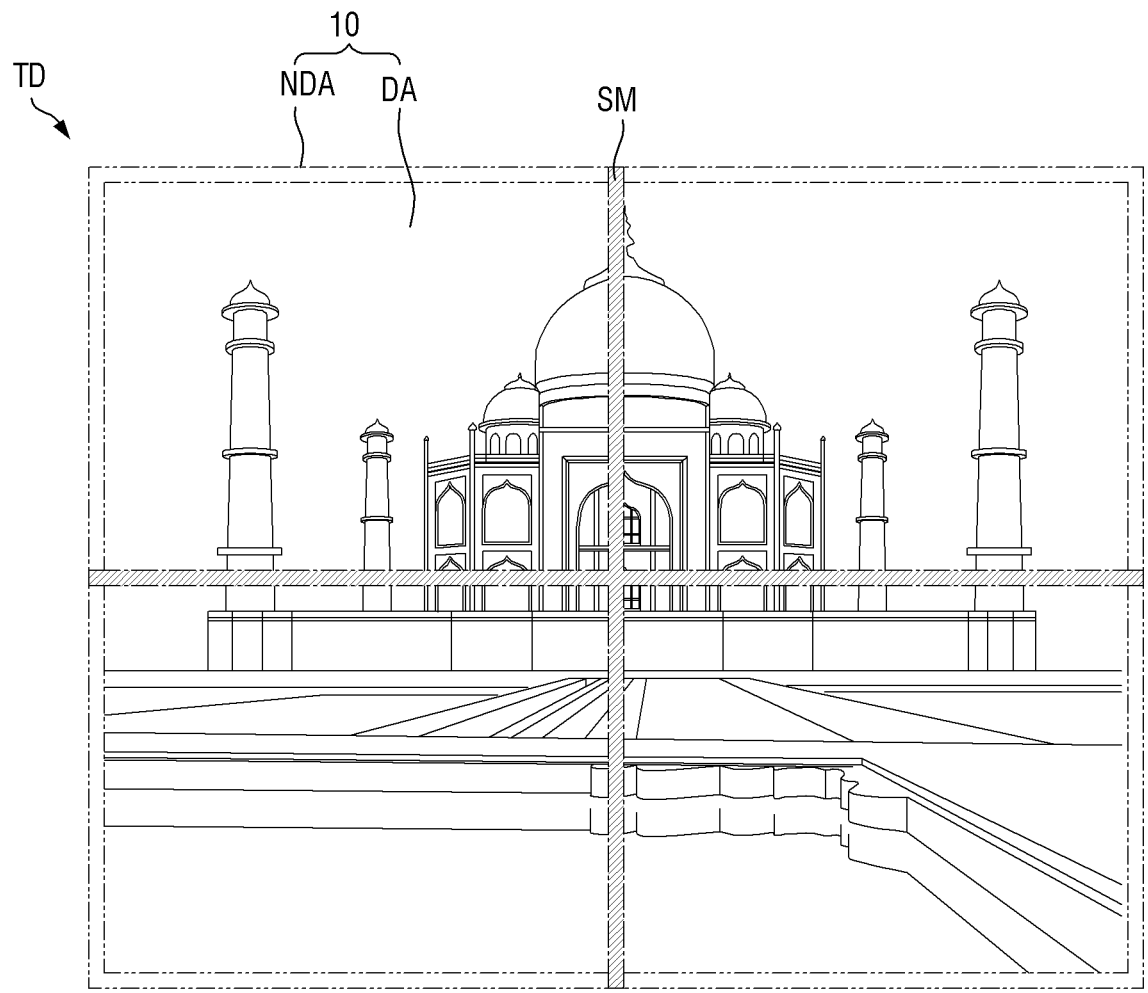
FIG. 1 is a schematic plan view showing a tiled display device according to one embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the disclosure as disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe an element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated about 90 degrees or at other orientations), and, as such, the spatially relative descriptors used herein should be interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," and variations when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

Embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (for example, microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (for example, one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

FIG. 1 is a schematic plan view showing a tiled display device according to one embodiment.

Referring to FIG. 1, a tiled display device TD displays a moving image or a still image. The tiled display device TD may refer to any electronic device that provides a display screen. For example, the tiled display device TD may include a television, a laptop, a monitor, a billboard, an Internet of Thing, a mobile phone, a smart phone, a tablet PC (personal computer), an electronic watch, a smart watch, a watch phone, a head mounted display (HMD), a mobile communication terminal, an electronic notebook, an e-book, a PMP (Portable Multimedia Player), a navigation device, a game device, a digital camera, a camcorder, for example which may provide a display screen.

The tiled display device TD may have a rectangular shape including a long side extending in a first direction DR1 and a short side extending in a second direction DR2 in a plan view. The tiled display device TD may generally have a flat shape. The disclosure is not limited thereto.

The tiled display device TD may include sub-display devices 10. The sub-display devices 10 may be arranged or disposed in a grid manner. The disclosure is not limited thereto. The sub-display devices 10 may be connected to each other in the first direction DR1 or the second direction DR2. The tiled display device TD may have a specific or given shape. For example, the sub-display devices 10 may have the same size as each other. The disclosure is not limited thereto. For example, the sub-display devices 10 may have different sizes.

Each of the sub-display devices 10 may have a rectangular shape including a long side and a short side. Long sides or short sides of adjacent ones of the sub-display devices 10 may contact each other. Some or a number of sub-display devices 10 may constitute an edge of the tiled display device TD and thus constitute one side or a side of the tiled display device TD.

Hereinafter, in the drawings for illustrating the tiled display device TD or the sub-sub-display device 10, the first direction DR1, the second direction DR2, and a third direction DR3 are defined. The first direction DR1 and the second direction DR2 may be perpendicular to each other and define one plane. The third direction DR3 may be normal to the plane defined by the first direction DR1 and the second direction DR2. The third direction DR3 is perpendicular to each of the first direction DR1 and the second direction DR2. Hereinafter, in an embodiment describing the tiled display device TD or the sub-display device 10, the third direction DR3 indicates a thickness direction or a display direction of the sub-display device 10.

In embodiments describing the tiled display device TD or the sub-display device 10, "top" indicates on side in the third direction DR3, for example, the display direction, and a "top surface" refers to a surface facing toward one side or a side in the third direction DR3 unless otherwise stated. Further, "bottom" refers to the opposite side in the third direction DR3, for example, the opposite direction to the display direction, and a "bottom surface" refers to a surface facing toward the opposite side in the third direction DR3. Further, "left", "right", "upper", and "lower" indicate directions of the tiled display device TD or the sub-display device 10 in a plan view. For example, "right" indicates one side or a side in the first direction DR1, "left" indicates the opposite side in the first direction DR1, "upper" indicates one side or a side in the second direction DR2, and "lower" indicates the opposite side in the second direction DR2.

Each of the sub-display devices 10 may include a display area DA and a non-display area NDA. The display area DA may include pixels to display an image. Each of the pixels may include an organic light-emitting diode including an organic light-emitting layer, a micro light-emitting diode including an organic light-emitting layer, a quantum dot light-emitting diode including a quantum dot light-emitting layer, or an inorganic light-emitting diode including an inorganic semiconductor. Hereinafter, an example in which each of the pixels may include the inorganic light-emitting diode will be described. The disclosure is not limited thereto. The non-display area NDA may be disposed around the display area DA and surround the display area DA or may be adjacent to the display area DA, and may not display an image.

The tiled display device TD may generally have a planar shape. The disclosure is not limited thereto. The tiled display device TD may have a three-dimensional shape to impart a three-dimensional effect to a user. For example, in case that the tiled display device TD has the three-dimensional shape, at least some or a number of the sub-display devices 10 may have a curved shape. In another example, each of the sub-display devices 10 may have a flat shape. The sub-display devices 10 may be connected to each other at a predefined angle defined therebetween such that the tiled display device TD may have a three-dimensional shape.

The tiled display device TD may include a bonding area SM disposed between adjacent ones of display areas DA. The tiled display device TD may be formed by connecting non-display areas NDA of the adjacent ones of the sub-display devices 10 to each other. The sub-display devices 10 may be connected to each other via a bonding member or an adhesive member disposed in the bonding area SM. Each bonding area SM between the adjacent ones of the sub-display devices 10 may not include a pad area or a flexible film attached to the pad area. Accordingly, a distance between the display areas DA of the adjacent ones of the sub-display devices 10 may be so small that the bonding area SM between the adjacent ones of the sub-display devices 10 is not recognized by the user. Further, external light reflectance of the display area DA of each of the sub-display devices 10 and external light reflectance of the bonding area SM between the adjacent ones of the sub-display devices 10 may be substantially equal to each other. Accordingly, the tiled display device TD may prevent the bonding area SM between the adjacent ones of the sub-display devices 10 from being recognized by the user, thereby lowering a sense of disconnection between the adjacent ones of the sub-display devices 10 and thus improving the immersion of the user into the image.

Figure 2:
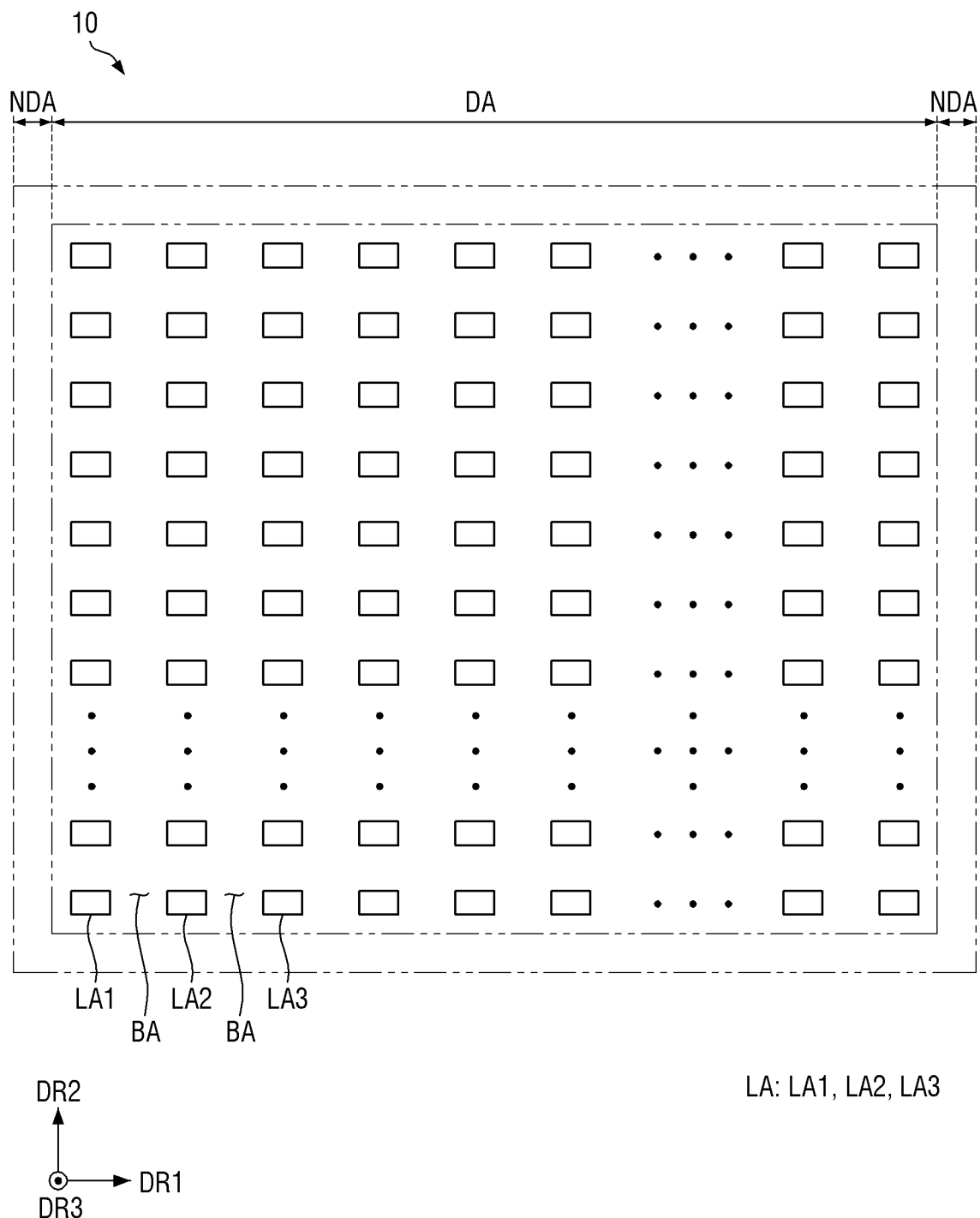
FIG. 2 is a schematic plan view showing a display device according to one embodiment.

FIG. 2 is a schematic plan view showing a display device according to one embodiment.

Referring to FIG. 2, the display area DA of the sub-display device 10 may include pixels. The pixel means the smallest repeating unit for display. The pixels may be arranged or disposed in a matrix form. A shape of each pixel may be rectangular or square in a plan view. In an embodiment, each pixel may include light-emitting elements respectively made of inorganic particles. The disclosure is not limited thereto.

The display area DA may include a light-outputting area LA defined by a light-blocking member to be described later and the light-blocking area BA around the light-outputting area LA. The light-outputting area LA may be an area through which light emitting from a light-emitting element layer of the sub-display device 10 is provided to an outside, while the light-blocking area BA may be an area through which light emitting from the light-emitting element layer does not transmit. In the light-outputting area LA, light with a predefined peak wavelength may be provided to the outside. The light-outputting area LA may include a first light-outputting area LA1, a second light-outputting area LA2, and a third light-outputting area LA3.

Each of the first to third light-emitting areas LA1, LA2, and LA3 may refer to an area in which light having a predefined peak wavelength is outputted out of the sub-display device 10. The first light-outputting area LA1 may emit light of a first color, the second light-outputting area LA2 may emit light of a second color, and the third light-outputting area LA3 may emit light of a third color. For example, the light of the first color may be red light having a peak wavelength in a range of about 610 nm to about 650 nm, and the light of the second color may be green light having a peak wavelength in a range of about 510 nm to about 550 nm, and the light of the third color may be blue light having a peak wavelength in a range of about 440 nm to about 480 nm. The disclosure is not limited thereto.

The first to third light-emitting areas LA1, LA2, and LA3 may be sequentially and repeatedly disposed along the first direction DR1 and in the display area DA of the sub-display device 10. A planar shape of each of the first to third light-emitting areas LA1, LA2, and LA3 may be rectangular. The disclosure is not limited thereto.

The light-blocking area BA may be disposed to surround each of the first to third light-emitting areas LA1, LA2, and LA3. The light-blocking member may be disposed in the light-blocking area BA to prevent mixing between light beams from the first to third light-outputting areas LA1, LA2, and LA3 from occurring.

Figure 3:
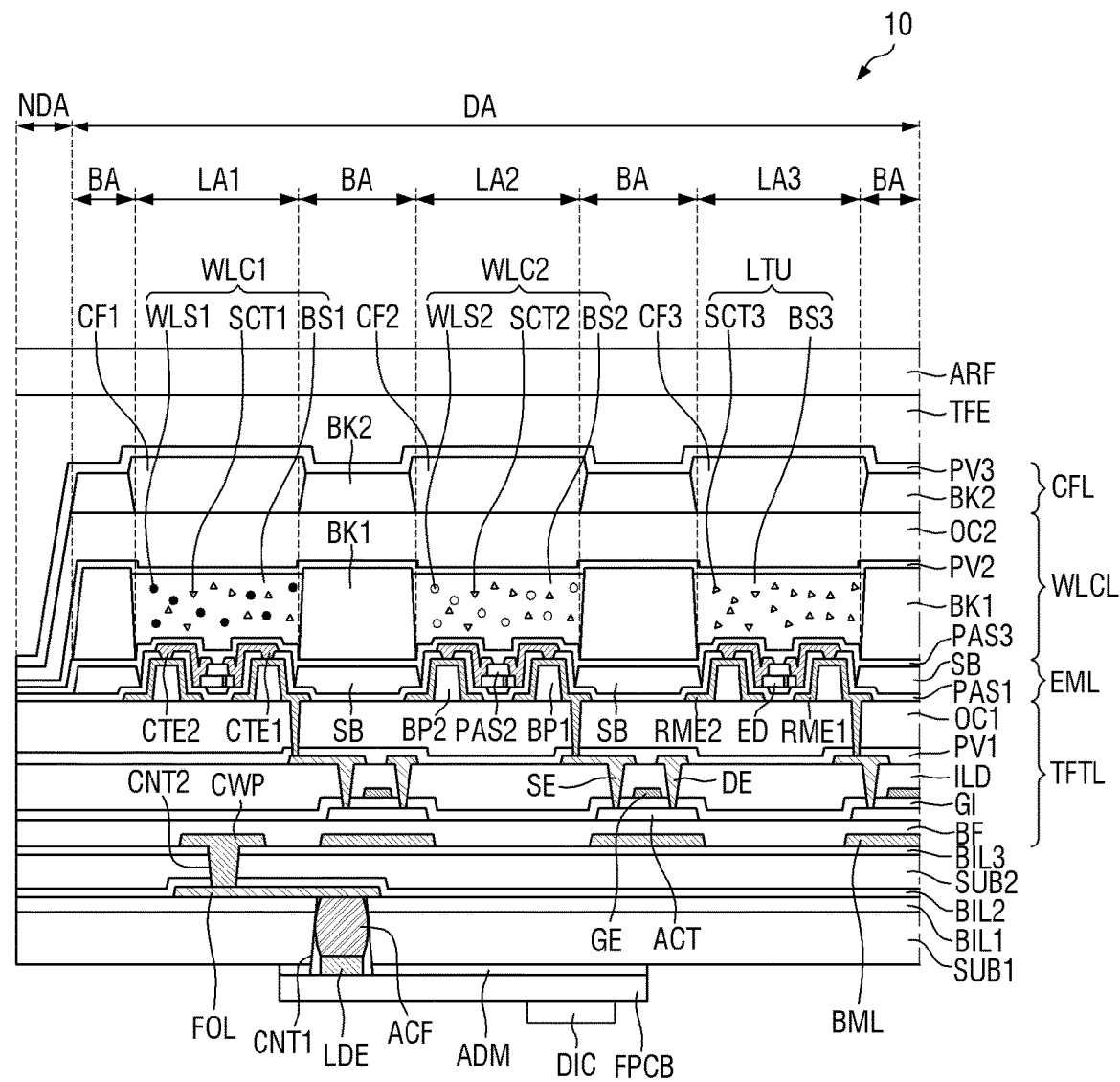
FIG. 3 is a schematic cross-sectional view of a display device according to one embodiment.

FIG. 3 is a schematic cross-sectional view of a display device according to one embodiment.

Referring to FIG. 3, the sub-display device 10 may include a base member BL, a display layer DPL, an encapsulation layer TFE, an anti-reflection film ARF, a flexible film FPCB, a connective film ACF, and a display driver DIC.

The base member BL may support the sub-display device 10. The base member BL may include a first substrate SUB1, a first barrier insulating film BIL1, a lower conductive layer 110, a second barrier insulating film BIL2, a second substrate SUB2, and a third barrier insulating film BIL3.

The first substrate SUB1 may act as a base substrate. The first substrate SUB1 may be embodied as a flexible substrate which is bendable, foldable, or rollable. For example, the first substrate SUB1 may include an insulating material such as polymer resin such as polyimide (PI). The disclosure is not limited thereto. For example, the first substrate SUB1 may be embodied as a rigid substrate including a glass material.

The first barrier insulating film BIL1 may be disposed on the first substrate SUB1. The first barrier insulating film BIL1 may include an inorganic film that may prevent penetration of air or moisture. For example, the first barrier insulating film BIL1 may include at least one of a silicon nitride layer, a silicon oxynitride layer, a silicon oxide layer, a titanium oxide layer, an aluminum oxide layer, and an amorphous silicon layer. The disclosure is not limited thereto.

The first substrate SUB1 and the first barrier insulating film BIL1 may receive therein a first contact hole CNT1. The first contact hole CNT1 may extend through the first substrate SUB1 and the first barrier insulating film BIL1. The first contact hole CNT1 may be defined by a sidewall of the first substrate SUB1 and a sidewall of the first barrier insulating film BIL1.

The first contact hole CNT1 may extend from a bottom surface of the first substrate SUB1 to a top surface of the first barrier insulating film BIL1. For example, a width of a bottom of the first contact hole CNT1 may be greater than a width of a top of the first contact hole CNT1.

The lower conductive layer 110 may be disposed on the first barrier insulating film BIL1. The lower conductive layer 110 may include an external signal line FOL. The lower conductive layer 110 may include the external signal line FOL, and the external signal line FOL may play a role in electrically connecting the display layer DPL and the flexible film FPCB to each other. For example, the lower conductive layer 110 may be a single layer or a multilayer made of one of molybdenum (Mo), aluminum (Al), chromium (Cr), gold (Au), silver (Ag), titanium (Ti), nickel (Ni), neodymium (Nd), and copper (Cu) or an alloy thereof.

The external signal line FOL may be disposed in the display area DA and on the first barrier insulating film BIL1. The sub-display device 10 may include the external signal line FOL disposed in the display area DA such that a size of the non-display area NDA thereof may be minimized. During a manufacturing process of the sub-display device 10, a portion of a bottom surface of the external signal line FOL may be exposed through the first contact hole CNT1. The external signal line FOL may be electrically or physically connected to the connective film ACF inserted in the first contact hole CNT1.

The external signal line FOL may electrically connect the flexible film FPCB and the display layer DPL to each other.

The external signal line FOL may be electrically connected to the flexible film FPCB via the connective film ACF. For example, the portion of the bottom surface of the external signal line FOL may be exposed through the first contact hole CNT1. The portion of the bottom surface of the external signal line FOL exposed through the first contact hole CNT1 may contact the connective film ACF inserted into the first contact hole CNT1 and thus may be electrically connected to the flexible film FPCB.

The external signal line FOL may be electrically connected to the display layer DPL via a first connection pattern CWP. For example, a portion of a top surface of the external signal line FOL may be exposed through a second contact hole CNT2 to be described later. The portion of the top surface of the external signal line FOL exposed through the second contact hole CNT2 may contact the first connection pattern CWP of the display layer DPL via the second contact hole CNT2 and thus may be electrically connected to each of lines of the display layer DPL. The lines of the display layer DPL may include a data line, a voltage line, or a gate line. For example, the external signal line FOL may be electrically connected to the data line, the voltage line, or the gate line of the display layer DPL via the first connection pattern CWP. The data line, the voltage line, or the gate line may be connected to a transistor TFT of the pixel.

Therefore, the external signal line FOL may supply an electrical signal received from the flexible film FPCB to the transistor TFT of the pixel via the first connection pattern CWP.

The second barrier insulating film BIL2 may be disposed on the first barrier insulating film BIL1 and the lower conductive layer 110. The second barrier insulating film BIL2 may include an inorganic film that may prevent penetration of air or moisture. For example, the second barrier insulating film BIL2 may include at least one of a silicon nitride layer, a silicon oxynitride layer, a silicon oxide layer, a titanium oxide layer, an aluminum oxide layer, and an amorphous silicon layer. The disclosure is not limited thereto.

The second substrate SUB2 may be disposed on the second barrier insulating film BIL2. The second substrate SUB2 may act as a base substrate. The second substrate SUB2 may be embodied as a flexible substrate which is bendable, foldable, or rollable. For example, the second substrate SUB2 may include an insulating material such as polymer resin such as polyimide (PI). The disclosure is not limited thereto. In another example, the second substrate SUB2 may be embodied as a rigid substrate including a glass material.

The third barrier insulating film BIL3 may be disposed on the second substrate SUB2. The third barrier insulating film BIL3 may include an inorganic film that may prevent penetration of air or moisture. For example, the third barrier insulating film BIL3 may include at least one of a silicon nitride layer, a silicon oxynitride layer, a silicon oxide layer, a titanium oxide layer, an aluminum oxide layer, and an amorphous silicon layer. The disclosure is not limited thereto.

The third barrier insulating film BIL3, the second substrate SUB2, and the second barrier insulating film BIL2 may receive therein the second contact hole CNT2. The second contact hole CNT2 may extend through the third barrier insulating film BIL3, the second substrate SUB2, and the second barrier insulating film BIL2. The second contact hole CNT2 may be defined by a sidewall of the third barrier insulating film BIL3, a sidewall of the second substrate SUB2, and a sidewall of the second barrier insulating film BIL2.

The second contact hole CNT2 may extend from a top surface of the third barrier insulating film BIL3 to a bottom surface of the second barrier insulating film BIL2. For example, a width of a top of the second contact hole CNT2 may be greater than a width of a bottom of the second contact hole CNT2. During the manufacturing process of the sub-display device 10, a top surface of the external signal line FOL may be exposed through the second contact hole CNT2, and the external signal line FOL may be electrically or physically connected to the first connection pattern CWP inserted into the second contact hole CNT2.

The display layer DPL may be disposed on the base member BL. The display layer DPL may include a circuit layer TFTL, a light-emitting element layer EML, a wavelength conversion layer WLCL, and a color filter layer CFL.

The circuit layer TFTL may be disposed on the third barrier insulating film BIL3. The circuit layer TFTL may include at least one transistor for activating pixels to activate the light-emitting element layer EML.

The circuit layer TFTL may include a lower metal layer 120, a buffer layer BF, a semiconductor layer 130, a gate insulating layer GI, a first conductive layer 140, an interlayer insulating layer ILD, a second conductive layer 150, a first protective layer PV1, and a first planarization layer OC1.

The lower metal layer 120 may be disposed on the third barrier insulating film BIL3. The lower metal layer 120 may include a light-blocking pattern BML and the first connection pattern CWP. As will be described later, the lower metal layer 120 may further include a data line or a voltage line. The disclosure is not limited thereto. The lower metal layer 120 may include a material that blocks light. For example, the lower metal layer 120 may be made of an opaque metal material that blocks light transmission.

The light-blocking pattern BML may be disposed on the third barrier insulating film BIL3. The light-blocking pattern BML may be disposed below and overlap a channel area of an active layer ACT of at least a transistor TFT. The first connection pattern CWP may be spaced apart from the light-blocking pattern BML and may be disposed on the third barrier insulating film BIL3. In one example, the drawing shows that the first connection pattern CWP and the light-blocking pattern BML are made of the same material or a similar material and constitute a same layer. However, a material of the first connection pattern CWP is not limited thereto.

The first connection pattern CWP may be partially inserted into the second contact hole CNT2 and thus may be electrically connected to the external signal line FOL. For example, the first connection pattern CWP may be electrically connected to the data line to supply a data voltage to the transistor TFT. In another example, the first connection pattern CWP may be connected to the voltage line to supply a power voltage to the transistor TFT. In another example, the first connection pattern CWP may be connected to the gate line to supply a gate signal to the transistor TFT. Therefore, the first connection pattern CWP may serve to supply the electrical signals received from the external signal line FOL to the transistor TFT of the pixel.

The buffer layer BF may be disposed on the lower metal layer 120 and the third barrier insulating film BIL3. The buffer layer BF may serve to protect the transistor from moisture passing through the second substrate SUB2 which is vulnerable to moisture permeation. The buffer layer BF may include an inorganic material that may prevent penetration of air or moisture. For example, the buffer layer BF may include inorganic films that may be alternately stacked each other.

The semiconductor layer 130 may be disposed on the buffer layer BF. The semiconductor layer 130 may include the active layer ACT of the transistor TFT. The active layer ACT of the transistor TFT may be disposed to overlap the light-blocking pattern BML, as described above.

The gate insulating layer GI may be disposed on the semiconductor layer 130 and the buffer layer BF. The gate insulating layer GI may be embodied as a multi-layer in which inorganic layers including at least one of inorganic materials such as silicon oxide ($SiO_x$), silicon nitride ($SiN_x$), and silicon oxynitride ($SiO_xN_y$) may be alternately stacked each other.

The first conductive layer 140 may be disposed on the gate insulating layer GI. The first conductive layer 140 may include a gate electrode GE of the transistor TFT. The gate electrode GE may overlap the active layer ACT while the gate insulating layer GI is interposed therebetween.

The interlayer insulating layer ILD may be disposed on the first conductive layer 140 and the gate insulating layer GI. The interlayer insulating layer ILD may be disposed to cover or overlap the gate electrode GE.

The second conductive layer 150 may be disposed on the interlayer insulating layer ILD. The second conductive layer 150 may include a source electrode SE and a drain electrode DE of the transistor TFT. The source electrode SE and the drain electrode DE of the transistor TFT may be spaced apart from each other and may be disposed on the interlayer insulating layer ILD. The source electrode SE and the drain electrode DE of the transistor TFT may be electrically connected respectively to both opposing ends of the active layer ACT of the transistor TFT via two contact holes extending through the interlayer insulating layer ILD and the gate insulating layer GI.

The source electrode SE of the transistor TFT may be electrically connected to a first electrode RME1 of the light-emitting element layer EML which will be described later. The drain electrode DE of the transistor TFT may be connected to a first voltage line to which a high-potential voltage (or a first power voltage) supplied to the transistor TFT is applied, as will be described later.

The first protective layer PV1 may be disposed on the second conductive layer 150 and the interlayer insulating layer ILD. The first protective layer PV1 may protect the transistor TFT. The first protective layer PV1 may receive therein a contact hole through which the first electrode RME1 extends.

The first planarization layer OC1 may be disposed on the first protective layer PV1. The first planarization layer OC1 may have a generally flat top surface regardless of a shape of a pattern disposed thereunder or of absence or presence of the pattern. For example, the first planarization layer OC1 may serve to planarize a surface of a portion above the first protective layer PV1. The first planarization layer OC1 may receive therein a contact hole through which the first electrode RME1 of the light-emitting element layer EML extends. In this connection, the first electrode RME1 may also extend through the first protective layer PV1. The first planarization layer OC1 may include an organic insulating material, for example, an organic material such as polyimide (PI).

The light-emitting element layer EML may be disposed on the circuit layer TFTL. The light-emitting element layer EML may be disposed on the first planarization layer OC1 of the circuit layer TFTL.

The light-emitting element layer EML may include a first protruding pattern BP1, a second protruding pattern BP2, the first electrode RME1, a second electrode RME2, a first insulating layer PAS1, a light-emitting element ED, a second insulating layer PAS2, a first contact electrode CTE1, a second contact electrode CTE2, and a sub-bank SB.

The first and second protruding patterns BP1 and BP2 may be disposed on the first planarization layer OC1. The first and second protruding patterns BP1 and BP2 may protrude from a top surface of the first planarization layer OC1. The first and second protruding patterns BP1 and BP2 may be disposed in an opening area or the light-outputting area LA or of each of the pixels. The first and second protruding patterns BP1 and BP2 may be spaced apart from each other and may be disposed in the light-outputting area LA to provide a space in which light-emitting elements ED are disposed.

The first electrode RME1 may be disposed on the first planarization layer OC1 and the first protruding pattern BP1. The first electrode RME1 may be disposed on the first protruding pattern BP1 disposed on one side or a side of an array of the light-emitting elements ED. The first electrode RME1 may be disposed on an inclined side surface of the first protruding pattern BP1 to reflect light emitting from the light-emitting element ED.

The first electrode RME1 may be inserted into the contact hole extending through the first planarization layer OC1 and the first protective layer PV1 and thus may be electrically connected to the source electrode SE of the transistor TFT. The first electrode RME1 may be electrically connected to one end of the light-emitting element ED via the first contact electrode CTE1. For example, the first electrode RME1 may receive a voltage proportional to a luminance level of the light-emitting element ED from the transistor TFT of the pixel.

The second electrode RME2 may be disposed on the first planarization layer OC1 and the second protruding pattern BP2. The second electrode RME2 may be disposed on the second protruding pattern BP2 disposed on the opposite side of the array of the light-emitting elements ED. The second electrode RME2 may be disposed on an inclined side surface of the second protruding pattern BP2 to reflect the light emitting from the light-emitting element ED. The second electrode RME2 may be electrically connected to the opposite end of the light-emitting element ED via the second contact electrode CTE2. For example, the second electrode RME2 may receive a low-potential voltage which is supplied from a low-potential line to all of pixels.

Each of the first and second electrodes RME1 and RME2 may include a conductive material having high reflectance. For example, each of the first and second electrodes RME1 and RME2 may include at least one of silver (Ag), copper (Cu), aluminum (Al), nickel (Ni), and lanthanum (La). In another example, each of the first and second electrodes RME1 and RME2 may include a material such as ITO, IZO, ITZO, and the like within the spirit and the scope of the disclosure. In another example, each of the first and second electrodes RME1 and RME2 may include layers including a transparent conductive material layer and a highly reflective metal layer, or may include a single layer including a transparent conductive material and a highly reflective metal layer. Each of the first and second electrodes RME1 and RME2 may have a stack structure such as ITO/Ag/ITO/, ITO/Ag/IZO, or ITO/Ag/ITZO/IZO.

The first insulating layer PAS1 may be disposed on the first planarization layer OC1 and the first and second electrodes RME1 and RME2. The first insulating layer PAS1 may serve to protect the first and second electrodes RME1 and RME2 and, at the same time, to insulate the first and second electrodes RME1 and RME2 from each other. The first insulating layer PAS1 may receive therein a contact extending through the first insulating layer PAS1, and exposing a portion of each of the first electrode RME1 and the second electrode RME2.

The sub-bank SB may be disposed in the light-blocking area BA and on the first insulating layer PAS1. The sub-bank SB may be disposed at a boundary between adjacent ones of the pixels, and may have an opening defined therein overlapping the light-outputting area LA. The sub-bank SB may serve as a partitioning wall to guide ink containing the light-emitting elements ED dispersed therein to be sprayed into the light-outputting area LA in an inkjet printing process for uniformly orienting the light-emitting elements ED during the manufacturing process of the sub-display device 10. The sub-bank SB may have a predefined vertical dimension, and may include an organic insulating material such as polyimide (PI).

The light-emitting elements ED may be disposed in the light-outputting area LA and between the first protruding pattern BP1 and the second protruding pattern BP2. The light-emitting elements ED may be disposed on the first insulating layer PAS1. The light-emitting element ED may be oriented so that both opposing ends thereof lie on the first electrode RME1 and the second electrode RME2, respectively.

One end of the light-emitting element ED may be electrically connected to the first electrode RME1 via the first contact electrode CTE1, while the opposite end of the light-emitting element ED may be electrically connected to the second electrode RME2 via the second contact electrode CTE2.

The light-emitting element ED may have a size of on a nano-meter scale (in a range of about 1 nm to about 1 μm) to a micro-meter scale (in a range of about 1 μm to about 1 mm). In one embodiment, the light-emitting element ED may have a diameter and a length of a size of a nanometer scale or a micrometer scale. In some other embodiments, the diameter of the light-emitting element ED may have a size of a nanometer scale, whereas the length of the light-emitting element ED may have a size of a micrometer scale. In some embodiments, each of some or a number of light-emitting elements ED may have a diameter and/or a length of a size of a nanometer scale, while each of the other light-emitting elements ED may have a diameter and/or a length of a size of a micrometer scale.

In one embodiment, the light-emitting element ED may be embodied as an inorganic light-emitting diode. The inorganic light-emitting diode may include semiconductor layers. For example, the inorganic light-emitting diode may include a first conductivity-type, for example, n-type semiconductor layer, a second conductivity-type, for example, p-type semiconductor layer, and an active semiconductor layer interposed therebetween. The active semiconductor layer may receive holes and electrons from the first conductivity-type semiconductor layer and the second conductivity-type semiconductor layer, respectively, and then the holes and electrons reaching the active semiconductor layer may be recombined with each other to emit light. The light-emitting elements ED may be uniformly oriented between the first and second electrodes RME1 and RME2 and according to an electric field generated in a specific or given direction between the first and second electrodes RME1 and RME2 that are spaced apart from each other and face each other.

The light-emitting elements ED disposed in the first to third light-emitting areas LA1, LA2, and LA3, respectively may include the active layers made of the same material or a similar material, and thus may emit light of the same wavelength band or light of the same color. For example, the light-emitting elements ED may emit a third color light (or blue light) of a peak wavelength in a range of about 440 nm to about 480 nm. The disclosure is not limited thereto.

The second insulating layer PAS2 may be disposed on the light-emitting element ED. For example, the second insulating layer PAS2 may be disposed to surround an outer surface of the light-emitting element ED. Both opposing ends of the light-emitting element ED may be exposed. The second insulating layer PAS2 may protect the light-emitting elements ED and at the same time serve to fix the light-emitting elements ED in the manufacturing process of the sub-display device 10. The second insulating layer PAS2 may fill a space between the light-emitting element ED and the first insulating layer PAS1.

The first contact electrode CTE1 may be disposed on the first electrode RME1 and the first insulating layer PAS1. The first contact electrode CTE1 may be electrically connected to the first electrode RME1 via a first contact extending through the first insulating layer PAS1 and exposing a portion of the first electrode RME1. The first contact electrode CTE1 may contact one end of the light-emitting element ED exposed through the second insulating layer PAS2. In case that the first contact electrode CTE1 contacts each of the first electrode RME1 and one end of the light-emitting element ED, the first contact electrode CTE1 may serve to electrically connect the first electrode RME1 and one end of the light-emitting element ED.

The second contact electrode CTE2 may be disposed on the second electrode RME2 and the first insulating layer PAS1. The second contact electrode CTE2 may be spaced apart from the first contact electrode CTE1. The second contact electrode CTE2 may be electrically connected to the second electrode RME2 via a second contact extending through the first insulating layer PAS1 and exposing a portion of the second electrode RME2. The second contact electrode CTE2 may contact the opposite end of the light-emitting element ED exposed through the second insulating layer PAS2. In case that the second contact electrode CTE2 contacts each of the second electrode RME2 and the opposite end of the light-emitting element ED, the second contact electrode CTE2 may serve to electrically connect the second electrode RME2 and the opposite end of the light-emitting element ED.

The wavelength control layer WLCL may be disposed on the light-emitting element layer EML. The wavelength control layer WLCL may serve to convert a wavelength of the light emitting from the light-emitting element layer EML and incident to the wavelength control layer WLCL to a wavelength of a color corresponding to each pixel or to transmit the light emitting from the light-emitting element layer EML therethrough.

The wavelength control layer WLCL may include a third insulating film PAS3, a first light-blocking member BK1, a first wavelength conversion pattern WLC1, a second wavelength conversion pattern WLC2, a light transmissive pattern LTU, a second protective layer PV2, and a second planarization layer OC2.

The third insulating film PAS3 may be disposed on the first and second contact electrodes CTE1, and CTE2, the sub-bank SB, and the first and second insulating films PAS1 and PAS2. The third insulating film PAS3 may be disposed on a top surface of the light-emitting element layer EML to protect the light-emitting element layer EML. The third insulating film PAS3 may seal a bottom surface of each of the first wavelength conversion pattern WLC1, the second wavelength conversion pattern WLC2, and the light transmissive pattern LTU.

The first light-blocking member BK1 may be disposed in the light-blocking area BA and on the third insulating film PAS3. The first light-blocking member BK1 may overlap the sub-bank SB in the thickness direction of the device. The first light-blocking member BK1 may block the transmission of light. The first light-blocking member BK1 may prevent light beams from one of the first to third light-emitting areas LA1, LA2, and LA3 from invading into another of the first to third light-emitting areas LA1, LA2, and LA3 and thus prevent light beams from the first to third light-emitting areas LA1, LA2, and LA3 from being mixed with each other. Thus, color gamut of the sub-display device 10 may be improved. The first light-blocking member BK1 may be disposed to surround each of the first to third light-emitting areas LA1, LA2, and LA3 in a plan view.

The first wavelength conversion pattern WLC1 may be disposed in the first light-outputting area LA1 and on the third insulating film PAS3. The first wavelength conversion pattern WLC1 may be surrounded with the first light-blocking member BK1. The first wavelength conversion pattern WLC1 may include a first base resin BS1, first scattering means SCT1 and first wavelength conversion particles WLS1.

The first base resin BS1 may include a material having relatively high light transmittance. The first base resin BS1 may be made of a transparent organic material. For example, the first base resin BS1 may include at least one of organic materials such as an epoxy-based resin, an acrylic-based resin, a cardo-based resin and an imide-based resin.

The first scattering means SCT1 may have a refractive index different from that of the first base resin BS1, such that an optical interface may be formed between the first base resin BS1 and the first scattering means SCT1. For example, the first scattering means SCT1 may be embodied as a light scattering material or light-scattering particles that scatter at least a portion of the transmitting light. For example, the first scattering means SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$), or organic particles such as the acrylic-based resin or the urethane-based resin. The first scattering means SCT1 may scatter the incident light in a random direction regardless of an incident direction of the incident light while not substantially converting a peak wavelength of the incident light.

The first wavelength conversion particles WLS1 may convert or shift the peak wavelength of the incident light to a first peak wavelength. For example, the first wavelength conversion particles WLS1 may convert blue light provided from the light-emitting element layer EML into red light having a single peak wavelength in a range of about 610 nm to about 650 nm and may emit the red light. The first wavelength conversion particle WLS1 may be embodied as a quantum dot, a quantum rod, or a phosphor. The quantum dot may refer to a particulate material that emits a specific or given color as electrons transition from a conduction band to a valence band.

The second wavelength conversion pattern WLC2 may be disposed in the second light-outputting area LA2 and on the third insulating film PAS3. The second wavelength conversion pattern WLC2 may be surrounded with the first light-blocking member BK1. The second wavelength conversion pattern WLC2 may include a second base resin BS2, second scattering means SCT2 and a second wavelength conversion material WLS2.

The second base resin BS2 may include a material having relatively high light transmittance. The second base resin BS2 may be made of a transparent organic material. For example, the second base resin BS2 may be made of the same material or a similar material as that of the first base resin BS1, or may be made of the material for example as the material of the first base resin BS1.

The second scattering means SCT2 may have a refractive index different from that of the second base resin BS2, such that an optical interface may be formed between the second base resin BS2 and the second scattering means SCT2. For example, the second scattering means SCT2 may be embodied as a light scattering material or light-scattering particles that scatter at least a portion of the transmitting light. For example, the second scattering means SCT2 may be made of the same material or a similar material as that of the first scattering means SCT1, or may be made of the material for example as the material of the first scattering means SCT1. The second scattering means SCT2 may scatter the incident light in a random direction regardless of the incident direction of the incident light while not substantially converting the peak wavelength of the incident light.

The second wavelength conversion material WLS2 may convert or shift the peak wavelength of the incident light to a second peak wavelength different from the first peak wavelength related to the first wavelength conversion material WLS1. For example, the second wavelength conversion material WLS2 may convert blue light provided from the light-emitting element layer EML to green light having a single peak wavelength in a range of about 510 nm to about 550 nm and may emit the green light. The second wavelength conversion material WLS2 may be embodied as a quantum dot, a quantum rod or a phosphor. The second wavelength conversion material WLS2 may be embodied as a quantum dot, a quantum rod or a phosphor such that a wavelength conversion range related to the second wavelength conversion material WLS2 is different from a wavelength conversion range related to the first wavelength conversion material WLS1.

The light transmissive pattern LTU may be disposed in the third light-outputting area LA3 and on the third insulating film PAS3. The light transmissive pattern LTU may be surrounded with the first light-blocking member BK1. The light transmissive pattern LTU may transmit the incident light therethrough while maintaining the peak wavelength of the incident light. The light transmissive pattern LTU may include a third base resin BS3 and third scattering means SCT3.

The third base resin BS3 may include a material having relatively high light transmittance. The third base resin BS3 may be made of a transparent organic material. For example, the third base resin BS3 may be made of the same material or a similar material as that of the first or second base resin BS1 or BS2, or may be made of the material for example as the material of the first or second base resin BS1 or BS2.

The third scattering means SCT3 may have a refractive index different from that of the third base resin BS3, such that an optical interface is formed between the third base resin BS3 and the third scattering means SCT3. For example, the third scattering means SCT3 may be embodied as a light scattering material or light-scattering particles that scatter at least a portion of the transmitting light. For example, the third scattering means SCT3 may be made of the same material or a similar material as that of the first or second scattering means SCT1 or SCT2, or may be made of the material for example as the material of the first or second scattering means SCT1 or SCT2. The third scattering means SCT3 may scatter the incident light in a random direction regardless of the incident direction of the incident light while not substantially converting the peak wavelength of the incident light.

The second protective layer PV2 may cover or overlap the first wavelength conversion pattern WLC1, the second wavelength conversion pattern WLC2, the light transmissive pattern LTU, and the first light-blocking member BK1. For example, the second protective layer PV2 may seal the first wavelength conversion pattern WLC1, the second wavelength conversion pattern WLC2, and the light transmissive pattern LTU to prevent damage or contamination of the first and second wavelength conversion patterns WLC1 and WLC2 and the light transmissive pattern LTU. For example, the second protective layer PV2 may include an inorganic material.

The second planarization layer OC2 may be disposed on the second protective layer PV2. The second planarization layer OC2 may have a substantially flat top surface regardless of a pattern shape or absence or presence of each of the first wavelength conversion pattern WLC1, the second wavelength conversion pattern WLC2, and the light transmissive pattern LTU disposed thereunder. For example, the second planarization layer OC2 may serve to planarize a surface of a portion above each of the first wavelength conversion pattern WLC1, the second wavelength conversion pattern WLC2, and the light transmissive pattern LTU. For example, the second planarization layer OC2 may include an organic insulating material such as polyimide (PI).

The wavelength control layer WLCL may be disposed on or directly disposed on the light-emitting element layer EML, so that the sub-display device 10 may not require a separate substrate or base member for the first and second wavelength conversion patterns WLC1 and WLC2 and the light transmissive pattern LTU. Therefore, the first and second wavelength conversion patterns WLC1 and WLC2 and the light transmissive pattern LTU may be readily aligned to the first to third light-emitting areas LA1, LA2, and LA3, respectively. Further, a thickness of the sub-display device 10 may be relatively reduced.

The color filter layer CFL may be disposed on the wavelength control layer WLCL. The color filter layer CFL may block emission of light of a color other than a color corresponding to each pixel.

The color filter layer CFL may be disposed on the second planarization layer OC2 of the wavelength control layer WLCL. The color filter layer CFL may include a second light-blocking member BK2, first to third color filters CF1, CF2, and CF3, and a third protective layer PV3.

The second light-blocking member BK2 may be disposed in the light-blocking area BA and on the second planarization layer OC2 of the wavelength control layer WLCL. The second light-blocking member BK2 may overlap the first light-blocking member BK1 or the sub-bank SB in the thickness direction. The second light-blocking member BK2 may block the transmission of light. The second light-blocking member BK2 may prevent light beams from one of the first to third light-emitting areas LA1, LA2, and LA3 from invading into another of the first to third light-emitting areas LA1, LA2, and LA3 and thus prevent light beams from the first to third light-emitting areas LA1, LA2, and LA3 from being mixed with each other. Thus, the color gamut of the tiled display device TD may be improved. The second light-blocking member BK2 may be disposed to surround each of the first to third light-emitting areas LA1, LA2, and LA3 in a plan view.

The first color filter CF1 may be disposed in the first light-outputting area LA1 and on the second planarization layer OC2. The first color filter CF1 may be surrounded with the second light-blocking member BK2. The first color filter CF1 may overlap the first wavelength conversion pattern WLC1 in the thickness direction. The first color filter CF1 may selectively transmit light of the first color (for example, red light) therethrough, and may block or absorb light of the second color (for example, green light) and light of the third color, (for example, blue light). For example, the first color filter CF1 may be a red color filter. Red colorant may be contained therein.

The second color filter CF2 may be disposed in the second light-outputting area LA2 and on the second planarization layer OC2. The second color filter CF2 may be surrounded with the second light-blocking member BK2. The second color filter CF2 may overlap the second wavelength conversion pattern WLC2 in the thickness direction. The second color filter CF2 may selectively transmit light of the second color, (for example, green light) therethrough, and may block or absorb the light of the first color (for example, red light) and light of the third color (for example, blue light). For example, the second color filter CF2 may be a green color filter. Green colorant may be contained therein.

The third color filter CF3 may be disposed in the third light-outputting area LA3 and on the second planarization layer OC2. The third color filter CF3 may be surrounded with the second light-blocking member BK2. The third color filter CF3 may overlap the light transmissive pattern LTU in the thickness direction. The third color filter CF3 may selectively transmit light of the third color, (for example, blue light) therethrough, and may block or absorb the light of the first color, (for example, red light) and the light of the second color, (for example, green light). For example, the third color filter CF3 may be a blue color filter. Blue colorant may be contained therein.

The first to third color filters CF1, CF2, and CF3 may absorb a portion of the light introduced from the outside of the sub-display device 10 to reduce reflection of the external light. Therefore, the first to third color filters CF1, CF2, and CF3 may prevent color distortion due to the external light reflection.

The first to third color filters CF1, CF2, and CF3 may be disposed on or directly disposed on the second planarization layer OC2 of the wavelength control layer WLCL, such that the sub-display device 10 may not require a separate substrate for the first to third color filters CF1, CF2, and CF3. Therefore, the thickness of the sub-display device 10 may be relatively reduced.

The third protective layer PV3 may cover or overlap the first to third color filters CF1, CF2, and CF3. The third protective layer PV3 may protect the first to third color filters CF1, CF2, and CF3.

The encapsulation layer TFE may be disposed on the third protective layer PV3 of the color filter layer CFL. The encapsulation layer TFE may include at least one inorganic film to prevent penetration of oxygen or moisture. Further, the encapsulation layer TFE may include at least one organic film to protect the sub-display device 10 from foreign materials such as dusts.

The anti-reflection film ARF may be disposed on the encapsulation layer TFE. The anti-reflection film ARF may prevent reflection of external light, thereby reducing deterioration of visibility due to reflection of the external light. The anti-reflection film ARF may protect a top surface of the sub-display device 10. The anti-reflection film ARF may be omitted. In another example, the anti-reflection film ARF may be replaced with a polarizing film.

The flexible film FPCB may be disposed below the first substrate SUB1. The flexible film FPCB may be attached to a bottom surface of the first substrate SUB1 using an adhesive member ADM. Optionally, the adhesive member ADM may be omitted. One side or a side of the flexible film FPCB may be adjacent to the first contact hole CNT1. The flexible film FPCB may include a lead electrode LDE disposed on one side or a side of a top surface thereof. At least a portion of the lead electrode LDE may be inserted into the first contact hole CNT1. The flexible film FPCB may support a display driver DIC disposed on the opposite side of a bottom surface thereof. The lead electrode LDE may be electrically connected to the display driver DIC via a lead line (not shown) disposed on the bottom surface of the flexible film FPCB. The lead electrode LDE may be electrically connected to the external signal line FOL via the connective film ACF. The opposite side of the flexible film FPCB under or below the first substrate SUB1 may be connected to a source circuit board (not shown). The flexible film FPCB may transmit a signal from the display driver DIC to the display layer DPL.

The connective film ACF may attach the lead electrode LDE of the flexible film FPCB to a bottom surface of the external signal line FOL. One surface or a surface of the connective film ACF may be in contact with a portion of the bottom surface of the external signal line FOL exposed through the first contact hole CNT1, while the opposite surface of the connective film ACF may be contacted to the lead electrode LDE. For example, the connective film ACF may include an anisotropic conductive film. In case that the connective film ACF may include the anisotropic conductive film, the connective film ACF may have conductivity at a portion thereof which contacts each of the external signal line FOL and the lead electrode LDE, such that the flexible film FPCB may be electrically connected to the external signal line FOL.

The display driver DIC may be embodied as an integrated circuit (IC). For example, the display driver DIC may convert digital video data into analog data voltage, based on a data control signal from a timing controller and supply the analog data voltage to the data line of the display area DA via the flexible film FPCB. In another example, the display driver DIC may generate a gate signal based on a gate control signal from the timing controller and supply the gate signal to the gate line of the display area DA via the flexible film FPCB. The sub-display device 10 may include the external signal line FOL disposed on a top surface of the first substrate SUB1 and the flexible film FPCB disposed on a bottom surface of the first substrate SUB1, such that a size of the non-display area NDA may be minimized.

Figure 4:
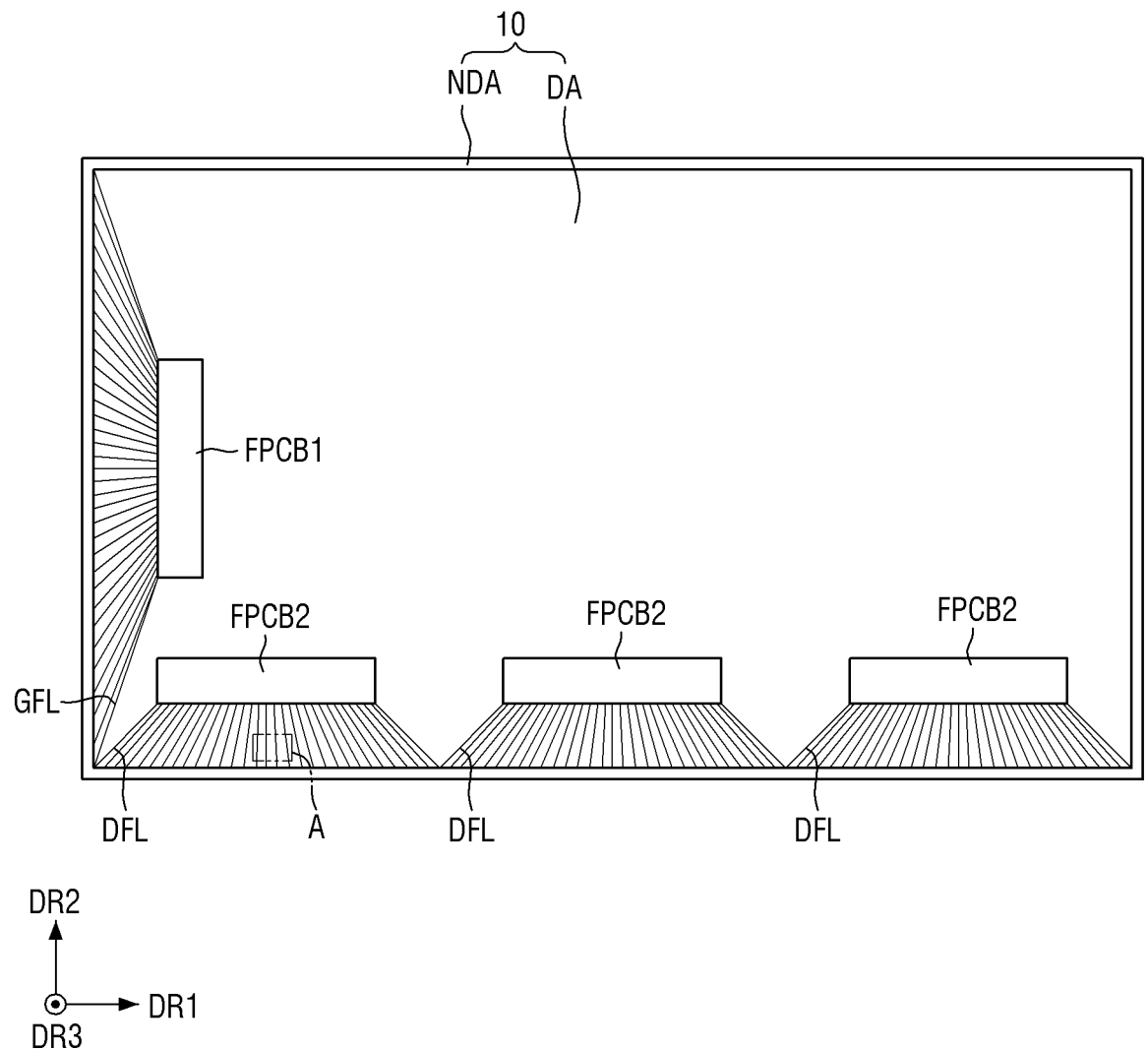
FIG. 4 is a planar layout showing a flexible film and external signal lines included in a display device according to one embodiment.

FIG. 4 is a planar layout showing flexible films and external signal lines included in the display device according to one embodiment.

Referring to FIG. 4, the sub-display device 10 may include a first flexible film FPCB1, a second flexible film FPCB2, horizontal external signal lines GFL, and vertical external signal lines DFL.

The first flexible film FPCB1 may be disposed in a left side of the display area DA. The horizontal external signal lines GFL may be disposed in a left edge of the display area DA and may be connected to the first flexible film FPCB1. The first flexible film FPCB1 may be disposed under or below the first substrate SUB1, and may be connected to the horizontal external signal lines GFL via the connective film ACF. For example, the first flexible film FPCB1 may supply the gate signal received from a gate driver (not shown) to the gate line of the display area DA via the horizontal external signal lines GFL.

The second flexible film FPCB2 may be disposed in a lower portion of the display area DA. The vertical external signal lines DFL may be disposed in a lower edge of the display area DA and may be connected to the second flexible film FPCB2. The second flexible film FPCB2 may be disposed under or below the first substrate SUB1, and may be connected to the vertical external signal lines DFL via the connective film ACF. For example, the second flexible film FPCB2 may supply the data voltage received from a data driver (not shown) to the data line of the display area DA via the vertical external signal lines DFL. In another example, the second flexible film FPCB2 may supply the power voltage to the voltage line of the display area DA via the vertical external signal lines DFL. In another example, the second flexible film FPCB2 may supply a sensing signal to a sensing line of the display area DA via the vertical external signal lines DFL.

The second flexible film FPCB2 may include second flexible films FPCB2 according to a size of the sub-display device 10 or the number of pixels. The number of the second flexible films FPCB2 is not limited to that shown in FIG. 4.

The sub-display device 10 may include the first and second flexible films FPCB1 and FPCB2 disposed under or below the first substrate SUB1 and the horizontal external signal lines GFL and the vertical external signal lines DFL disposed in the display area DA, such that a size of the non-display area NDA may be minimized.

Figure 5:
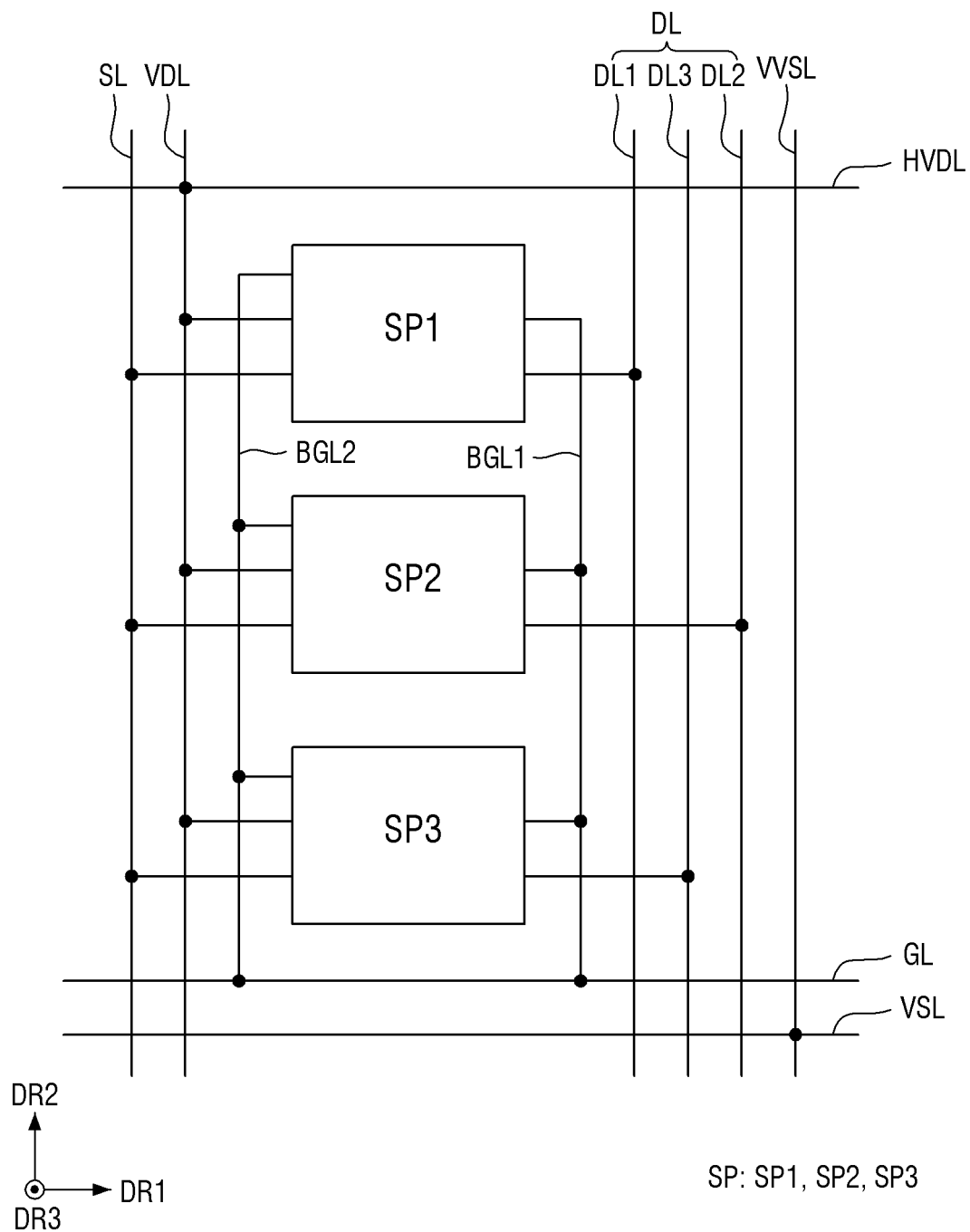
FIG. 5 is a block diagram showing pixels of a display device according to one embodiment.

FIG. 5 is a block diagram schematically showing the pixels of the display device according to one embodiment.

Referring to FIG. 5, the sub-display device 10 may include pixels SP and lines. The lines may be included in the circuit layer TFTL as described above. The lines may include a gate line GL, a data line DL, a first voltage line VDL, a sensing line SL, a horizontal voltage line HVDL, and a second voltage line VSL. The lines may further include a vertical voltage line VVSL and a horizontal voltage line HVDL.

The pixels SP may include first to third pixels SP1, SP2, and SP3. Each of the first to third pixels SP1, SP2, and SP3 may be connected to the gate line GL, the data line DL, the first voltage line VDL, the second voltage line VSL, and the sensing line SL.

The data line DL may include a first data line DL1, a second data line DL2, and a third data line DL3. The first data line DL1 may be connected to the first pixel SP1. The second data line DL2 may be connected to the second pixel SP2. The third data line DL3 may be connected to the third pixel SP3.

As used herein, meaning of 'connection' may mean that one member is connected to another member not only via physical contact therebetween, but also via still another member. Further, it may be understood that one portion and another portion of a single monolithic member are connected to each other. Furthermore, the connection between one member and another member may be interpreted as including not only direct contact based connection but also electrical connection therebetween via still another member.

The sensing line SL may extend in the second direction DR2. The sensing line SL may be connected to the first to third pixels SP1, SP2, and SP3.

The first voltage line VDL may extend in the second direction DR2. The first voltage line VDL may be spaced apart from the sensing line SL in the first direction DR1. The first voltage line VDL may be connected to the first to third pixels SP1, SP2, and SP3.

The horizontal voltage line HVDL may extend in the first direction DR1. The horizontal voltage line HVDL may intersect the first voltage line VDL. In the intersecting area, the first voltage line VDL and the horizontal voltage line HVDL may be connected to each other. The first voltage line VDL may be connected to the horizontal voltage line HVDL, and may supply drive voltage or high-potential voltage to the horizontal voltage line HVDL. The first voltage line VDL may supply the drive voltage or high-potential voltage to the pixel SP.

The gate line GL may extend in the first direction DR1. The gate line GL may extend in the second direction DR2 and may be connected to each of first and second auxiliary gate lines BGL1 and BGL2 spaced apart from each other. The gate line GL may be connected to the first to third pixels SP1, SP2, and SP3 via the first auxiliary gate line BGL1 and the second auxiliary gate line BGL2.

The second voltage line VSL may extend in the first direction DR1. The second voltage line VSL may be spaced apart from the gate line GL in the second direction DR2. The second voltage line VSL may be connected to the first to third pixels SP1, SP2, and SP3.

The vertical voltage line VVSL may extend in the second direction DR2. The vertical voltage line VVSL may intersect the second voltage line VSL. In the intersecting area, the second voltage line VSL and the vertical voltage line VVSL may be connected to each other. The vertical voltage line VVSL may be connected to the second voltage line VSL, and may supply low-potential voltage to the second voltage line VSL.

The data line DL may extend in the second direction DR2. The data line DL may be spaced apart from the sensing line SL, the first voltage line VDL and the vertical voltage line VVSL in the first direction DR1.

The first data line DL1 may extend in the second direction DR2 and may be connected to the first pixel SP1. The second data line DL2 may be disposed between the first data line DL1 and the vertical voltage line VVSL. The second data line DL2 may extend in the second direction DR2 and may be connected to the second pixel SP2. The third data line DL3 may be disposed between the first data line DL1 and the second data line DL2. The third data line DL3 may extend in the second direction DR2 and may be connected to the third pixel SP3.

Figure 6:
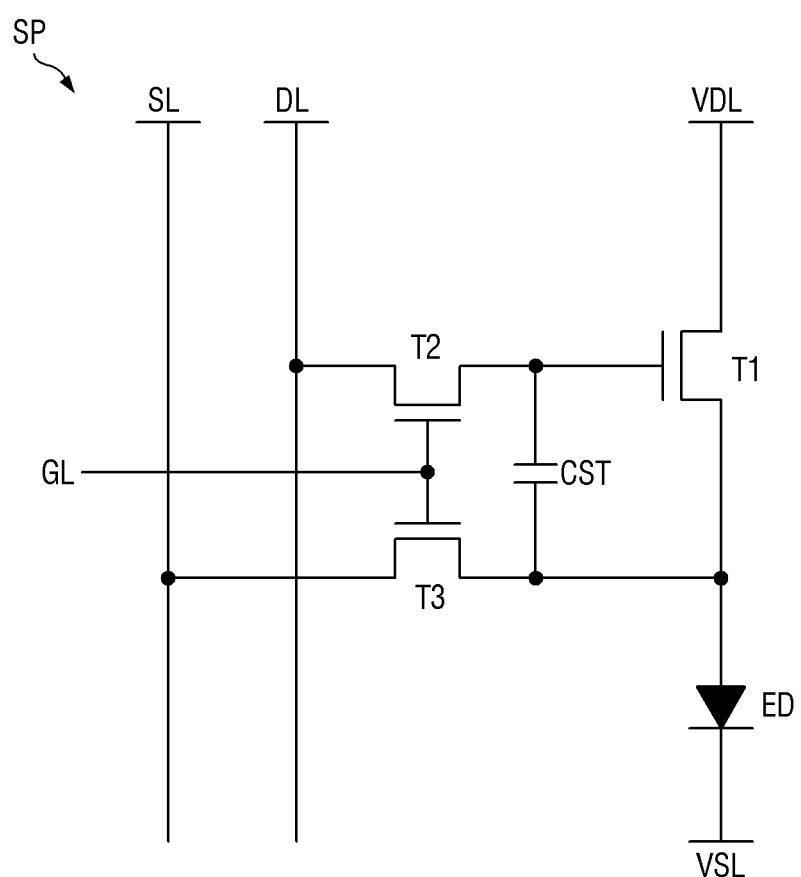
FIG. 6 is schematic diagram of an equivalent circuit of one pixel of a display device according to one embodiment.

FIG. 6 is a schematic diagram of an equivalent circuit of one pixel of the display device according to one embodiment.

Referring to FIG. 5 and FIG. 6, each pixel SP of the sub-display device 10 may include first to third transistors T1, T2, and T3, a capacitor CST, and the light-emitting element ED.

The light-emitting element ED may emit light based on drive current supplied through the first transistor T1. A light emission amount or luminance of the light-emitting element ED may be proportional to a magnitude of the drive current. The light-emitting element ED may be embodied as an inorganic light-emitting element including an inorganic semiconductor.

One end of the light-emitting element ED may be connected to a source electrode of the first transistor T1, while the opposite end thereof may be connected to a second voltage line VSL to which a low-potential voltage (hereinafter, second power voltage) lower than a high-potential voltage (hereinafter, first power voltage) of a first voltage line VDL is supplied.

The first transistor T1 may adjust current flowing from the first voltage line VDL to which the first power voltage is supplied to the light-emitting element ED, based on a voltage difference between voltages of a gate electrode and a source electrode of the first transistor T1. In one example, the first transistor T1 may act as a driving transistor for activating the light-emitting element ED. The gate electrode of the first transistor T1 may be connected to a second source or drain electrode of a second transistor T2, the source electrode of the first transistor T1 may be connected to one end of the light-emitting element ED, and a drain electrode of the first transistor T1 may be connected to the first voltage line VDL to which the first power voltage is applied.

The second transistor T2 may be turned on based on the gate signal of the gate line GL to connect the data line DL to the gate electrode of the first transistor T1. A gate electrode of the second transistor T2 may be connected to the gate line GL, a second source or drain electrode of the second transistor T2 may be connected to the gate electrode of the first transistor T1, and a first source or drain electrode of the second transistor T2 may be connected to the data line DL.

The third transistor T3 may be turned on based on the gate signal of the gate line GL to connect the sensing line SL to the source electrode of the first transistor T1. A gate electrode of the third transistor T3 may be connected to the gate line GL, a first source or drain electrode of the third transistor T3 may be connected to the sensing line SL, and a second source or drain electrode of the third transistor T3 may be connected to the source electrode of the first transistor T1.

In one embodiment, the first source or drain electrode of each of the second and third transistors T2 and T3 may act as a drain electrode, while the second source or drain electrode thereof may act as a source electrode. The disclosure is not limited thereto. The first source or drain electrode of each of the second and third transistors T2 and T3 may act as a source electrode, while the second source or drain electrode thereof may act as a drain electrode.

A capacitor CST is formed between the gate electrode of the first transistor T1 and the source electrode of the first transistor T1. The capacitor CST stores therein a difference voltage between a gate voltage and a source voltage of the first transistor T1.

Each of the first to third transistors T1, T2, and T3 may be embodied as a thin-film transistor. In FIG. 6, an example in which each of the first to third transistors T1, T2, and T3 is embodied as a N-type MOSFET (Metal Oxide Semiconductor Field Effect Transistor) is described. The disclosure is not limited thereto. For example, each of the first to third transistors T1, T2, and T3 may be embodied as a P-type MOSFET. Some or a number of the first to third transistors T1, T2, and T3 may be embodied as an N-type MOSFET while the other thereof may be embodied as a P-type MOSFET.

Figure 7:
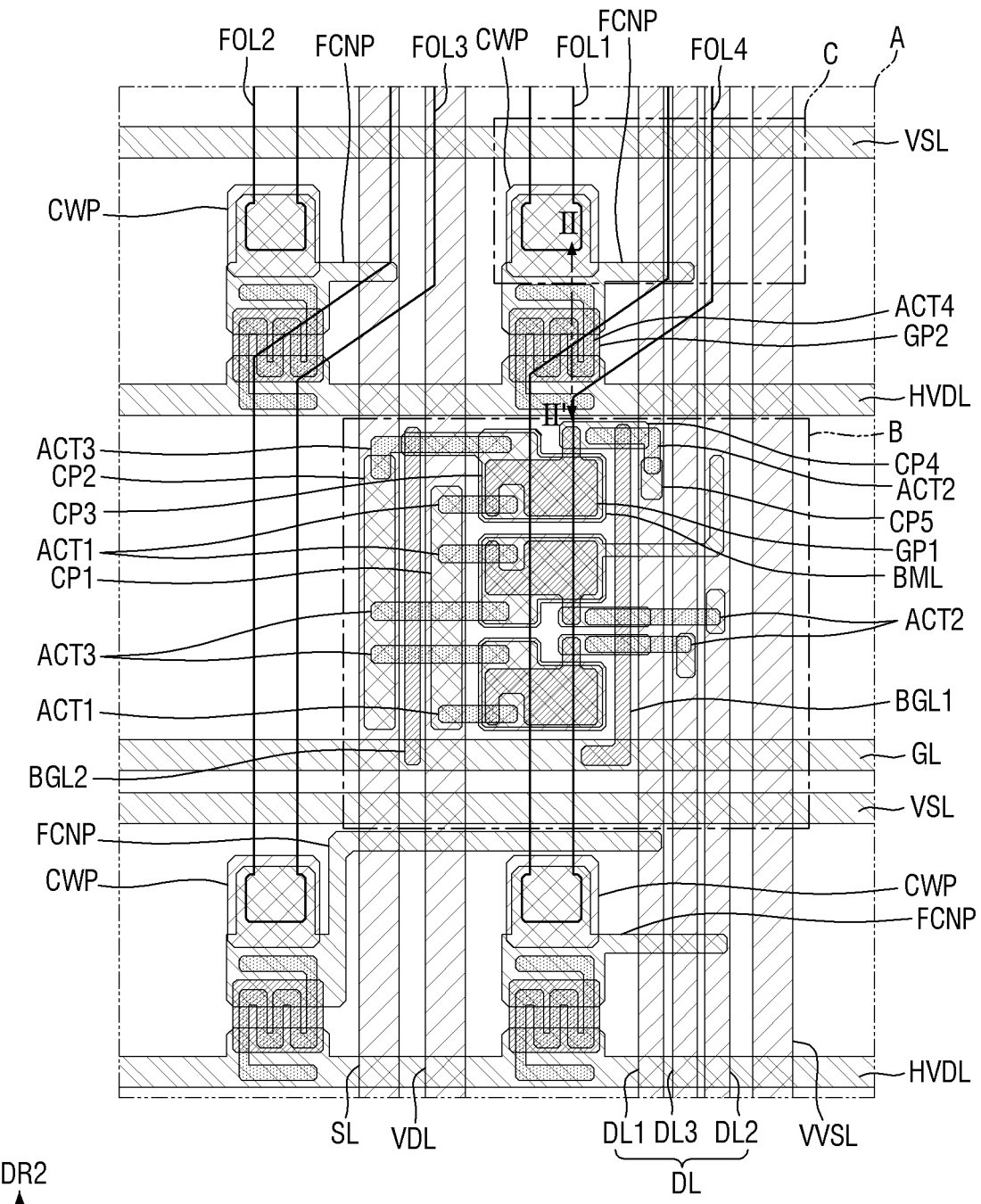
FIG. 7 is a planar layout diagram showing one enlarged example of an area A of FIG. 4.

FIG. 7 is a planar layout diagram showing one enlarged example of an area A of FIG. 4.

Referring to FIG. 7, a sub-display device 10 may include a lower conductive layer 110, a lower metal layer 120, a semiconductor layer 130, a first conductive layer 140, and a second conductive layer 150. The lower conductive layer 110 may include external signal lines FOL spaced apart from each other. The external signal lines FOL may include a first external signal line FOL1, a second external signal line FOL2, a third external signal line FOL3, and a fourth external signal line FOL4. Each of the first to fourth external signal lines FOL1, FOL2, FOL3, and FOL4 may generally extend in the second direction DR2, and may have one end disposed to overlap a lower connection pattern CWP.

The lower metal layer 120 may include the lower connection pattern CWP, a light-blocking pattern BML, a vertical voltage line VVSL, a first voltage line VDL, a sensing line SL and a data line DL. The lower connection pattern CWP, the light-blocking pattern BML, the vertical voltage line VVSL, the first voltage line VDL, the sensing line SL, and the data line DL may be disposed to be spaced apart from each other.

The first voltage line VDL may extend in the second direction DR2. The first voltage line VDL may include first voltage lines VDL. The first voltage lines VDL may be arranged or disposed along a row of pixels of the display area DA.

The sensing line SL may extend in the second direction DR2 and may be spaced apart from the first voltage line VDL in the first direction DR1. The sensing line SL may be disposed at a left side around the first voltage line VDL. The first voltage lines VDL may be spaced apart from each other in the first direction DR1. The sensing line SL may include sensing lines SL which may be arranged or disposed along a row of the pixels of the display area DA.

The vertical voltage line VVSL may extend in the second direction DR2, and may be spaced apart from the first voltage line VDL and the sensing line SL in the first direction DR1. The vertical voltage line VVSL may be spaced from the sensing line SL while the first voltage line VDL is interposed therebetween. The vertical voltage line VVSL may include vertical voltage lines VVSL which may be arranged or disposed along a row of the pixels of the display area DA.

The data line DL may extend in the second direction DR2, and may be spaced apart from the first voltage line VDL, the sensing line SL, and the vertical voltage line VVSL in the first direction DR1. The data line DL may be disposed between the first voltage line VDL and the vertical voltage line VVSL.

As described above, the data line DL may include the first to third data lines DL1, DL2, and DL3. The first data line DL1 may be disposed between the first voltage line VDL and the vertical voltage line VVSL. The second data line DL2 may be disposed between the first data line DL1 and the vertical voltage line VVSL. The third data line DL3 may be disposed between the first data line DL1 and the second data line DL2.

The light-blocking pattern BML may be disposed between the light-blocking pattern BML and the first data line DL1. The light-blocking pattern BML may include light-blocking patterns BML. Each of the light-blocking patterns BML may be disposed in each of the pixels SP.

The lower connection pattern CWP may be disposed to overlap one end of the external signal line FOL. The lower connection pattern CWP may include lower connection patterns CWP. The lower connection pattern CWP may be disposed to overlap one end of each of the first to fourth external signal lines FOL1, FOL2, FOL3, and FOL4 spaced apart from each other.

The semiconductor layer 130 may include a first semiconductor pattern ACT1, a second semiconductor pattern ACT2, a third semiconductor pattern ACT3, and a fourth semiconductor pattern ACT4. The first semiconductor pattern ACT1, the second semiconductor pattern ACT2, the third semiconductor pattern ACT3, and the fourth semiconductor pattern ACT4 may be disposed to be spaced apart from each other.

The first semiconductor pattern ACT1 may be disposed between the first voltage line VDL and the light-blocking pattern BML. The first semiconductor pattern ACT1 may have one end which overlaps the first voltage line VDL and a first conductive pattern CP1 of the second conductive layer 150, and the opposite end which overlaps the light-blocking pattern BML and the third conductive pattern CP3 of the second conductive layer 150. The first semiconductor pattern ACT1 may include first semiconductor patterns ACT1. Each of the first semiconductor patterns ACT1 may be disposed in each of the pixels SP. The first semiconductor pattern ACT1 may act as a semiconductor pattern ACT1 of the first transistor T1 of each pixel SP.

The second semiconductor pattern ACT2 may be disposed to be spaced apart from the first semiconductor pattern ACT1. The second semiconductor pattern ACT2 may have one end which overlaps a fourth conductive pattern CP4 of the second conductive layer 150 as described later, and the opposite end which overlaps the data line DL and a fifth conductive pattern CP5 of the second conductive layer 150. The second semiconductor pattern ACT2 may include second semiconductor patterns ACT2. Each of the second semiconductor patterns ACT2 may be disposed in each of the pixels SP. The second semiconductor pattern ACT2 may act as a semiconductor pattern ACT2 of the second transistor T2 of each pixel SP.

The third semiconductor pattern ACT3 may be disposed to be spaced apart from the first and second semiconductor patterns ACT1 and ACT2. The third semiconductor pattern ACT3 may have one end which overlaps the sensing line SL and a second conductive pattern CP2 of the second conductive layer 150, and the opposite end which overlaps a third conductive pattern CP3 of the second conductive layer 150. The third semiconductor pattern ACT3 may include third semiconductor patterns ACT3. Each of the third semiconductor patterns ACT3 may be disposed in each of the pixels SP. The third semiconductor pattern ACT3 may act as a semiconductor pattern ACT3 of the third transistor T3 of each pixel SP.

The fourth semiconductor pattern ACT4 may be disposed to be spaced apart from the first to third semiconductor patterns ACT1, ACT2, and ACT3. The fourth semiconductor pattern ACT4 may be disposed between the horizontal voltage line HVDL and the lower connection pattern CWP. The fourth semiconductor pattern ACT4 may have one end overlapping an upper connection pattern FCNP of the second conductive layer 150, and the opposite end overlapping the horizontal voltage line HVDL. The fourth semiconductor pattern ACT4 may include fourth semiconductor patterns ACT4. Each of the fourth semiconductor patterns ACT4 may be disposed to correspond to each of the external signal lines FOL or the lower connection patterns CWP. The fourth semiconductor pattern ACT4 may act as a semiconductor pattern ACT4 (FIG. 12) of the fourth transistor TFT1 of each external signal line FOL which will be described later.

The first conductive layer 140 may include a first gate pattern GP1, a second gate pattern GP2, a first auxiliary gate line BGL1, and a second auxiliary gate line BGL2. The first gate pattern GP1, the second gate pattern GP2, the first auxiliary gate line BGL1, and the second auxiliary gate line BGL2 may be disposed to be spaced apart from each other.

The first gate pattern GP1 may be disposed to overlap the light-blocking pattern BML. The first gate pattern GP1 may include first gate patterns GP1. Each of the first gate patterns GP1 may be disposed in each of the pixels SP.

The second gate pattern GP2 may be disposed to overlap a partial area of the fourth semiconductor pattern ACT4. The second gate pattern GP2 may not overlap both opposing ends of the fourth semiconductor pattern ACT4, and may overlap a central area of the fourth semiconductor pattern ACT4. The second gate pattern GP2 may include second gate patterns GP2. Each of the second gate patterns GP2 may be disposed to correspond to each of the fourth semiconductor patterns ACT4. The second gate pattern GP2 may act as a gate electrode GP2 of a fourth transistor TFT1 (FIG. 12) of each external signal line FOL, which will be described later.

The first auxiliary gate line BGL1 may be disposed between the first data line DL1 and the first gate pattern GP1. The first auxiliary gate line BGL1 may extend in the second direction DR2 and between the horizontal voltage line HVDL and the gate line GL. The first auxiliary gate line BGL1 may overlap a partial area of each of the second semiconductor pattern ACT2. One end of the first auxiliary gate line BGL1 may overlap the gate line GL.

The second auxiliary gate line BGL2 may be disposed between the sensing line SL and the first voltage line VDL. The second auxiliary gate line BGL2 may extend in the second direction DR2 and between the horizontal voltage line HVDL and gate line GL. The second auxiliary gate line BGL2 may overlap a partial area of each of the third semiconductor pattern ACT3. One end of the second auxiliary gate line BGL2 may overlap the gate line GL.

The second conductive layer 150 may include the second voltage line VSL, the horizontal voltage line HVDL, the gate line GL, the upper connection pattern FCNP, the first conductive pattern CP1, the second conductive pattern CP2, the third conductive pattern CP3, the fourth conductive pattern CP4 and the fifth conductive pattern CP5. The second voltage line VSL, the horizontal voltage line HVDL, the gate line GL, the upper connection pattern FCNP, the first conductive pattern CP1, the second conductive pattern CP2, the third conductive pattern CP3, the fourth conductive pattern CP4, and the fifth conductive pattern CP5 may be disposed to be spaced apart from each other.

The second voltage line VSL may extend in the first direction DR1. The second voltage line VSL may intersect the vertical voltage line VVSL. The second voltage line VSL may be disposed adjacent to an upper side of the lower connection pattern CWP. The second voltage line VSL may include second voltage lines VSL which may be spaced apart from each other in the second direction DR2. The second voltage lines VSL may be arranged or disposed along a row of pixels in the display area DA.

The horizontal voltage line HVDL may extend in the first direction DR1. The horizontal voltage line HVDL may be spaced from the second voltage line VSL in the second direction DR2. The horizontal voltage line HVDL may intersect the first voltage line VDL. The horizontal voltage line HVDL may be disposed below the second voltage line VSL while the lower connection pattern CWP is interposed therebetween. The horizontal voltage line HVDL may include horizontal voltage lines HVDL which may be spaced apart from each other in the second direction DR2. The horizontal voltage lines HVDL may be arranged or disposed along a row of pixels in the display area DA.

The gate line GL may extend in the first direction DR1. The gate line GL may be disposed between the second voltage line VSL and the horizontal voltage line HVDL. The gate line GL may be disposed adjacent to an upper side of the second voltage line VSL. The gate line GL may overlap each of one end of the first auxiliary gate line BGL1 and one end of the second auxiliary gate line BGL2 as described above.

The upper connection pattern FCNP may overlap the lower connection pattern CWP and one end of the fourth semiconductor layer ACT4. Further, a partial area of the upper connection pattern FCNP may overlap the sensing line SL and one of the first to third data lines DL1, DL2, and DL3. The upper connection pattern FCNP may include upper connection patterns FCNP. Each of the upper connection patterns FCNP may be disposed to correspond to each of the lower connection patterns CWP.

The first conductive pattern CP1 may overlap the first voltage line VDL. The first conductive pattern CP1 may be disposed between the horizontal voltage line HVDL and the gate line GL. The first conductive pattern CP1 may extend in the second direction DR2 and between the horizontal voltage line HVDL and the gate line GL and may be disposed to be spaced apart from each of the horizontal voltage line HVDL and the gate line GL.

The second conductive pattern CP2 may overlap the sensing line SL. The second conductive pattern CP2 may be disposed between the horizontal voltage line HVDL and the gate line GL. The second conductive pattern CP2 may extend in the second direction DR2 and between the horizontal voltage line HVDL and the gate line GL and may be disposed to be spaced apart from each of the horizontal voltage line HVDL and the gate line GL.

The third conductive pattern CP3 may overlap the light-blocking pattern BML, and the first gate pattern GP1. The third conductive pattern CP3 may include third conductive patterns CP3. Each of the third conductive patterns CP3 may be disposed in each of the pixels SP.

The fourth conductive pattern CP4 may be disposed to overlap one end of the second active pattern ACT2 and a portion of the first gate pattern GP1. The fourth conductive pattern CP4 may include fourth conductive patterns CP4. Each of the fourth conductive patterns CP4 may be disposed in each of the pixels SP.

The fifth conductive pattern CP5 may be disposed to overlap the opposite end of the second active pattern ACT2 and the data line DL. The fifth conductive pattern CP5 may include fifth conductive patterns CP5. Each of the fifth conductive patterns CP5 may be disposed in each of the pixels SP.

Figure 8:
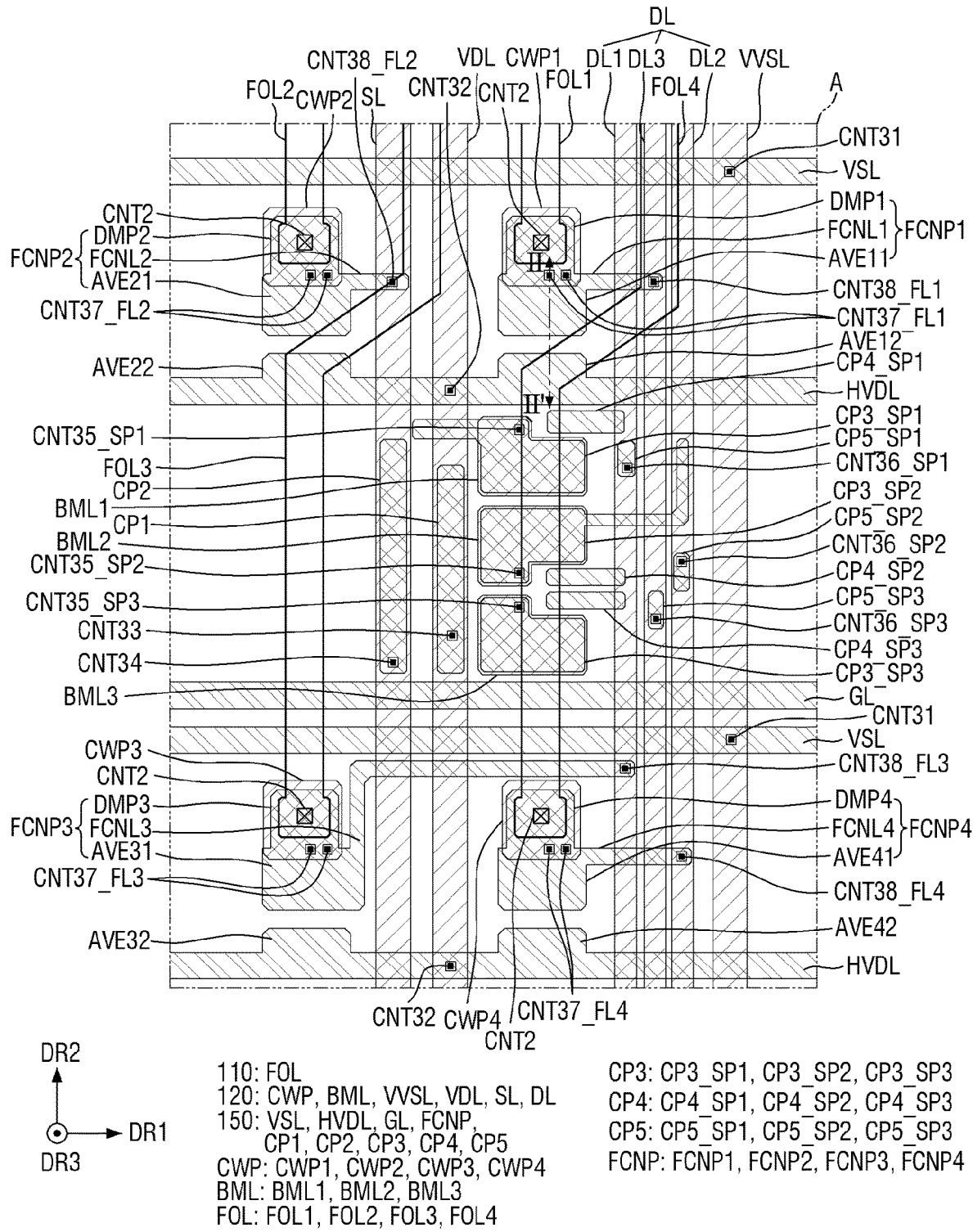
FIG. 8 is a planar layout diagram showing a relative connection relationship of a lower conductive layer, a lower metal layer, and a second conductive layer in FIG. 7.

FIG. 8 is a planar layout diagram showing a relative connection relationship of the lower conductive layer, the lower metal layer, and the second conductive layer in FIG. 7.

Referring to FIG. 8, the patterns or lines composed of the second conductive layer 150 may be electrically connected to the lower conductive layer 110 or the lower metal layer 120 via contact holes CNT3$n$ ($n$ is a natural number of 7 or smaller). Further, the lower metal layer 120 may be electrically connected to the lower conductive layer 110 via a second contact hole CNT2.

The lower connection pattern CWP may be electrically connected to one end of the external signal line FOL via the second contact hole CNT2. Lower connection patterns CWP may include first to fourth lower connection patterns CWP1, CWP2, CWP3, and CWP4. The first lower connection pattern CWP1 may overlap one end of the first external signal line FOL1. The second lower connection pattern CWP2 may overlap one end of the second external signal line FOL2. The third lower connection pattern CWP3 may overlap one end of the third external signal line FOL3. The fourth lower connection pattern CWP4 may overlap one end of the fourth external signal line FOL4. The first to fourth lower connection patterns CWP1, CWP2, CWP3, and CWP4 may be connected to the first to fourth external signal lines FOL1, FOL2, FOL3, and FOL4 via the second contact holes CNT2, respectively.

The second voltage lines VSL may intersect the vertical voltage lines VVSL. Each second voltage line VSL and each vertical voltage line VVSL may be connected to each other via a third contact hole CNT31 in an area in which each second voltage line VSL and each vertical voltage line VVSL intersect with each other.

The first voltage line VDL and the horizontal voltage lines HVDL may intersect with each other. The first voltage line VDL and each horizontal voltage line HVDL may be connected to each other via a third contact hole CNT32 in an area in which the first voltage line VDL and each horizontal voltage line HVDL intersect with each other.

The horizontal voltage line HVDL may further include a second auxiliary electrode protruding upwards and in an area adjacent to the upper connection pattern FCNP or the lower connection pattern CWP. For example, the horizontal voltage line HVDL disposed adjacent to a lower side of each of the first and second lower connection patterns CWP1 and CWP2 may include second auxiliary electrodes AVE12 and AVE22 protruding upwards. Further, the horizontal voltage line HVDL disposed adjacent to a lower side of each of the third and fourth lower connection patterns CWP3 and CWP4 may include second auxiliary electrodes AVE32 and AVE22 protruding upwards.

The first conductive pattern CP1 may be connected to the first voltage line VDL via a third contact hole CNT33. The second conductive pattern CP2 may be connected to the sensing line SL via a third contact hole CNT34.

The light-blocking pattern BML may include the first to third light-blocking patterns BML1, BML2, and BML3. The first to third light-blocking patterns BML1, BML2, and BML3 may be disposed to be spaced apart from each other. For example, the first to third light-blocking patterns BML1, BML2, and BML3 may be sequentially arranged or disposed along a direction (for example, downwards) opposite to the second direction DR2. The first light-blocking pattern BML1 may act as the light-blocking pattern BML1 of the first pixel SP1. The second light-blocking pattern BML2 may act as the light-blocking pattern BML2 of the second pixel SP2. The third light-blocking pattern BML3 may act as the light-blocking pattern BML3 of the third pixel SP3.

The third conductive pattern CP3 may include a third conductive pattern CP3_SP1 of the first pixel SP1, a third conductive pattern CP3_SP2 of the second pixel SP2, and a third conductive pattern CP3_SP3 of the third pixel SP3. The third conductive patterns CP3_SP1, CP3_SP2, and CP3_SP3 respectively disposed in the first to third pixels SP1, SP2, and SP3 may be disposed to be spaced apart from each other.

The third conductive pattern CP3_SP1 of the first pixel SP1 may overlap the first light-blocking pattern BML1 and may be connected thereto via a third contact hole CNT35_SP1. The third conductive pattern CP3_SP2 of the second pixel SP2 may overlap the second light-blocking pattern BML2 and may be connected thereto via a third contact hole CNT35_SP2. The third conductive pattern CP3_SP3 of the third pixel SP3 may overlap the third light-blocking pattern BML3 and may be connected thereto via a third contact hole CNT35_SP3.

The fourth conductive pattern CP4 may include a fourth conductive pattern CP4_SP1 of the first pixel SP1, a fourth conductive pattern CP4_SP2 of the second pixel SP2, and a fourth conductive pattern CP4_SP3 of the third pixel SP3. The fourth conductive patterns CP4_SP1, CP4_SP2, and CP4_SP3 respectively disposed in the first to third pixels SP1, SP2, and SP3 may be disposed to be spaced apart from each other.

The fifth conductive pattern CP5 may include a fifth conductive pattern CP5_SP1 of the first pixel SP1, a fifth conductive pattern CP5_SP2 of the second pixel SP2, and a fifth conductive pattern CP5_SP3 of the third pixel SP3. The fifth conductive patterns CP5_SP1, CP5_SP2, and CP5_SP3 respectively disposed in the first to third pixels SP1, SP2, and SP3 may be disposed to be spaced apart from each other.

The fifth conductive pattern CP5_SP1 of the first pixel SP1 may be connected to the first data line DL1 via a third contact hole CNT36_SP1. The fifth conductive pattern CP5_SP2 of the second pixel SP2 may be connected to the second data line DL2 via a third contact hole CNT36_SP1. The fifth conductive pattern CP5_SP3 of the third pixel SP3 may be connected to the third data line DL3 via a third contact hole CNT36_SP3. It is noted that a further contact hole CNT36_SP2 may also be included.

The upper connection pattern FCNP may include first to fourth upper connection patterns FCNP1, FCNP2, FCNP3, and FCNP4. The first to fourth upper connection patterns FCNP1, FCNP2, FCNP3, and FCNP4 may be disposed to be spaced apart from each other.

The first upper connection pattern FCNP1 may overlap the first external signal line FOL1 and the first lower connection pattern CWP1. The first upper connection pattern FCNP1 may include a first dummy pattern DMP1, a first connection line FCNL1 and a first auxiliary electrode AVE11.

The first dummy pattern DMP1 may overlap the first lower connection pattern CWP1 and the second contact hole CNT2. The first connection line FCNL1 may extend in the first direction DR1 and thus overlap a portion of the first lower connection pattern CWP1 and the third data line DL3. The first auxiliary electrode AVE11 may be spaced apart from and face toward an underlying second auxiliary electrode AVE12.

The first connection line FCNL1 may be connected to the first lower connection pattern CWP1 via a third contact hole CNT37_FL1 and may be connected to the third data line DL3 via a third contact hole CNT38_FL1. The first connection line FCNL1 may serve to connect the first lower connection pattern CWP1 and the third data line DL3 to each other.

The second upper connection pattern FCNP2 may overlap the second external signal line FOL2 and the second lower connection pattern CWP2. The second upper connection pattern FCNP2 may include a second dummy pattern DMP2, a second connection line FCNL2 and a first auxiliary electrode AVE21. A third dummy pattern DMP3 and a fourth dummy pattern DMP_4 may also be included.

The second dummy pattern DMP2 may overlap the second lower connection pattern CWP2 and the second contact hole CNT2. The second connection line FCNL2 may extend in the first direction DR1 and thus overlap a portion of the second lower connection pattern CWP2 and the sensing line SL. The first auxiliary electrode AVE21 may be spaced apart from and face toward an underlying second auxiliary electrode AVE22.

The second connection line FCNL2 may be connected to the second lower connection pattern CWP2 via a third contact hole CNT37_FL2 and may be connected to the sensing line SL via a third contact hole CNT38_FL2. The second connection line FCNL2 may serve to connect the second lower connection pattern CWP2 and the sensing line SL to each other.

Each of the third and fourth upper connection patterns FCNP3 and FCNP4 may be generally similar to the first upper connection pattern FCNP1. A third connection line FCNL3 of the third upper connection pattern FCNP3 may overlap the first data line DL_1. A fourth connection line FCNL4 of the fourth upper connection pattern FCNP4 may overlap the second data line DL2.

A third connection line FCNL3 may be connected to the third lower connection pattern CWP3 via a third contact hole CNT37_FL3 and may be connected to the first data line DL1 via a third contact hole CNT38_FL3. The third connection line FCNL3 may serve to connect the third lower connection pattern CWP3 and the first data line DL1 to each other. Similarly, a fourth connection line FCNL4 may be connected to the fourth lower connection pattern CWP4 via a third contact hole CNT37_FL4, and may be connected to the second data line DL2 via a third contact hole CNT38_FL4. The fourth connection line FCNL4 may serve to connect the fourth lower connection pattern CWP4 and the second data line DL2 to each other.

Figure 9:
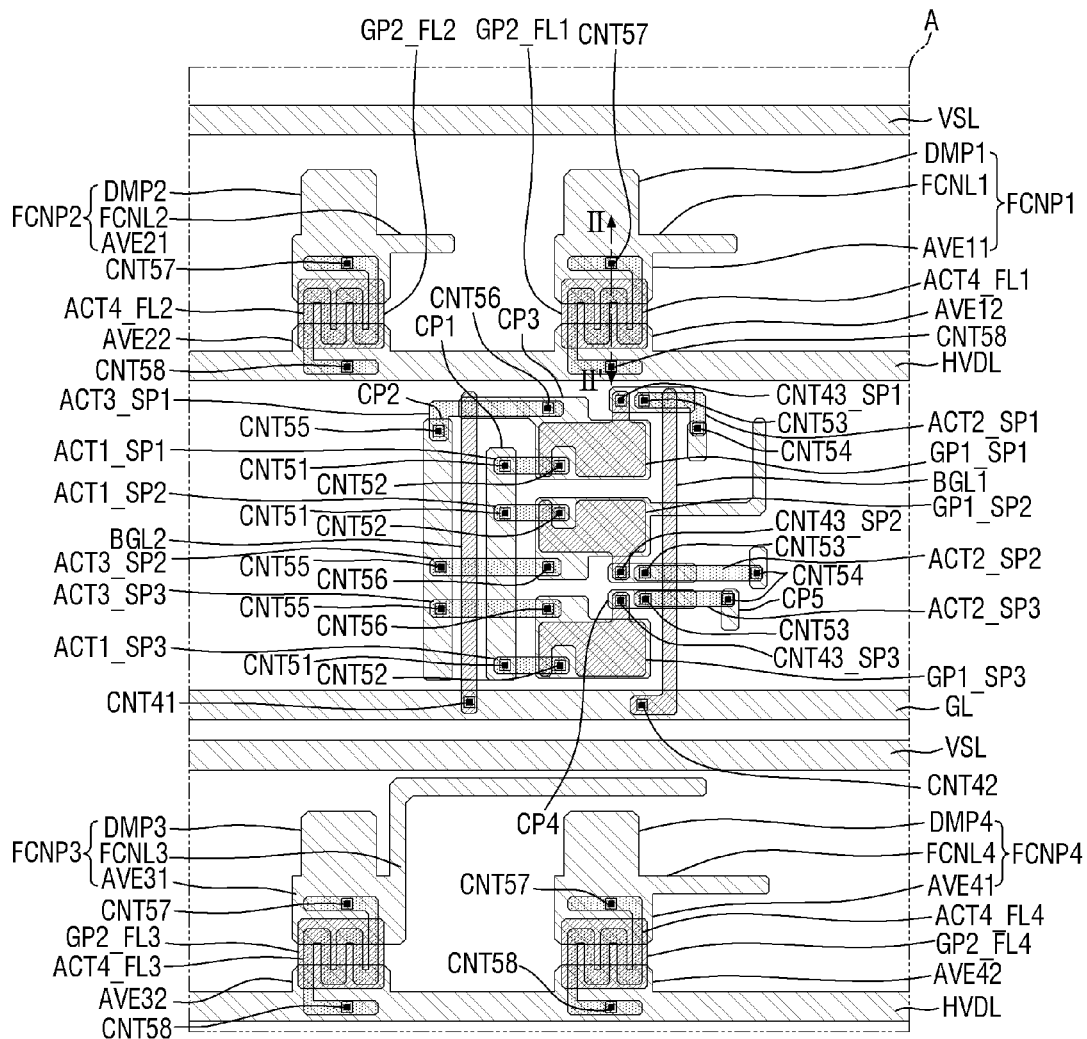
FIG. 9 is a planar layout diagram showing a relative connection relationship between a semiconductor layer, a first conductive layer, and a second conductive layer in FIG. 7.
Figure 9:
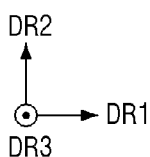

FIG. 9 is a planar layout diagram showing a relative connection relationship between the semiconductor layer, the first conductive layer, and the second conductive layer in FIG. 7.

Referring to FIG. 9, patterns or lines composed of the second conductive layer 150 may be electrically connected to the first conductive layer 140 via contact holes CNT4$n$ ($n$ is a natural number of 3 or smaller). Further, the patterns or lines composed of the second conductive layer 150 may be electrically connected to the semiconductor layer 130 via contact holes CNT5$n$ ($n$ is a natural number smaller than or equal to 8).

For example, the gate line GL may be connected to the first auxiliary gate line BGL1 and the second auxiliary gate line BGL2. For example, the gate line GL may be connected to the second auxiliary gate line BGL2 via a fourth contact hole CNT41 and may be connected to the first auxiliary gate line BGL1 via a fourth contact hole CNT42.

The first gate pattern GP1 may include a gate pattern GP1_SP1 of the first pixel SP1, a gate pattern GP1_SP2 of the second pixel SP2, and a gate pattern GP1_SP3 of the third pixel SP3. The gate pattern GP1_SP1 of the first pixel SP1 may overlap each of the third conductive pattern CP3_SP1 of the first pixel SP1 and the fourth conductive pattern CP4_SP1 of the first pixel SP1. The gate pattern GP1_SP2 of the second pixel SP2 may overlap each of the third conductive pattern CP3_SP2 of the second pixel SP2 and the fourth conductive pattern CP4_SP2 of the second pixel SP2. The gate pattern GP1_SP3 of the third pixel SP3 may overlap each of the third conductive pattern CP3_SP3 of the third pixel SP3 and the fourth conductive pattern CP4_SP3 of the third pixel SP3.

The fourth conductive pattern CP4_SP1 of the first pixel SP1 may be connected to the gate pattern GP1_SP1 of the first pixel SP1 via a fourth contact hole CNT43_SP1. The fourth conductive pattern CP4_SP2 of the second pixel SP2 may be connected to the gate pattern GP1_SP2 of the second pixel SP2 via a fourth contact hole CNT43_SP2. The fourth conductive pattern CP4_SP3 of the third pixel SP3 may be connected to the gate pattern GP1_SP3 of the third pixel SP3 via a fourth contact hole CNT43_SP3.

The second gate patterns GP2_FL1, GP2_FL2, GP2_FL3, and GP2_FL4 may be disposed to correspond to the fourth semiconductor patterns ACT4_FL1, ACT4_FL2, ACT4_FL3, and ACT4_FL4, respectively.

The first conductive pattern CP1 may overlap one end of each of the first semiconductor patterns ACT1_SP1, ACT1_SP2, and ACT1_SP3 of the first to third pixels SP1, SP2, and SP3, and may be electrically connected thereto via a fifth contact hole CNT51.

The second conductive pattern CP2 may overlap one end of each of the third semiconductor patterns ACT3_SP1, ACT3_SP2, and ACT3_SP3 of the first to third pixels SP1, SP2, and SP3, and may be electrically connected thereto via a fifth contact hole CNT55.

Each of the third conductive patterns CP3_SP1, CP3_SP2, and CP3_SP3 of the first to third pixels SP1, SP2, and SP3 may be connected to the opposite end of each of the first semiconductor patterns ACT1_SP1, ACT1_SP2, and ACT1_SP3 of the first to third pixels SP1, SP2, and SP3 via a fifth contact hole CNT52. Further, each of the third conductive patterns CP3_SP1, CP3_SP2, and CP3_SP3 of the first to third pixels SP1, SP2, and SP3 may be connected to the opposite end of each of the third semiconductor pattern of ACT3_SP1, ACT3_SP2, and ACT3_SP3 of the first to third pixels SP1, SP2, and SP3 via a fifth contact hole CNT56.

Each of the fourth conductive patterns CP4_SP1, CP4_SP2, and CP4_SP3 of the first to third pixels SP1, SP2, and SP3 may be connected to one end of each of the second semiconductor patterns ACT2 SP1, ACT2 SP2, and ACT2 SP3 of the first to third pixels SP1, SP2, and SP3 via a fifth contact hole CNT53.

Each of the fifth conductive patterns CP5_SP1, CP5_SP2, and CP5_SP3 of the first to third pixels SP1, SP2, and SP3 may be connected to the opposite end of each of the second semiconductor patterns ACT2_SP1, ACT2_SP2, and ACT2_SP3 of the first to third pixels SP1, SP2, and SP3 via a fifth contact hole CNT54.

Each of the first auxiliary electrodes AVE11, AVE21, AVE31, and AVE41 of the first to fourth connection patterns FCNP1, FCNP2, FCNP3, and FCNP4 may be connected to one end of each of the fourth semiconductor patterns ACT4_FL1, ACT4_FL2, ACT4_FL3, and ACT4_FL4 via a fifth contact hole CNT57.

Each of the second auxiliary electrodes AVE12, AVE22, AVE32, and AVE22 may be connected to the opposite end of each of the fourth semiconductor patterns ACT4_FL1, ACT4_FL2, ACT4_FL3, and ACT4_FL4 via a fifth contact hole CNT58.

Figure 10:
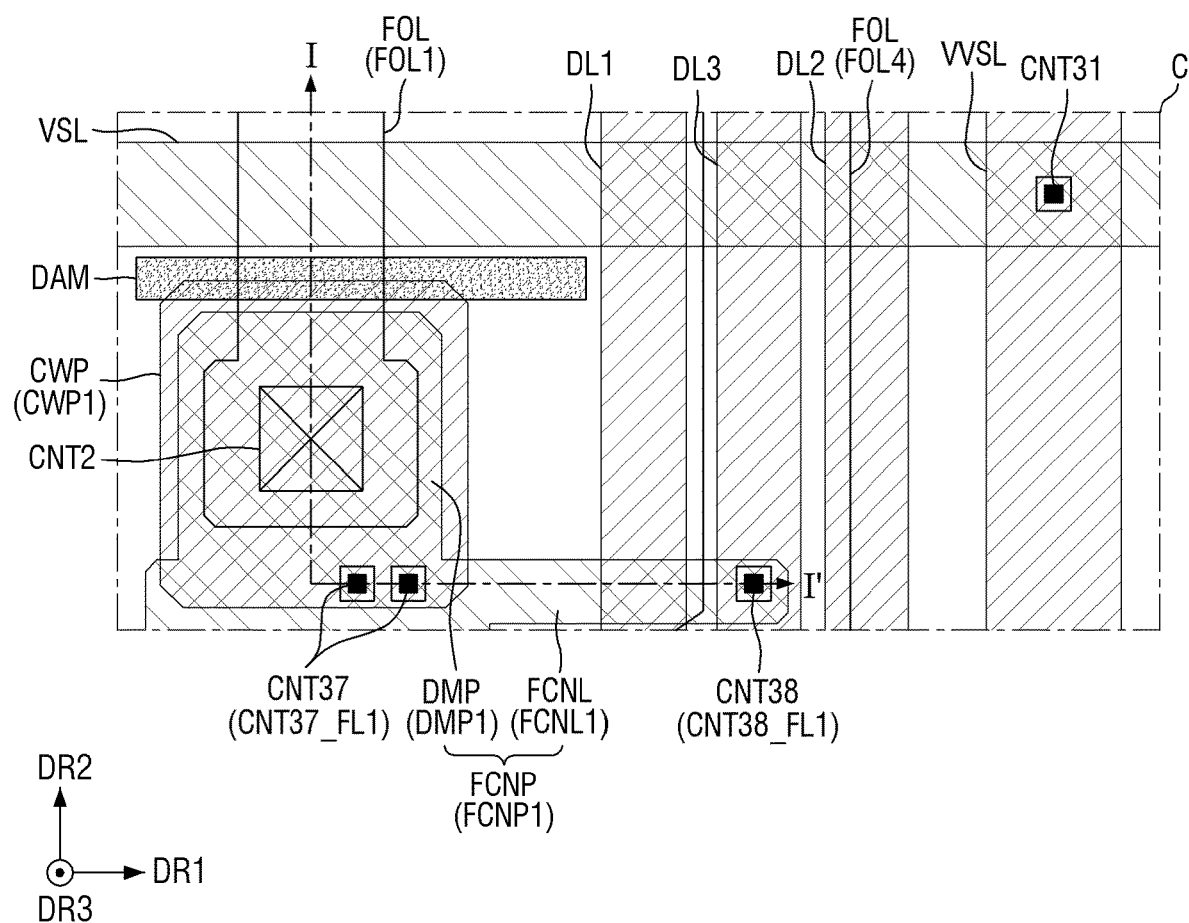
FIG. 10 is a planar layout diagram showing one enlarged example of the area C of FIG. 7.

FIG. 10 is a planar layout diagram showing one enlarged example of the area C of FIG. 7.

Hereinafter, a relative planar arrangement relationship between the first external signal line FOL1, the first lower connection pattern CWP1, the first upper connection pattern FCNP1 and the second voltage line VSL will be described with reference to FIG. 10.

In FIG. 10, the planar arrangement relationship between the first external signal line FOL1, the first lower connection pattern CWP1 and the first upper connection pattern FCNP1 may be substantially the same as a planar arrangement relationship between each of the second to fourth external signal lines FOL2, FOL3, and FOL4, each of the second to fourth lower connection patterns CWP2, CWP3, and CWP4, and each of the second to fourth upper connection patterns FCNP2, FCNP3, and FCNP4. Therefore, the planar arrangement relationship between the first external signal line FOL1, the first lower connection pattern CWP1 and the first upper connection pattern FCNP1 may be equally applied to the planar arrangement relationship between each of the second to fourth external signal lines FOL2, FOL3, and FOL4, each of the second to fourth lower connection patterns CWP2, CWP3, and CWP4, and each of the second to fourth upper connection patterns FCNP2, FCNP3, and FCNP4.

A dam pattern DAM may be disposed in an area adjacent to the second contact hole CNT2 in a plan view. The dam pattern DAM may be disposed between the second contact hole CNT2 and the second voltage line VSL and may extend in the first direction DR1. In an embodiment in which the second voltage line VSL is disposed adjacent to an upper side of the second contact hole CNT2, the dam pattern DAM may be disposed adjacent to an upper side of the second contact hole CNT2. In one example, the dam pattern DAM may not overlap the second contact hole CNT2.

The second voltage line VSL and the first connection line FCNL1 may be disposed adjacent to the second contact hole CNT2. The second voltage line VSL may be disposed adjacent to an upper side of the second contact hole CNT2, while the first connection line FCNL1 may be disposed adjacent to a lower side of the second contact hole CNT2. The second voltage line VSL and the first connection line FCNL1 may be spaced apart from each other in the second direction DR2 while the dam pattern DAM is interposed therebetween.

The second voltage line VSL may extend in the first direction DR1 and may be electrically connected to the vertical voltage line VVSL via a third contact hole CNT31.

The first connection line FCNL1 may extend in the first direction DR1, and may overlap the third data line DL3 and the first lower connection pattern CWP1. The first connection line FCNL1 may be connected to the third data line DL3 via a third contact hole CNT38, and may be connected to the first lower connection pattern CWP1 via a third contact hole CNT37. For example, the first connection line FCNL1 may connect the third data line DL3 and the first lower connection pattern CWP1 to each other.

The first dummy pattern DMP1 may be disposed between the first connection line FCNL1 and the second voltage line VSL. In one embodiment, the first dummy pattern DMP1 may be monolithic with the first connection line FCNL1 to form a single first upper connection pattern FCNP1.

The first dummy pattern DMP1 may be spaced apart from the second voltage line VSL while the dam pattern DAM is interposed therebetween. A width in the first direction DR1 of the dam pattern DAM may be greater than a width in the first direction DR1 of the first dummy pattern DMP1. The width in the first direction DR1 of the dam pattern DAM may be larger than the width in the first direction DR1 of the first dummy pattern DMP1, such that a short-circuit between the first dummy pattern DMP1 and the second voltage line VSL may be prevented in a patterning process of forming the first dummy pattern DMP1 and the second voltage line VSL composed of a same conductive layer.

Figure 11:
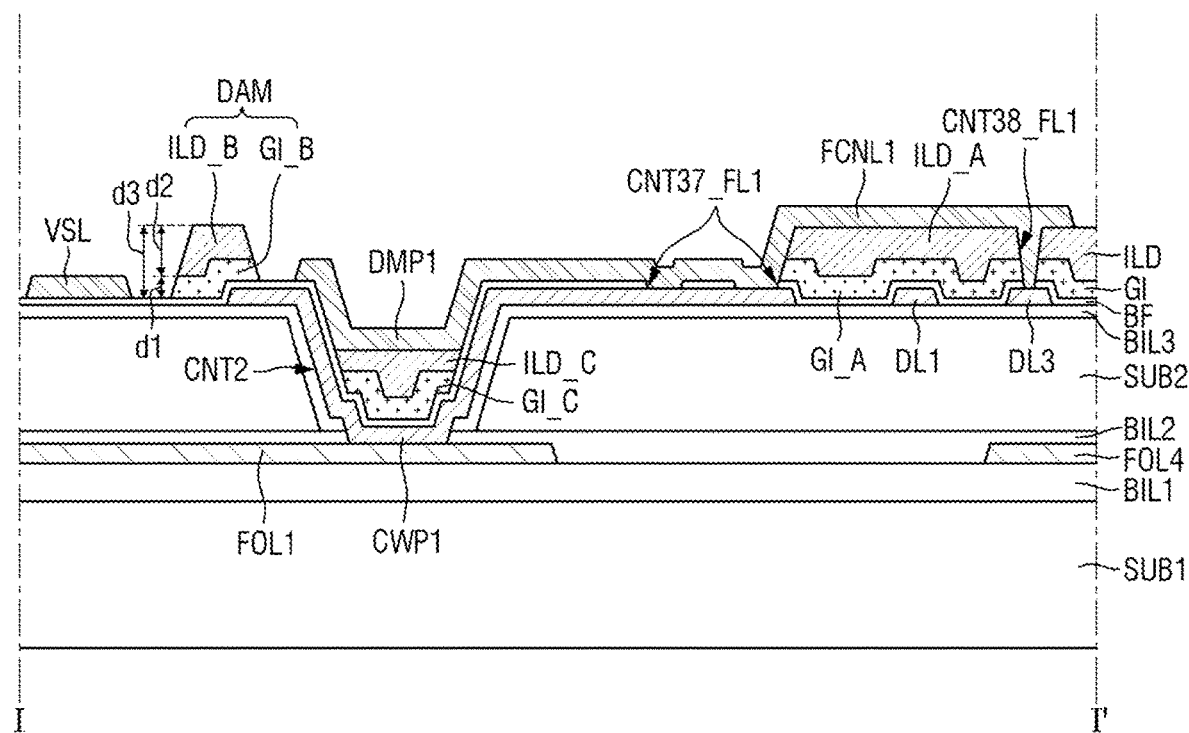
FIG. 11 is a schematic cross-sectional view showing one example cut along I-I' line in FIG. 10'

FIG. 11 is a schematic cross-sectional view showing one example cut along line I-I' in FIG. 10.

Figure 12:
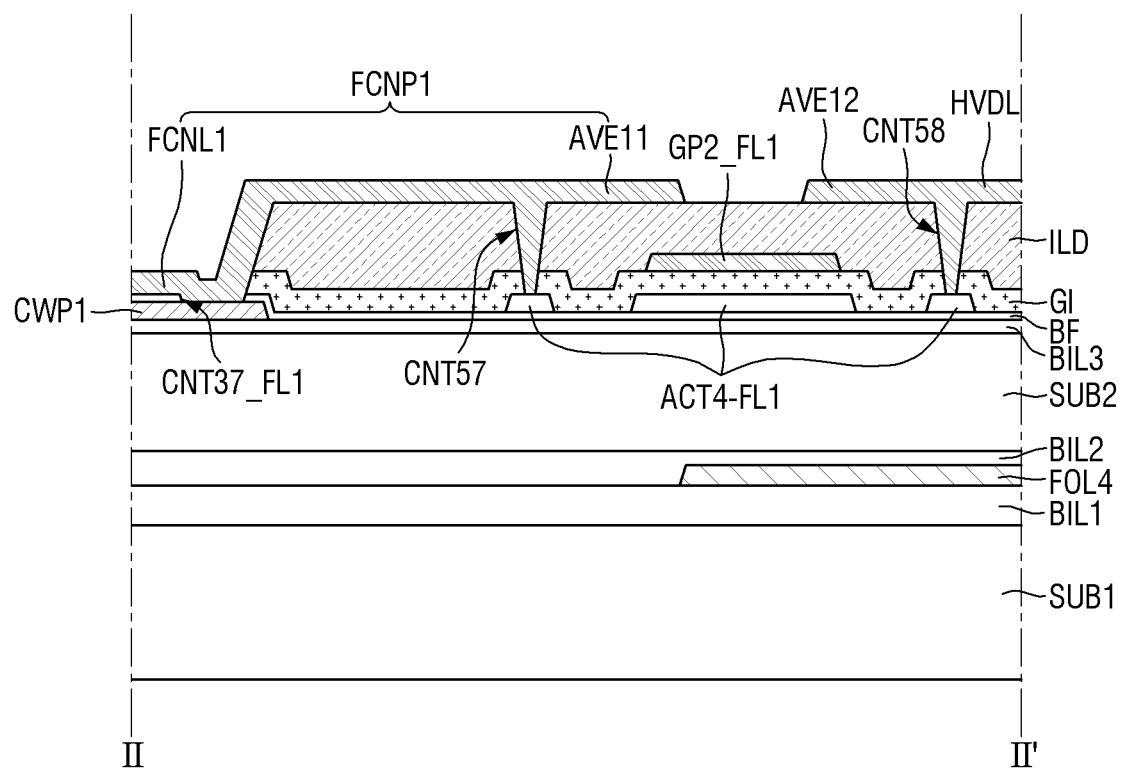
FIG. 12 is a schematic cross-sectional view showing one example cut along II-IF line of FIG. 7 to FIG. 9.

Referring to FIG. 11 and FIG. 12, the lower conductive layer 110 may be disposed on the first barrier insulating film BIL1. The lower conductive layer 110 may include the first and fourth external signal lines FOL1 and FOL4 spaced apart from each other.

The second barrier insulating film BIL2 may be disposed on the first barrier insulating film BIL1 on which the lower conductive layer 110 is disposed. The second barrier insulating film BIL2 may have a hole defined therein exposing a portion of a top surface of the first external signal line FOL1.

The second substrate SUB2 may be disposed on the second barrier insulating film BIL2. The second substrate SUB2 may have a hole extending through the second substrate SUB2 to expose a portion of a top surface of the first external signal line FOL1. The hole defined in the second substrate SUB2 to expose the portion of the top surface of the first external signal line FOL1 may overlap a hole defined in the second barrier insulating film BIL2.

The third barrier insulating film BIL3 may be disposed on the second substrate SUB2. The third barrier insulating film BIL3 may be disposed to cover or overlap a top surface and a sidewall defining the hole of the second substrate SUB2. The second substrate SUB2 may be sealed with the second barrier insulating film BIL2 and the third barrier insulating film BIL3.

In one example, the second barrier insulating film BIL2, the second substrate SUB2, and the third barrier insulating film BIL3 may receive therein the second contact hole CNT2 extending through the second barrier insulating film BIL2, the second substrate SUB2 and the third barrier insulating film BIL3. The second contact hole CNT2 may overlap one end of the first external signal line FOL1 in a plan view, and may expose a portion of the top surface of the first external signal line FOL1.

The lower metal layer 120 may be disposed on the third barrier insulating film BIL3. The lower metal layer 120 may include the first lower connection pattern CWP1, the first data line DL1, and the third data line DL3.

The first lower connection pattern CWP1 may be disposed on the third barrier insulating film BIL3 overlapping the top surface of the second substrate SUB2 and a sidewall of the second substrate SUB2 defining the second contact hole CNT2. The first lower connection pattern CWP1 may be connected to the top surface of the first external signal line FOL1 via the second contact hole CNT2.

The first data line DL1 and the third data line DL3 may be disposed on the third barrier insulating film BIL3 overlapping the top surface of the second substrate SUB2.

The buffer layer BF may be disposed on the lower metal layer 120. The buffer layer BF may include a third contact hole CNT37_FL1 exposing a portion of the first lower connection pattern CWP1 and a third contact hole CNT38_FL1 exposing a portion of the third data line DL3.

The gate insulating layer GI may be disposed on the buffer layer BF. The gate insulating layer GI may include a first area GI_A, a second area GI_B, and a third area GI_C adjacent to the second contact hole CNT2. The first area GI_A of the gate insulating layer GI may be disposed to cover or overlap the first data line DL1 and the third data line DL3. The second area GI_B of the gate insulating layer GI may be disposed between the second voltage line VSL and the second contact hole CNT2 in a plan view. The third area GI_C of the gate insulating layer GI may be disposed in an area defined by the second contact hole CNT2.

The interlayer insulating layer ILD may be disposed on the gate insulating layer GI. The interlayer insulating layer ILD may include a first area ILD_A, a second area ILD_B, and a third area ILD_C adjacent to the second contact hole CNT2.

The first area ILD_A of the interlayer insulating layer ILD may overlap the first area GI_A of the gate insulating layer GI. The second area ILD_B of the interlayer insulating layer ILD may overlap the second area GI_B of the gate insulating layer GI. The third area ILD_C of the interlayer insulating layer ILD may overlap the third area GI_C of the gate insulating layer GI.

The first area ILD_A of the interlayer insulating layer ILD and the first area GI_A of the gate insulating layer GI together with the buffer layer BF may receive therein the third contact hole CNT38_FL1 exposing a portion of the third data line DL3.

The second area ILD_B of the interlayer insulating layer ILD and the second area GI_B of the gate insulating layer GI may constitute the dam pattern DAM. Therefore, a vertical dimension d3 of the dam pattern DAM may be equal to a sum of a thickness d1 of the gate insulating layer GI and a thickness d2 of the interlayer insulating layer ILD. The dam pattern DAM may be formed by patterning a portion of the gate insulating layer GI and a portion of the interlayer insulating layer ILD, such that the dam pattern DAM may have the predefined vertical dimension d3. The dam pattern DAM may act to adjust a thickness of a photoresist layer used in a process of patterning the second conductive layer 150 as described later, thereby preventing a short circuit between the second voltage line VSL and the first connection pattern FCNL1 which may otherwise occur due to a portion of the photoresist layer that may remain in an area defined by the second contact hole CNT2 extending through the second substrate SUB2.

The third area ILD_C of the interlayer insulating layer ILD and the third area GI_C of the gate insulating layer GI may be disposed in an area defined by the second contact hole CTN2. The third area ILD_C of the interlayer insulating layer ILD and the third area GI_C of the gate insulating layer GI may be surrounded with the sidewall of the second substrate SUB2.

In this embodiment, in case that the dam pattern DAM is formed by patterning the interlayer insulating layer ILD_B and the gate insulating layer GI_B, a process of forming an additional layer may be omitted so that efficiency of the manufacturing process of the sub-display device 10 may be improved.

The second conductive layer 150 may be disposed on the buffer layer BF on which the interlayer insulating layer ILD_B and the gate insulating layer GI_B are formed. The second conductive layer 150 may include the second voltage line VSL and the first upper connection pattern FCNP1. In one embodiment, the second voltage line VSL and the first upper connection pattern FCNP1 may constitute a same layer and may be made of the same material or a similar material. Further, the second voltage line VSL and the first upper connection pattern FCNP1 may be formed using one mask process.

The second voltage line VSL may be disposed adjacent to an upper side of the dam pattern DAM. The second voltage line VSL may be disposed on the buffer layer BF. The disclosure is not limited thereto. The second voltage line VSL may be disposed on or directly disposed on a top surface of the buffer layer BF. In case that the second voltage line VSL is spaced apart from the dam pattern DAM, the second voltage line VSL may not overlap the interlayer insulating layer ILD and the gate insulating layer GI in the third direction DR3.

The first upper connection pattern FCNP1 may be disposed adjacent to a lower side of the dam pattern DAM. The first upper connection pattern FCNP1 may extend from an area thereof overlapping the second contact hole CNT2 to an area thereof on which the third data line DL3 is disposed.

The first dummy pattern DMP1 may overlap the second contact hole CNT2. A portion of the first dummy pattern DMP1 overlapping the second contact hole CNT2 may overlap the third area ILD_C of the interlayer insulating layer ILD. A portion of the first dummy pattern DMP1 adjacent to the second contact hole CNT2 may be disposed on a portion of the buffer layer BF exposed through the third area ILD_C of the interlayer insulating layer ILD.

The first connection line FCNL1 may extend from and be monolithic with the first dummy pattern DMP1. The first connection line FCNL1 may be connected to the first lower connection pattern CWP1 exposed through the third contact hole CNT37_FL1 extending through the buffer layer BF. Further, the first connection line FCNL1 may be connected to the third data line DL3 exposed through the third contact hole CNT38_FL1 extending through the first area ILD_A of the interlayer insulating layer ILD, the first area GI_A of the gate insulating layer GI, and the buffer layer BF.

The first external signal line FOL1 may be connected to the first connection line FCNL1 via the first lower connection pattern CWP1, and may transmit a data signal to the third data line DL1 via the first connection line FCNL1.

In case that the second voltage line VSL and the first connection line FCNL1 are spaced apart from each other while the dam pattern DAM is disposed therebetween, a short circuit between the connection line FCNL which transmits the data signal to the data line DL and the second voltage line VSL may be prevented during the manufacturing process of the sub-display device 10.

FIG. 12 is a schematic cross-sectional view showing one example cut along a II-IF line of FIG. 7 to FIG. 9.

In FIG. 7 to FIG. 9, the sub-display device 10 may further include fourth transistors TFT1. The fourth transistors TFT1 may be disposed adjacent to a lower side of the lower connection pattern CWP in a plan view. For example, the fourth transistors TFT1 may be respectively disposed adjacent to lower sides of the first to fourth lower connection patterns CWP1, CWP2, CWP3, and CWP4 in a plan view. In one example, FIG. 12 shows a fourth transistor TFT1 disposed adjacent to a lower side of the first lower connection pattern CWP1 among the fourth transistors TFT1.

Referring to FIG. 7 to FIG. 9 and FIG. 12, the buffer layer BF may be disposed on the third barrier insulating film BIL3 on which the first lower connection pattern CWP1 is disposed. The buffer layer BF may receive therein the contact hole CNT37_FL1 exposing a portion of a top surface of the first lower connection pattern CWP1.

The fourth transistor TFT1 may be disposed on the buffer layer BF in a schematic cross sectional view and may be disposed adjacent to a lower side of the first lower connection pattern CWP1 in a plan view. The fourth transistor TFT1 may be electrically connected to and disposed between the external signal line FOL (the first external signal line FOL1 in the drawing) and the horizontal voltage line HVDL.

The fourth transistor TFT1 may include the semiconductor pattern ACT4-FL1, the gate electrode GP2_FL1, the drain electrode AVE11, and the source electrode AVE12. In accordance with the disclosure, the gate electrode GP2_FL1 of the fourth transistor TFT1 may be referred to as a second gate pattern GP2_FL1, the drain electrode AVE11 of the fourth transistor TFT1 may be referred to as the first auxiliary electrode AVE11, and the source electrode AVE12 of the fourth transistor TFT1 may be referred to as the second auxiliary electrode AVE12.

The semiconductor pattern ACT4-FL1 of the fourth transistor TFT1 may be disposed on the buffer layer BF. The semiconductor pattern ACT4-FL1 of the fourth transistor TFT1 may be disposed on the semiconductor layer 130.

The gate insulating layer GI may be disposed on the buffer layer BF on which the semiconductor pattern ACT4-FL1 of the fourth transistor TFT1 is disposed. The gate insulating layer GI together with the buffer layer BF may expose a portion of a top surface of the first lower connection pattern CWP1.

The gate electrode GP2_FL1 of the fourth transistor TFT1 may be disposed on the gate insulating layer GI. The gate electrode GP2_FL1 of the fourth transistor TFT1 may overlap a portion of the semiconductor pattern ACT4-FL1 of the fourth transistor TFT1. The gate electrode GP2_FL1 of the fourth transistor TFT1 may be disposed on the first conductive layer 140.

The interlayer insulating layer ILD may be disposed on the gate insulating layer GI on which the gate electrode GP2_FL1 of the fourth transistor TFT1 is disposed. The interlayer insulating layer ILD together with the buffer layer BF and the gate insulating layer GI may expose the portion of the top surface of the first lower connection pattern CWP1.

The drain electrode AVE11 and the source electrode AVE12 of the fourth transistor TFT1 may be disposed on the interlayer insulating layer ILD. The drain electrode AVE11 and the source electrode AVE12 of the fourth transistor TFT1 may be spaced apart from each other. The drain electrode AVE11 and the source electrode AVE12 of the fourth transistor TFT1 may be disposed on the second conductive layer 150.

The drain electrode AVE11 of the fourth transistor TFT1 may overlap one end of the semiconductor pattern ACT4-FL1 of the fourth transistor TFT1. The drain electrode AVE11 of the fourth transistor TFT1 may be electrically connected to one end of the fourth transistor TFT1 via the contact hole CNT57 extending through the interlayer insulating layer ILD and the gate insulating layer GI.

The drain electrode AVE11 of the fourth transistor TFT1 may be monolithic with the first connection line FCNL1 to form a single pattern. For example, the drain electrode AVE11 of the fourth transistor TFT1 may be a partial area of the first upper connection pattern FCNP1. The first connection line FCNL1 may be electrically connected to the first lower connection pattern CWP1 via the contact hole CNT37_FL1 extending through the buffer layer BF. The drain electrode AVE11 of the fourth transistor TFT1 may be electrically connected to the first lower connection pattern CWP1 via the first connection line FCNL1. Accordingly, the drain electrode AVE11 of the fourth transistor TFT1 may be electrically connected to the first external signal line FOL1 via the first connection line FCNL1 and the first lower connection pattern CWP1. Accordingly, the external signal line FOL and the fourth transistor TFT1 may be electrically connected to each other via the drain electrode AVE11 of the fourth transistor TFT1.

The source electrode AVE12 of the fourth transistor TFT1 may overlap the opposite end of the semiconductor pattern ACT4-FL1 of the fourth transistor TFT1. The source electrode AVE12 of the fourth transistor TFT1 may be electrically connected to the opposite end of the fourth transistor TFT1 via the contact hole CNT58 extending through the interlayer insulating layer ILD and the gate insulating layer GI.

The source electrode AVE12 of the fourth transistor TFT1 may be monolithic with the horizontal voltage line HVDL. Accordingly, the source electrode AVE12 of the fourth transistor TFT1 may be connected to the horizontal voltage line HVDL. Accordingly, the horizontal voltage line HVDL and the fourth transistor TFT1 may be electrically connected to each other via the source electrode AVE12 of the fourth transistor TFT1.

The fourth transistor TFT1 may be connected to and disposed between the external signal line FOL and the horizontal voltage line HVDL. Thus in case that overvoltage or overcurrent is applied to the external signal line FOL, the fourth transistor TFT1 may serve to remove the overvoltage or overcurrent. For example, the fourth transistor TFT1 may be connected to and disposed between the first external signal line FOL1 electrically connected to the third data line DL3 and the horizontal voltage line HVDL, so that even in case that overvoltage or overcurrent is applied to the first external signal line FOL1, the fourth transistor TFT1 may disallow the overvoltage or overcurrent to flow in the third data line DL3.

Figure 13:
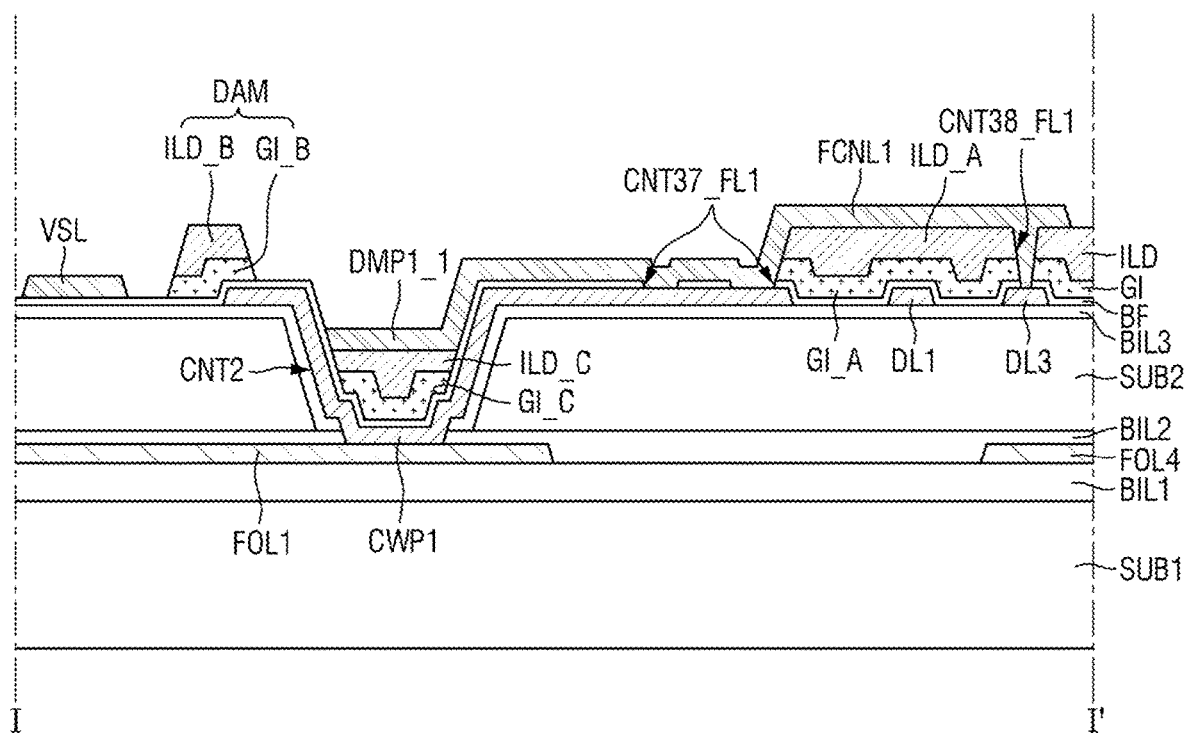
FIG. 13 is a schematic cross-sectional view showing another example cut along line I-I' in FIG. 10.

FIG. 13 is a schematic cross-sectional view showing another example cut along the line I-I' in FIG. 10.

Referring to FIG. 13, this embodiment is different from the embodiment in FIG. 11 in that the first dummy pattern DMP1_1 is disposed in an area defined by the second contact hole CNT2.

For example, the first dummy pattern DMP1_1 may be disposed on the sidewall of the buffer layer BF overlapping the second contact hole CNT2 and in an area adjacent to the dam pattern DAM and may not be disposed on the top surface of the buffer layer BF. For example, the first dummy pattern DMP1_1 may overlap the second contact hole CNT2 and may be disposed in an area defined by the second contact hole CNT2.

This embodiment may be realized in a patterning process of the second conductive layer 150 for forming the second voltage line VSL and the first connection line FCNL1 during the manufacturing process of the sub-display device 10 to be described later. For example, the photoresist layer used in the patterning process of the second conductive layer 150 may remain in the second contact hole CNT2 due to a step formed by the second contact hole CNT2, such that the first dummy pattern DMP1_1 may be formed in an area overlapping the second contact hole CNT2.

In one example, in this embodiment, the first dummy pattern DMP1_1 and the second voltage line VSL may be spaced apart from each other while the dam pattern DAM is disposed therebetween. The first dummy pattern DMP1_1 may be disposed only inside the second contact hole CNT2. Thus, the second voltage line VSL and the first upper connection pattern FCNP1_1 may be disconnected from each other in a reliable manner. Accordingly, reliability of the manufacturing process of the sub-display device 10 may be improved.

Figure 14:
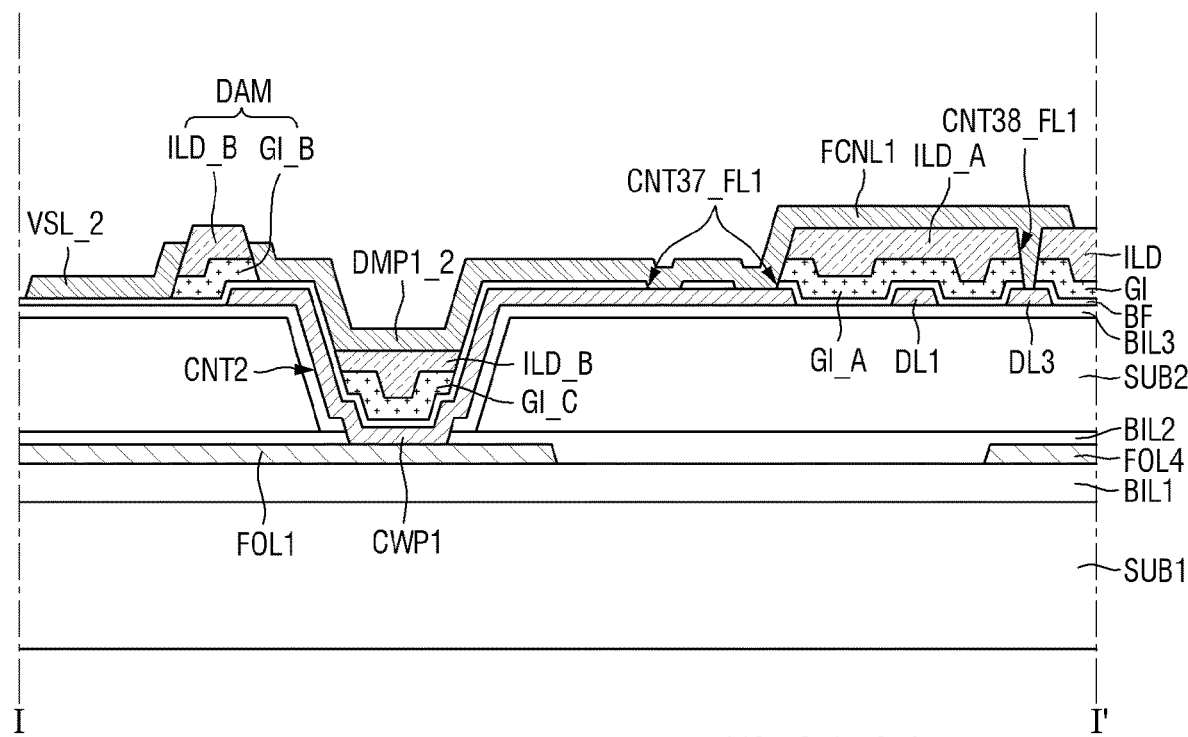
FIG. 14 is a schematic cross-sectional view showing another example cut along the line I-I' in FIG. 10.

FIG. 14 is a schematic cross-sectional view showing another example cut along the line I-I' in FIG. 10.

Referring to FIG. 14, this embodiment differs from the embodiment in FIG. 11 in that the first dummy pattern DMP1_2 and the second voltage line VSL_2 extend toward the dam pattern DAM and are partially disposed on a sidewall of the dam pattern DAM. The second upper connection pattern FCNP_2 may also include the first dummy pattern DMP1_2 and the first connection line FCNL1.

For example, the second voltage line VSL_2 may extend on and along the buffer layer BF and toward the dam pattern DAM, and may partially be disposed on one sidewall or a sidewall of the dam pattern DAM. A portion of the second voltage line VSL_2 may also be disposed on one sidewall of the gate insulating layer GI_B and one sidewall of the interlayer insulating layer ILD_B constituting one sidewall of the dam pattern DAM.

The second voltage line VSL_2 may not be disposed on the top surface of the dam pattern DAM. The second voltage line VSL_2 may not be disposed on a top surface of the interlayer insulating layer ILD_B constituting the top surface of the dam pattern DAM.

The first dummy pattern DMP1_2 may be disposed to be spaced apart from the second voltage line VSL_2 while the dam pattern DAM is interposed therebetween. The first dummy pattern DMP1_2 may extend on and along the buffer layer and toward the dam pattern DAM and may be partially disposed on the opposite sidewall of the dam pattern DAM. The first dummy pattern DMP1_2 may be partially disposed on the opposite sidewall of the gate insulating layer GI_B and the opposite sidewall of the interlayer insulating layer ILD_B constituting the opposite sidewall of the dam pattern DAM.

The first dummy pattern DMP1_2 may not be disposed on the top surface of the dam pattern DAM. The first dummy pattern DMP1_2 may not be disposed on a top surface of the interlayer insulating layer ILD_B constituting the top surface of the dam pattern DAM.

This embodiment may be realized in a patterning process of the second conductive layer 150 for forming the second voltage line VSL_2 and the first connection line FCNL1 during the manufacturing process of the sub-display device 10 to be described later. For example, in the patterning process of the second conductive layer 150, the dam pattern DAM having a predefined vertical dimension may be disposed in an area adjacent to the second contact hole CNT2, so that a thickness of the photoresist layer used in the patterning process of the second conductive layer 150 may be adjusted. Accordingly, a portion of the second conductive layer disposed on the top surface of the dam pattern DAM may be reliably removed, thereby preventing the second voltage line VSL and the first upper connection pattern FCNP1 from being short-circuited with each other.

Figure 15:
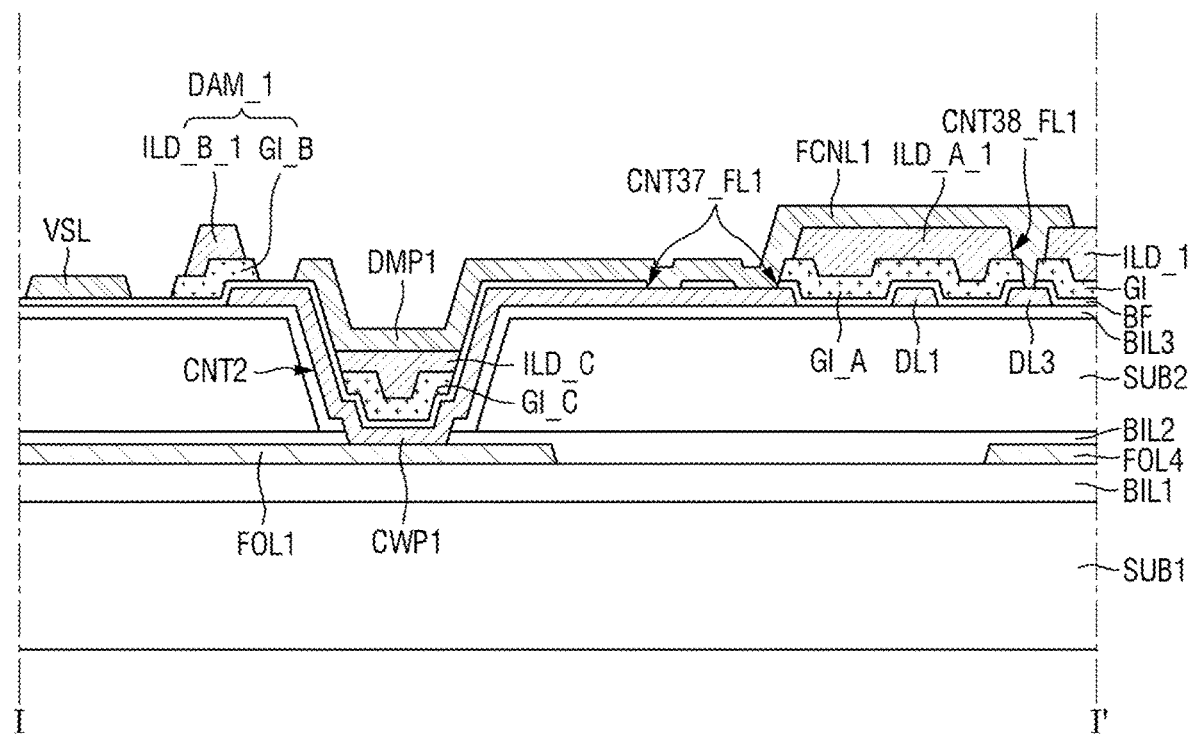
FIG. 15 is a schematic cross-sectional view showing another example cut along the line I-I' in FIG. 10.

FIG. 15 is a schematic cross-sectional view showing another example cut along the line I-I' in FIG. 10.

Referring to FIG. 15, this embodiment differs from the embodiment in FIG. 11 in that the sidewall of the interlayer insulating layer ILD_1 is disposed inwardly of the sidewall of the gate insulating layer GI.

For example, the interlayer insulating layer ILD_1 disposed on the gate insulating layer GI may be disposed on the top surface of the gate insulating layer GI. The interlayer insulating layer ILD_1 may be disposed on the top surface of the gate insulating layer GI to expose a portion of the top surface of the gate insulating layer GI. Therefore, the sidewall of the interlayer insulating layer ILD_1 may be disposed inwardly of the sidewall of the gate insulating layer GI.

A sidewall of the interlayer insulating layer ILD_A 1 defining the contact hole CNT38_FL1 connecting the first connection line FCNL1 and the third data line DL3 to each other and the sidewall of the gate insulating layer GI_A may not be aligned with each other. For example, the sidewall of the interlayer insulating layer ILD_A 1 defining the contact hole CNT38_FL1 may be disposed inwardly of the sidewall of the gate insulating layer GI_A defining the contact hole CNT38_FL1.

Further, the sidewall of the interlayer insulating layer ILD_B_1 and the sidewall of the gate insulating layer GI_B constituting the dam pattern DAM_1 may not be aligned with each other. For example, the sidewall of the interlayer insulating layer ILD_B_1 constituting the dam pattern DAM_1 may be disposed inwardly of the sidewall of the gate insulating layer GI_B constituting the dam pattern DAM_1. Accordingly, the interlayer insulating layer ILD_B_1 constituting the dam pattern DAM_1 may expose a portion of the top surface of the gate insulating layer GI_B.

This embodiment may be achieved by separately forming the gate insulating layer GI and the interlayer insulating layer ILD_1 including the dam pattern DAM_1 and the contact holes, during the manufacturing process of the sub-display device 10.

Figure 16:
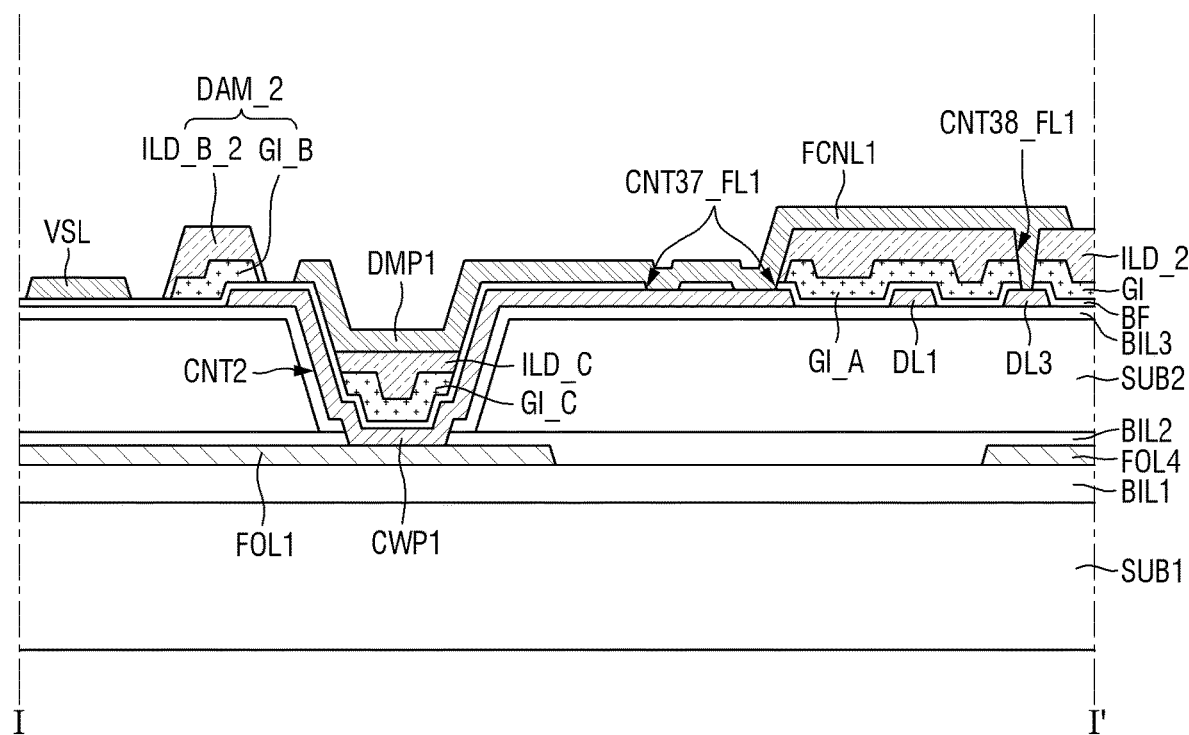
FIG. 16 is a schematic cross-sectional view showing another example cut along the line I-I' in FIG. 10.

FIG. 16 is a schematic cross-sectional view showing another example cut along the line I-I' in FIG. 10.

Referring to FIG. 16, this embodiment is different from the embodiment in FIG. 11 in that the sidewall of the interlayer insulating layer ILD_2 is disposed outwardly of the sidewall of the gate insulating layer GI.

For example, the interlayer insulating layer ILD_2 disposed on the gate insulating layer GI may be disposed to cover or overlap the top surface and the sidewall of the gate insulating layer GI. Accordingly, the sidewall of the interlayer insulating layer ILD_2 may be disposed outwardly of the sidewall of the gate insulating layer GI.

The sidewall of the interlayer insulating layer ILD_B 2 and the sidewall of the gate insulating layer GI_B constituting the dam pattern DAM_2 may not be aligned with each other. For example, the sidewall of the interlayer insulating layer ILD_B_2 constituting the dam pattern DAM_2 may be disposed outwardly of the sidewall of the gate insulating layer GI_B constituting the dam pattern DAM_2. Accordingly, the interlayer insulating layer ILD_B_2 constituting the dam pattern DAM_2 may cover or overlap the top surface and the sidewall of the gate insulating layer GI_B, and may constitute the sidewall of the dam pattern DAM_2.

Figure 17:
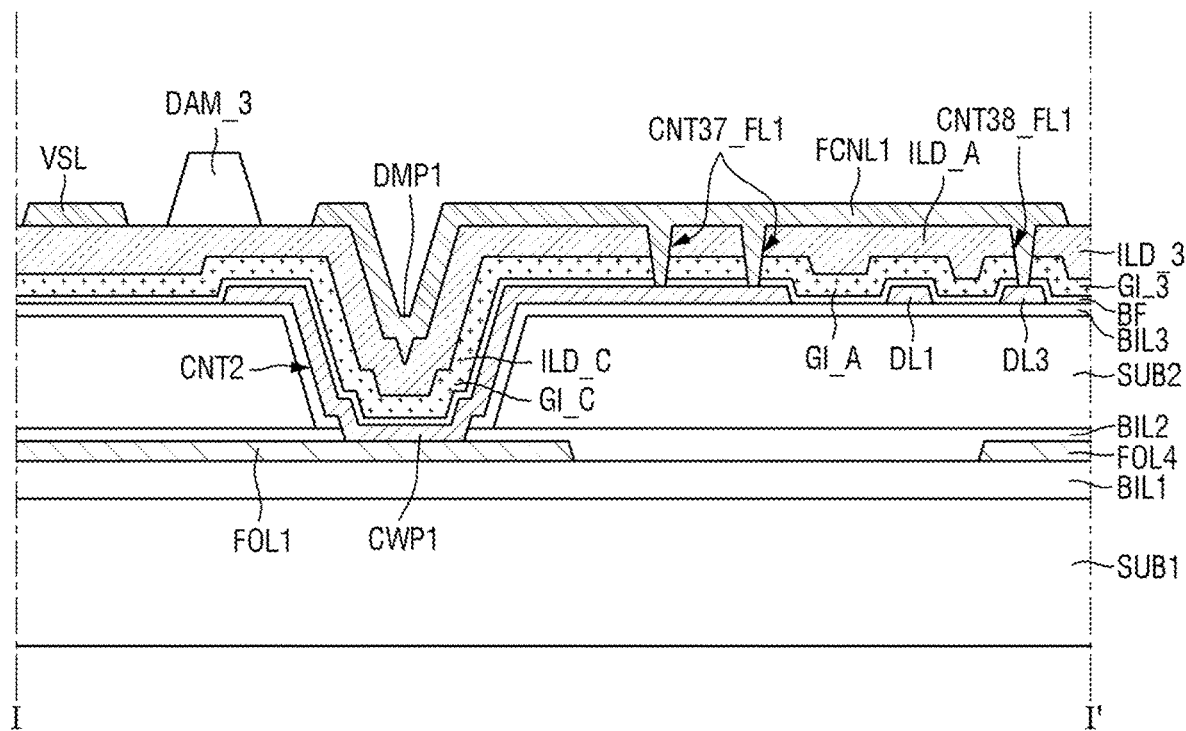
FIG. 17 is a schematic cross-sectional view showing another example cut along the I-I' line in FIG. 10.

FIG. 17 is a schematic cross-sectional view showing another example cut along the I-I' line in FIG. 10.

Referring to FIG. 17, this embodiment is different from the embodiment in FIG. 11 in that in this embodiment, each of the gate insulating layer GI_3 and the interlayer insulating layer ILD_3 may be disposed over an entire area of the substrate SUB1, and the dam pattern DAM_3 is composed of a separate layer from the gate insulating layer GI_3 and the interlayer insulating layer ILD 3.

For example, the gate insulating layer GI_3 may be disposed over the entire area of the substrate SUB1 and on the buffer layer BF. The interlayer insulating layer ILD_3 may be disposed over the entire area of the substrate SUB1 and on the gate insulating layer GI 3.

The second conductive layer 150 may be disposed on the interlayer insulating layer ILD 3. The second conductive layer 150 may include the second voltage line VSL and the first upper connection pattern FCNP1. The second voltage line VSL and the first upper connection pattern FCNP1 may be spaced apart from each other and may be disposed on the interlayer insulating layer ILD 3.

The first upper connection pattern FCNP1 may include the first dummy pattern DMP1 and the first connection line FCNL1. The first dummy pattern DMP1 may be disposed on a portion of each of the gate insulating layer GI_3 and the interlayer insulating layer ILD_3 overlapping the second contact hole CNT2. The first connection line FCNL1 may extend from the first dummy pattern DMP1 and may overlap a portion of the first lower connection pattern CWP1, and the first and third data lines DL1 and DL3.

The first connection line FCNL1 may be electrically connected to the first lower connection pattern CWP1 via the contact hole CNT37_FL1 extending through the interlayer insulating layer ILD_3 and the gate insulating layer GI_3, and the buffer layer BF. The first connection line FCNL1 may be electrically connected to the third data line DL3 via the contact hole CNT38_FL1 extending through the interlayer insulating layer ILD_3, the gate insulating layer GI_3, and the buffer layer BF.

The second voltage line VSL may be disposed to be spaced apart from the first upper connection pattern FCNP1. The second voltage line VSL may be disposed on the interlayer insulating layer ILD_3.

The dam pattern DAM_3 may be disposed on the top surface of the interlayer insulating layer ILD_3. The dam pattern DAM_3 may be disposed between the second voltage line VSL and the first upper connection pattern FCNP1. For example, the second voltage line VSL and the first upper connection pattern FCNP1 may be spaced apart from each other while the dam pattern DAM_3 is interposed therebetween. The dam pattern DAM_3 may be located or disposed in an area adjacent to the second contact hole CNT2.

The dam pattern DAM_3 may have a shape protruding upwards from the top surface of the interlayer insulating layer ILD_3. For example, the dam pattern DAM_3 may be formed to have a predefined thickness. The thickness of the dam pattern DAM_3 may be greater than a thickness of the second conductive layer 150. The dam pattern DAM_3 may serve to adjust the thickness of the photoresist layer so that the second voltage line VSL and the first upper connection pattern FCNP1 (or upper connection pattern FCNP) are reliably disconnected from each other in the patterning process of the second conductive layer 150 during the manufacturing process of the sub-display device 10 to be described later.

The dam pattern DAM_3 may include an insulating material. For example, the dam pattern DAM_3 may include an organic insulating material or an inorganic insulating material. In an example, the dam pattern DAM_3 may include an organic material such as polyimide (PI). The disclosure is not limited thereto.

The dam pattern DAM_3 may be formed after a process of forming the interlayer insulating layer ILD_3 and before the process of patterning the second conductive layer 150. An additional process for forming the dam pattern DAM_3 may be performed. However, because each of the gate insulating layer GI_3 and the interlayer insulating layer ILD_3 are disposed over the entire area of the substrate SUB1, insulating between or protection of the lower conductive layer and the second conductive layer 150 may be readily realized.

Figure 18:
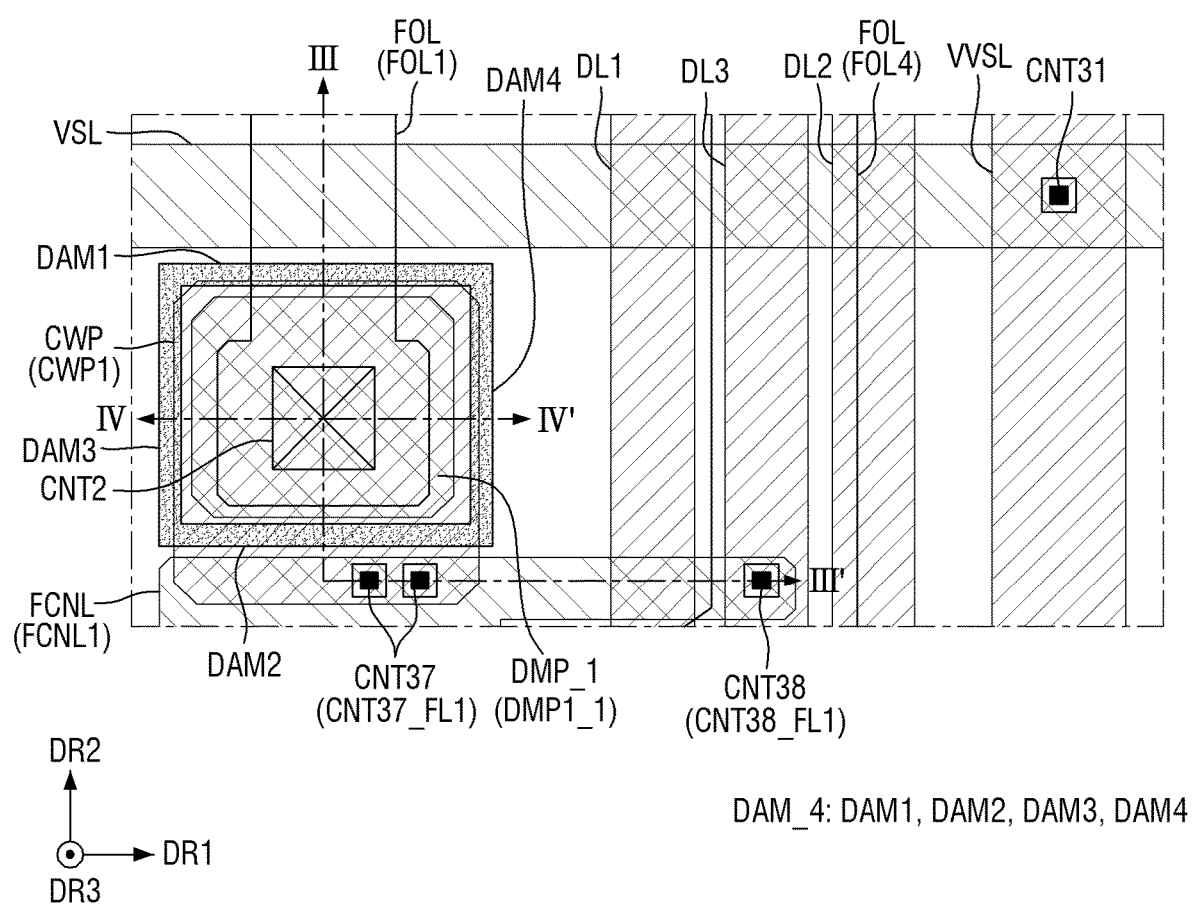
FIG. 18 is a planar layout diagram showing another enlarged example of an area C of FIG. 7.
Figure 19:
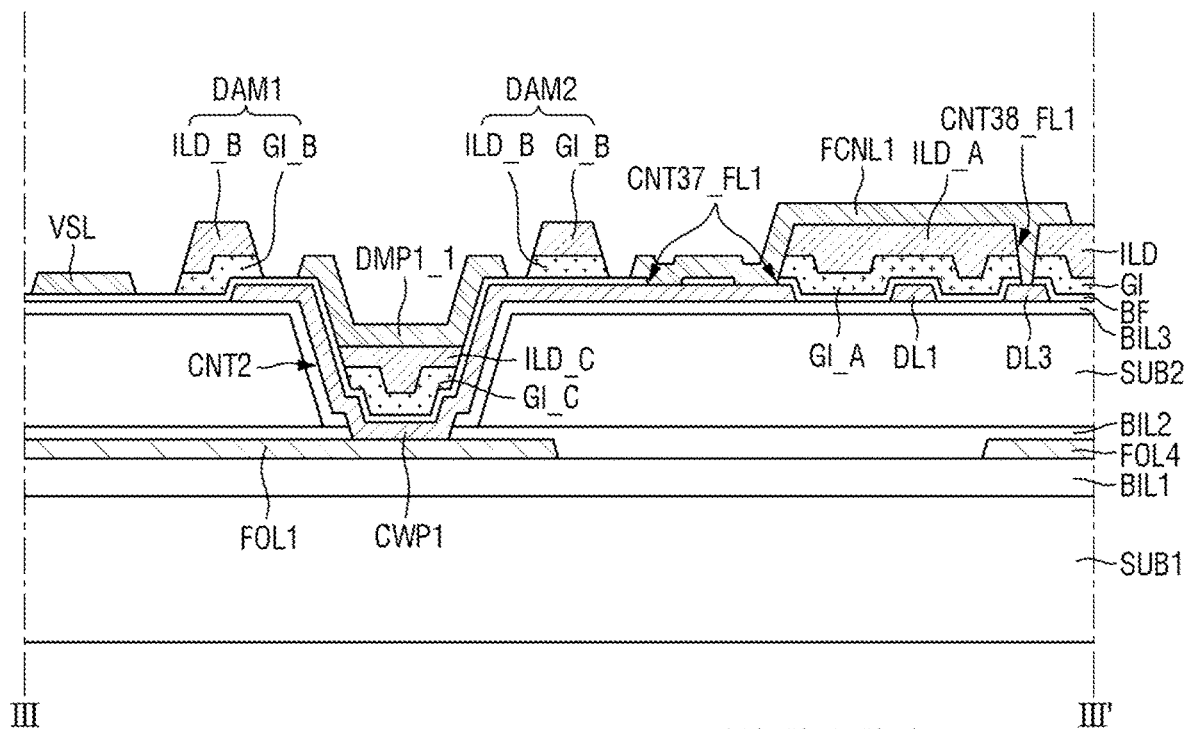
FIG. 19 is a schematic cross-sectional view showing one example cut along line III-III' of FIG. 18.
Figure 20:
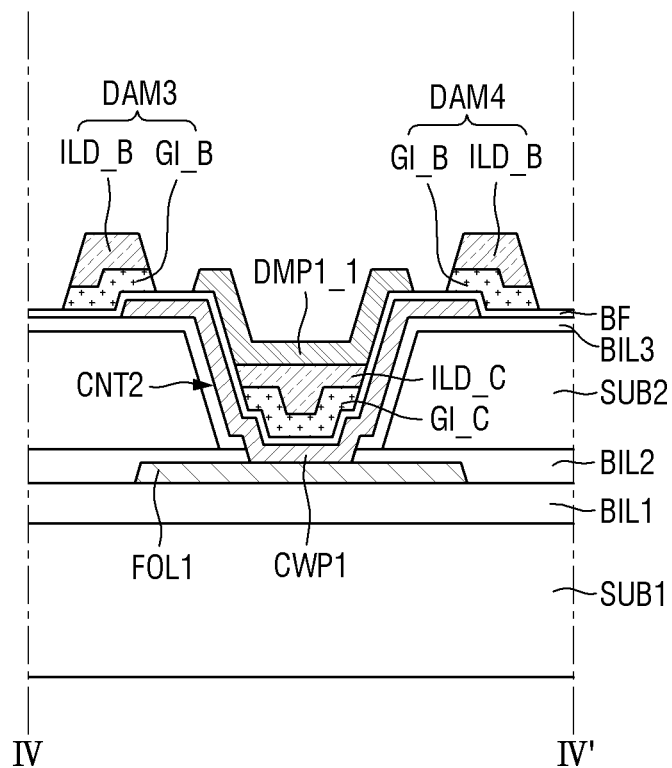
FIG. 20 is a schematic cross-sectional view showing one example cut along IV-IV' line of FIG. 18.

FIG. 18 is a planar layout diagram showing another enlarged example of an area C of FIG. 7. FIG. 19 is a schematic cross-sectional view showing one example cut along line of FIG. 18. FIG. 20 is a schematic cross-sectional view showing one example cut along IV-IV' line of FIG. 18.

Referring to FIG. 18 to FIG. 20, this embodiment is different from the embodiments in FIG. 10 and FIG. 11 in that the dam pattern DAM_4 is disposed to surround the second contact hole CNT2 and in an area adjacent to the second contact hole CNT2 in a plan view.

For example, the dam pattern DAM_4 may be disposed to surround the second contact hole CNT2 which the external signal line FOL and the lower connection pattern CWP contact. The dam pattern DAM_4 may have a closed loop shape to surround the second contact hole CNT2. The dam pattern DAM4 may include first to fourth dam patterns DAM1, DAM2, DAM3, and DAM4. The first to fourth dam patterns DAM1, DAM2, DAM3, and DAM4 may respectively constitute first to fourth sides of the dam pattern DAM_4. For example, the first dam pattern DAM1 may constitute an upper side of the dam pattern DAM4, the second dam pattern DAM2 may constitute a lower side of the dam pattern DAM4, the third dam pattern DAM1 may constitute a left side of the dam pattern DAM4, and the fourth dam pattern DAM4 may constitute a right side of the dam pattern DAM_4.

The second voltage line VSL may be disposed adjacent to an upper side of the dam pattern DAM_4. The first connection line FCNL1 may be disposed adjacent to a lower side of the dam pattern DAM4. The second voltage line VSL and the first connection line FCNL1 may be disposed to be spaced apart from each other while the dam pattern DAM_4 is interposed therebetween. For example, the second voltage line VSL may be spaced apart from the upper side of the first dam pattern DAM1 of the dam pattern DAM4. The first connection line FCNL1 may be spaced apart from a lower side of the second dam pattern DAM2 of the dam pattern DAM4.

The first connection line FCNL1 may overlap a portion of the first lower connection pattern CWP1 and a portion of the third data line DL3 in the third direction DR3. One portion of the first connection line FCNL1 may be electrically connected to the first lower connection pattern CWP1 via the contact hole CNT37_FL1 extending through the buffer layer BF. The other portion of the first connection line FCNL1 may be electrically connected to the third data line DL3 via the contact hole CNT38 extending through the interlayer insulating layer ILD, the gate insulating layer GI, and the buffer layer BF.

In this embodiment, the first dummy pattern DMP1_1 may be disposed in an area defined by the dam pattern DAM4. The first dummy pattern DMP1_1 may be disposed in an inner area defined by the first to fourth dam patterns DAM1, DAM2, DAM3, and DAM4 of the dam pattern DAM_4 and may overlap the second contact hole CNT2 in the third direction DR3. The first dummy pattern DMP1_1 may be formed as an island pattern and within the inner area defined by the first to fourth dam patterns DAM1, DAM2, DAM3, and DAM4 of the dam pattern DAM4.

In case that the first dummy pattern DMP1_1 is disposed in the area defined by the dam pattern DAM4, the first dummy pattern DMP1_1 may be spaced apart from each of the second voltage line VSL and the first connection line FCNL1 while the dam pattern DAM_4 is interposed therebetween. For example, the first dummy pattern DMP1_1 may be spaced apart from the second voltage line VSL in the second direction DR2 while the first dam pattern DAM1 of the dam pattern DAM_4 is interposed therebetween and may be spaced apart from the first connection line FCNL1 in the second direction DR2 with the second dam pattern DAM2 of the dam pattern DAM_4 is interposed therebetween. Accordingly, the first dummy pattern DMP1_1 and the first connection line FCNL1 may be spaced apart from each other and thus constitute separate patterns, respectively.

The second voltage line VSL, the first connection line FCNL1, and the first dummy pattern DMP1_1 may be made of the same material or a similar material and may constitute a same layer. For example, the second voltage line VSL, the first connection line FCNL1, and the first dummy pattern DMP1_1 may be composed of the second conductive layer 150.

The first dummy pattern DMP1_1 may overlap a portion of the first lower connection pattern CWP1 in the third direction DR3. The buffer layer BF, the gate insulating layer GI_C, and the interlayer insulating layer ILD_C may be interposed between the first dummy pattern DMP1_1 and the first lower connection pattern CWP1. Further, the first dummy pattern DMP1_1 and the first connection pattern FCNL1 may be constitute the separate patterns, respectively. Thus, the dummy pattern DMP_1 and the first lower connection pattern CWP1 may be electrically insulated from each other.

Figure 21:
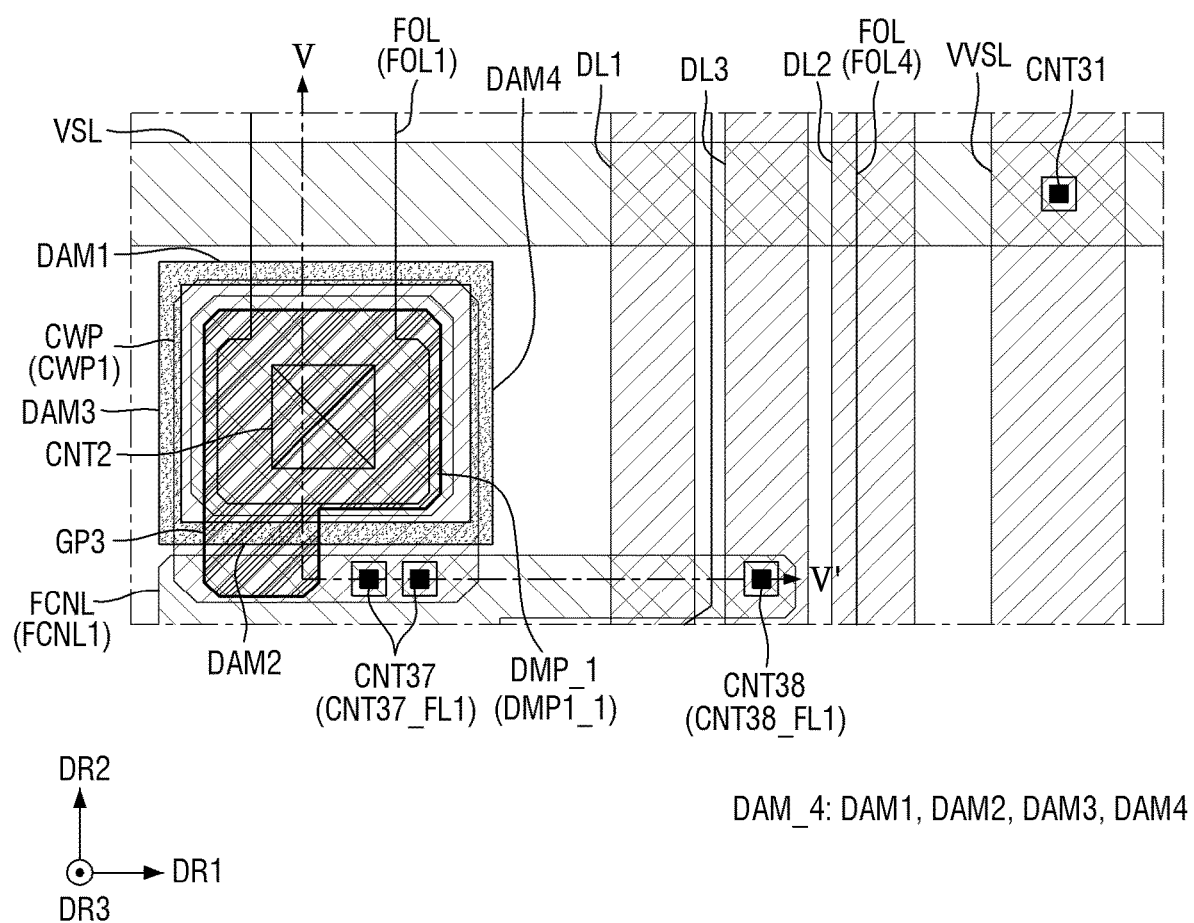
FIG. 21 is a planar layout diagram showing another enlarged example of the area C of FIG. 7.
Figure 22:
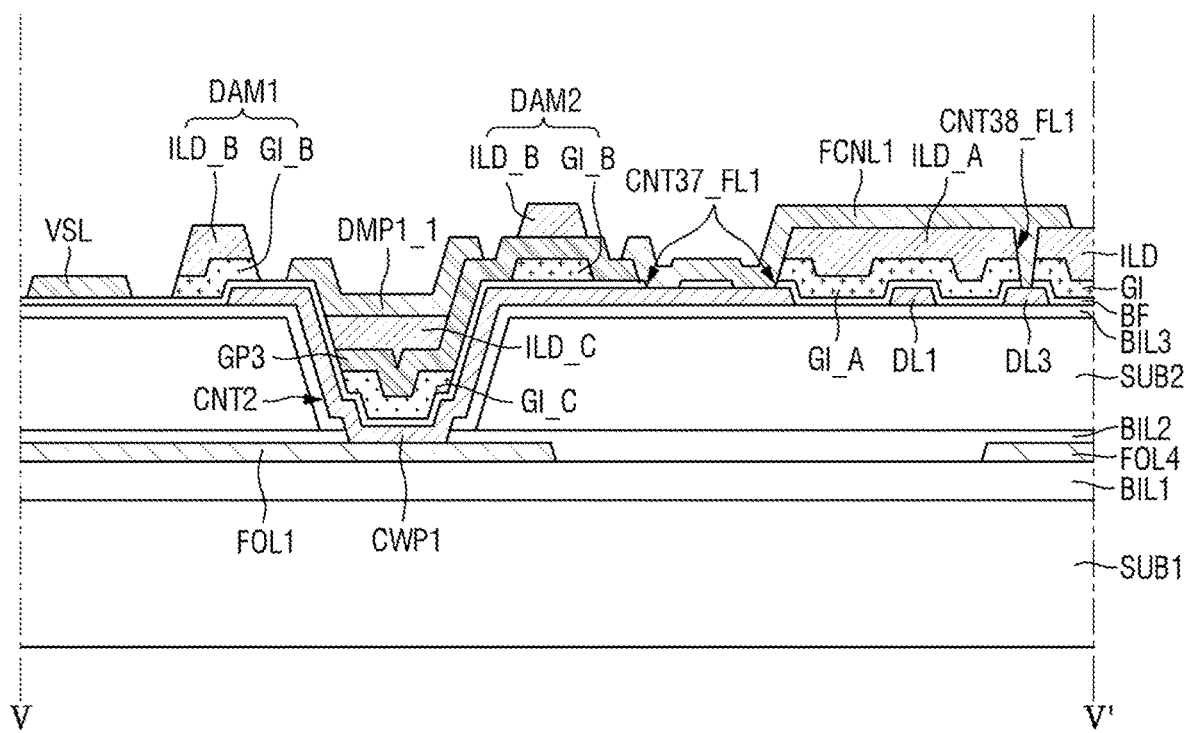
FIG. 22 is a schematic cross-sectional view showing one example cut along a V-V' line in FIG. 21.

FIG. 21 is a planar layout diagram showing another enlarged example of the area C of FIG. 7. FIG. 22 is a schematic cross-sectional view showing one example cut along a V-V' line in FIG. 21.

Referring to FIG. 21 and FIG. 22, this embodiment is different from the embodiment in FIG. 18 and FIG. 19 in that this embodiment further may include a third gate pattern GP3 disposed on the gate insulating layer GI, and composed of the first conductive layer 140.

For example, the first conductive layer 140 may further include the third gate pattern GP3. One partial area of the third gate pattern GP3 may overlap the lower connection pattern CWP (for example, the first lower connection pattern CWP1) in the third direction DR3, while the other partial area of the third gate pattern GP3 may overlap the first connection line FCNL1 in the third direction DR3.

The third gate pattern GP3 may be composed of the first conductive layer 140 and may be disposed on the gate insulating layer GI. The third gate pattern GP3 may extend downward from an area defined by the dam pattern DAM4. Accordingly, the third gate pattern GP3 may cover or overlap the gate insulating layer GI_B constituting the second dam pattern DAM2.

The interlayer insulating layer ILD may be disposed on the gate insulating layer GI on which the third gate pattern GP3 is disposed. Accordingly, the interlayer insulating layer ILD_B constituting the second dam pattern DAM2 may be disposed on the third gate pattern GP3.

The second conductive layer 150 may be disposed on the interlayer insulating layer ILD. The first connection line FCNL1 may contact and be electrically connected to a portion of the third gate pattern GP3 exposed through the interlayer insulating layer ILD_B constituting the second dam pattern DAM2.

Figure 23:
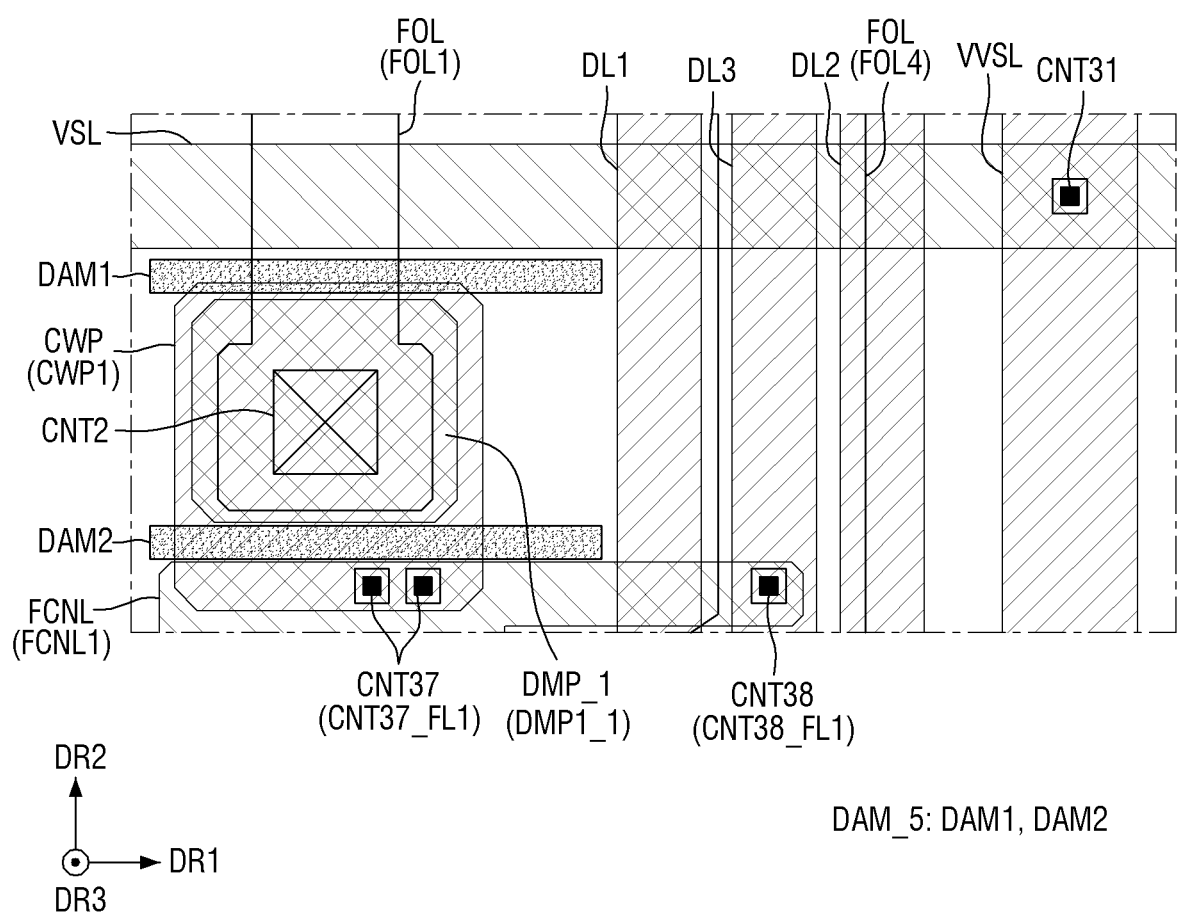
FIG. 23 is a planar layout showing another enlarged example of the area C of FIG. 7.

FIG. 23 is a planar layout showing another enlarged example of the area C of FIG. 7.

Referring to FIG. 23, this embodiment is different from the embodiment of FIG. 18 in that a dam pattern DAM_5 may include a first dam pattern DAM1 and a second dam pattern DAM2.

In this embodiment, the dam pattern DAM5 may include the first dam pattern DAM1 disposed above the second contact hole CNT1 and the second dam pattern DAM2 disposed below the second contact hole CNT1. Although the dam pattern DAM_5 may include only the first dam pattern DAM1 and the second dam pattern DAM2 respectively disposed above and below the second contact hole CNT1, the second voltage line VSL and the first connection line FCNL1 may be patterned to be reliably disconnected from each other via the dam pattern DAM_5.

Hereinafter, the manufacturing process of the display device according to one embodiment will be described.

Figure 24:
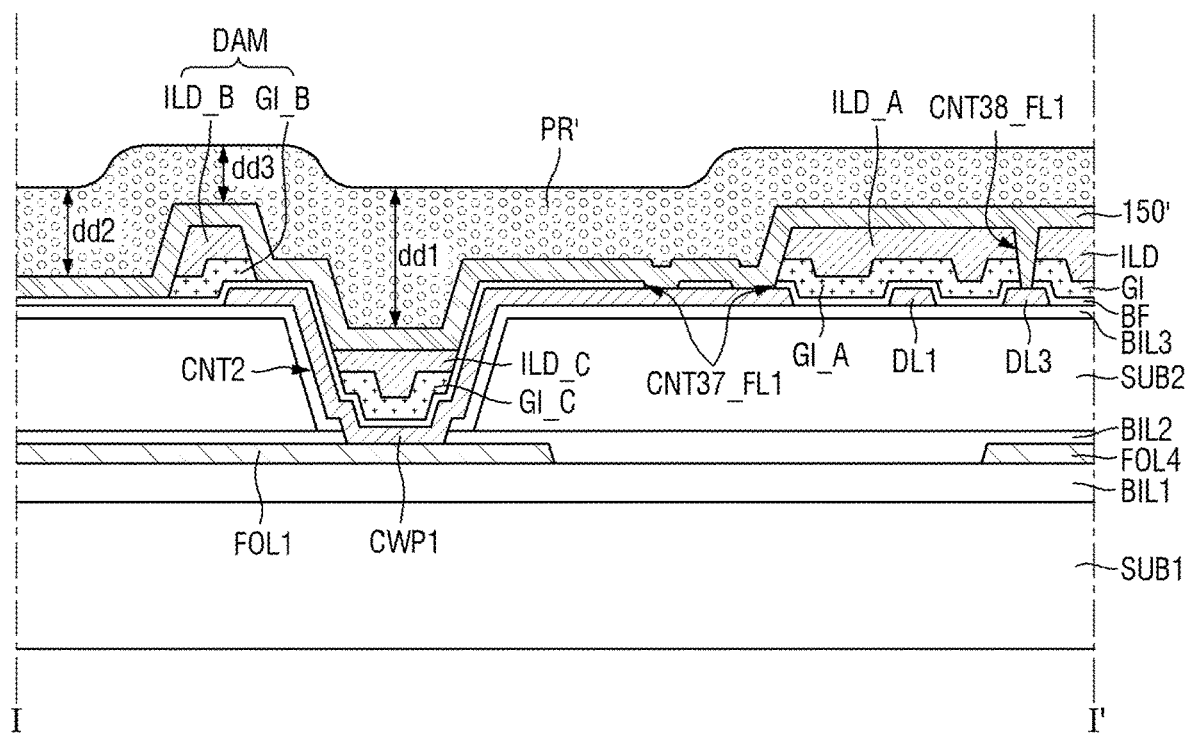
FIG. 24 to FIG. 26 are respectively schematic cross-sectional views of steps of a method for manufacturing a display device in FIG. 11.
Figure 25:
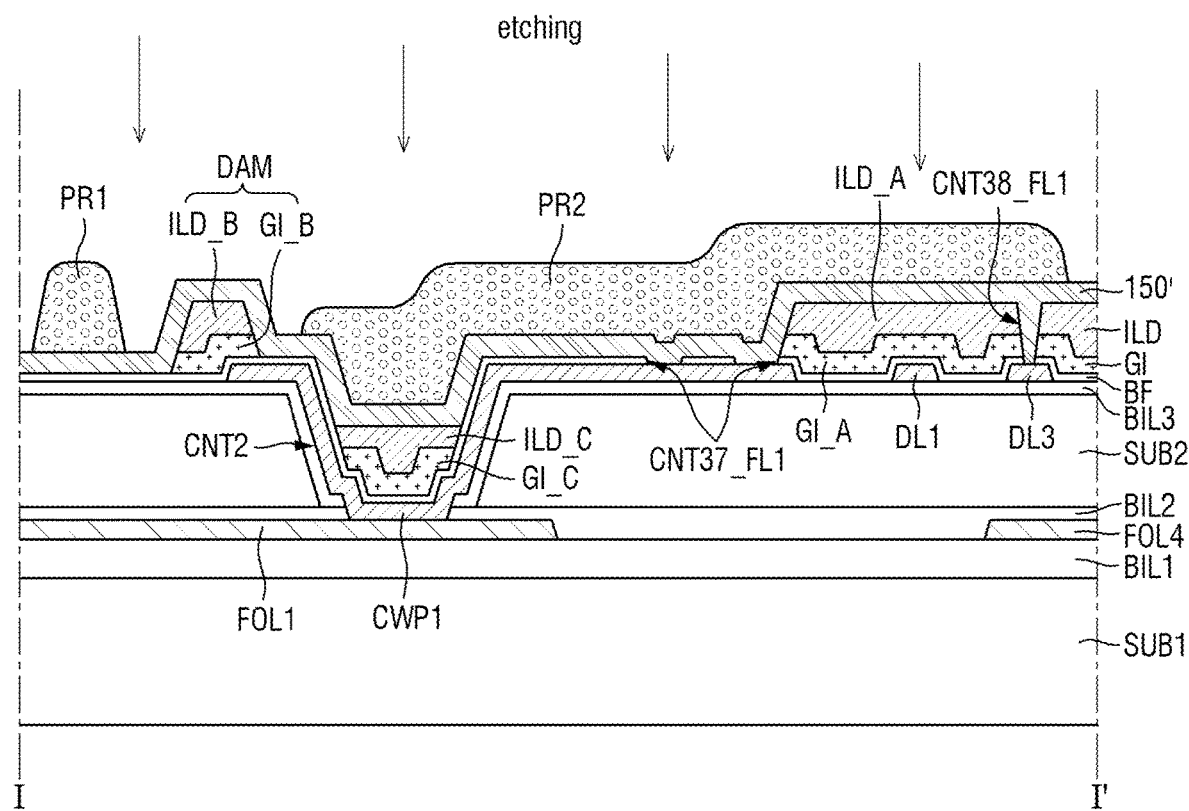
Figure 26:
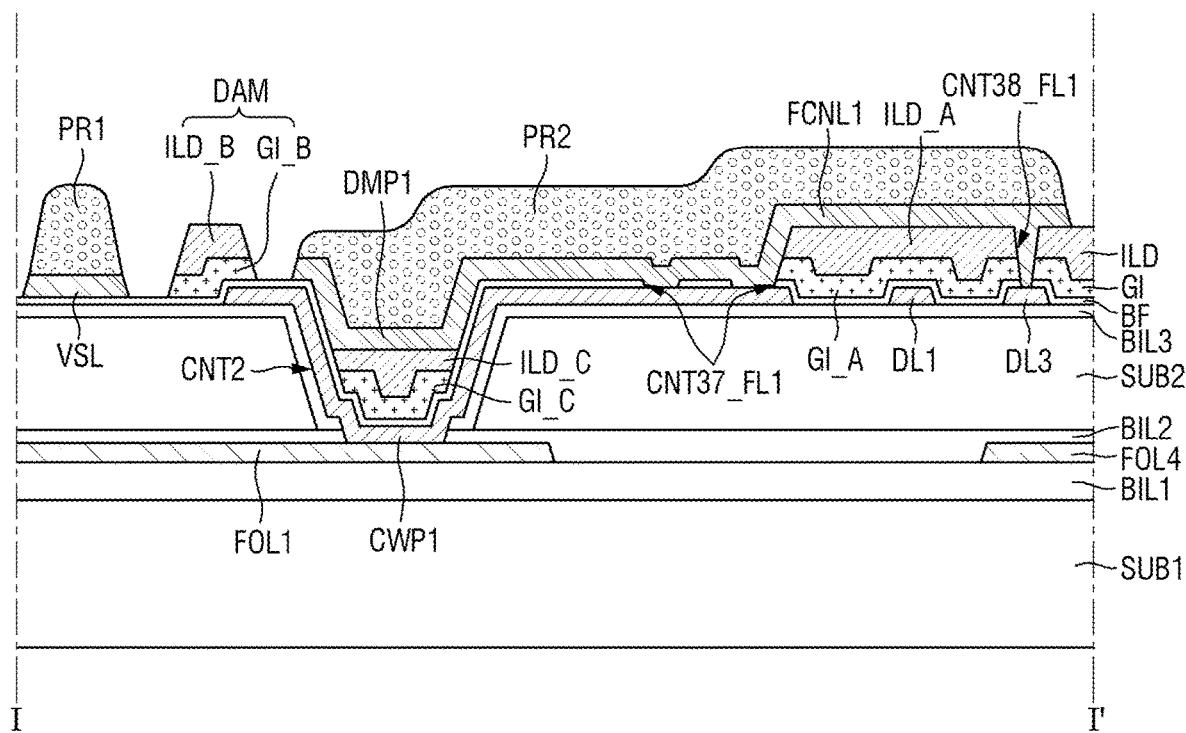

FIG. 24 to FIG. 26 are schematic cross-sectional views of steps of the manufacturing process of the display device in FIG. 11.

First, referring to FIG. 24, a material layer 150' for the second conductive layer is deposited on the dam pattern DAM, the gate insulating layer GI, and the interlayer insulating layer ILD and over an entire area of the substrate SUB1. In the deposition process, the material layer 150' for the second conductive layer may be deposited into an inside of the contact hole CNT38_FL1 extending through the gate insulating layer GI and the interlayer insulating layer ILD and thus may be connected to the third data line DL3. The material layer 150' for the second conductive layer may be deposited into an inside of the contact hole CNT37_FL1 extending through the buffer layer BF and thus may be connected to the first lower connection pattern CWP1.

A photoresist layer PR' is applied on the material layer 150' for the second conductive layer. In this embodiment, the photoresist layer PR' may have a generally flat surface but may include a predefined step according to a shape of an underlying pattern. For example, a vertical level of a surface of a portion of the photoresist layer PR' in an area where the dam pattern DAM is disposed, for example, overlapping the dam pattern may be higher than a vertical level of a surface of a portion of the photoresist layer PR' in an area adjacent to the dam pattern DAM. The vertical level of the surface of the photoresist layer PR' may be measured from a reference plane such as one surface or a surface of the first substrate SUB1. This is based on a fact that the dam pattern DAM disposed under or below the photoresist layer PR' has a predefined thickness.

In one example, a thickness of the photoresist layer PR' may be vary based on an area. For example, a thickness dd3 of the photoresist layer PR' in the area overlapping the dam pattern DAM may be smaller than each of thicknesses dd2 and dd1 of the photoresist layer PR' in the area adjacent to the dam pattern. The thickness dd1 of the photoresist layer PR' in an area overlapping the second contact hole CNT2 may be greater than each of the thicknesses dd2 and dd3 of the photoresist layer PR' in an area adjacent to the second contact hole CNT2. As the photoresist layer PR' fills the second contact hole CNT2 extending through the second substrate SUB2 and thus has a generally flat surface, the thickness dd1 of the photoresist layer PR' in the area overlapping the second contact hole CNT2 may be significantly larger than those in other areas. The thickness dd3 of the photoresist layer PR' in the area overlapping the dam pattern DAM may be smaller than that those in other areas.

Referring to FIG. 25, the applied photoresist layer PR' is exposed to light and developed to form first and second photoresist patterns PR1 and PR2. As described above, the thickness dd1 of the photoresist layer PR' in the area overlapping the second contact hole CNT2 is relatively larger. Thus, even after the exposure and development processes of the photoresist layer PR', a portion of the second photoresist pattern PR2 overlapping the second contact hole CNT2 may partially remain. On this other hand, the thickness dd3 of the photoresist layer PR' in the area overlapping the dam pattern DAM is relatively smaller. Thus, after the exposure and development processes, a portion of the photoresist layer PR' in the area overlapping the dam pattern DAM may be reliably removed. Therefore, in the exposure and development processes that convert the photoresist layer PR' into the first and second photoresist patterns PR1 and PR2, a portion of the photoresist layer PR' disposed on a top surface of the dam pattern DAM may be reliably removed such that a portion of the material layer 150' for the second conductive layer overlapping the dam pattern DAM may be exposed through the first and second photoresist patterns PR1 and PR2.

The material layer 150' for the second conductive layer is etched using the first and second photoresist patterns PR1 and PR2 as an etching mask to form the second voltage line VSL and the first upper connection pattern FCNP1 as shown in FIG. 26. The first and second photoresist patterns PR1 and PR2 are removed using a stripping or an ashing process.

In the manufacturing method of the sub-display device 10 according to this embodiment, the patterning process of the second conductive layer 150 disposed in a peripheral area around the second contact hole CNT2 extending through the second substrate SUB2 may include the processes of exposing and developing the photoresist layer. Due to the step formed by the vertical dimension of the second contact hole CNT2 in the area where the photoresist layer overlaps the second contact hole CNT2, the photoresist layer may remain in the second contact hole CNT2 and the peripheral area around the second contact hole CNT2 even after the exposure and development processes. In this connection, the dam pattern DAM having the predefined thickness may be formed in the peripheral area around the second contact hole CNT2, such that a portion of the photoresist layer disposed on the top surface of the dam pattern DAM may be removed reliably after the exposure and development processes. Thus, in the patterning process of the second conductive layer 150, the second conductive layer 150 disposed on the top surface of the dam pattern DAM may be reliably removed. Therefore, in the patterning process of the second conductive layer 150, the second voltage line VSL and the connection line FCNL disposed adjacent to the second contact hole CNT2 may be reliably disconnected from each other. The reliability of the manufacturing process of the sub-display device 10 may be improved.

What is claimed is:

1. A display device comprising:
 a first substrate including an image producing display area and a non-display area at a periphery of the display area;
 an external signal line disposed on the first substrate;
 a second substrate disposed on the external signal line, the second substrate including a contact hole exposing a surface of the external signal line;
 a lower metal layer disposed on the second substrate, the lower metal layer including a lower connection pattern;
 a dam pattern disposed on the lower metal layer and adjacent to the contact hole;
 a first conductive layer disposed on the lower metal layer, the first conductive layer including a voltage line and a connection line spaced apart from each other,
 a gate insulating layer disposed on the lower metal layer the lower metal layer being disposed between the second substrate and the gate insulating layer in a cross-sectional view;
 a second conductive layer disposed on the gate insulating layer, the gate insulating layer being disposed between the second substrate and the second conductive layer in a cross-sectional view; and
 an interlayer insulating layer disposed on the second conductive layer, the second conductive layer being disposed between the second substrate and the interlayer insulating layer in a cross-sectional view, wherein
 the dam pattern is disposed between the voltage line and the connection line,
 the contact hole overlapping the display area in a plan view, and
 the first conductive layer is disposed on the interlayer insulating layer.

2. The device of claim 1, wherein the lower connection pattern is electrically connected to the external signal line through the contact hole of the second substrate.

3. The device of claim 1, wherein
 the lower metal layer further comprises a data line spaced apart from the lower connection pattern, and
 the connection line electrically connects the lower connection pattern to the data line.

4. The device of claim 1, wherein the dam pattern includes an insulating material.

5. The device of claim 1, wherein the dam pattern, the gate insulating layer, and the interlayer insulating layer are disposed on a same layer.

6. The device of claim 5, wherein the voltage line does not overlap the gate insulating layer and the interlayer insulating layer in a thickness direction of the first substrate.

7. The device of claim 1, wherein
 the dam pattern is disposed on the interlayer insulating layer, and
 the dam pattern has a shape protruding upwards from a surface of the interlayer insulating layer.

8. The device of claim 7, wherein the voltage line is disposed on the interlayer insulating layer.

9. The device of claim 1, wherein the dam pattern has a closed loop shape surrounding the contact hole in a plan view.

10. The device of claim 9, wherein the first conductive layer further comprises a dummy pattern disposed in an area formed by the dam pattern.

11. The display device of claim 1, further comprising:
 a transistor and a pixel disposed on the first conductive layer and in the display area, wherein
 the transistor to activate the pixel to produce light, and the transistor to receive a data voltage and a gate signal from the external signal line through the contact hole in the second substrate.

12. The display device of claim 1, wherein the second substrate is a rigid substrate comprising a glass material.

13. A display device comprising:
 a first substrate;
 an external signal line disposed on the first substrate;
 a second substrate disposed on the external signal line, the second substrate including a contact hole exposing a surface of the external signal line;
 a lower metal layer disposed on the second substrate, the lower metal layer including a lower connection pattern;
 a dam pattern disposed on the lower metal layer and adjacent to the contact hole; and
 a first conductive layer disposed on the lower metal layer, the first conductive layer including a voltage line and a connection line spaced apart from each other, wherein
 the dam pattern is disposed between the voltage line and the connection line,
 the first conductive layer further comprises a dummy pattern disposed between the voltage line and the connection line, and
 the dummy pattern is spaced apart from the voltage line.

14. The device of claim 13, wherein the dummy pattern overlaps the contact hole in a plan view.

15. The device of claim 13, wherein the dummy pattern and the connection line are monolithic.

16. The device of claim 13, wherein
 the dam pattern comprises:
 a first dam pattern disposed between the dummy pattern and the voltage line; and a second dam pattern disposed between the dummy pattern and the connection line, the dummy pattern is spaced apart from the voltage line, the first dam pattern being disposed between the dummy pattern and the voltage line, the dummy pattern is spaced apart from the connection line, the second dam pattern being disposed between the dummy pattern and the connection line.

17. A display device comprising:

a first substrate;

an external signal line disposed on the first substrate;

a second substrate disposed on the external signal line, the second substrate including a contact hole extending through the second substrate and overlapping an end of the external signal line in a plan view;

a connection pattern overlapping an end of the external signal line in a plan view;

a voltage line disposed at a side in a first direction around the contact hole of the second substrate and extending in a second direction intersecting the first direction;

a dam pattern disposed between the contact hole of the second substrate and the voltage line and extending in the second direction;

a connection line disposed at an opposite side of the second substrate in the first direction around the contact hole; and a dummy pattern disposed between the voltage line and the connection line, wherein a width in the second direction of the dam pattern is greater than a width in the second direction of the dummy pattern, and the connection line is electrically connected to the connection pattern.

18. The device of claim 17, wherein the voltage line and the connection line are disposed on a same layer.

19. The device of claim 17, wherein the dam pattern includes an insulating material and protrudes upwards.

20. The device of claim 17, wherein the connection pattern is electrically connected to the external signal line through the contact h ole of the second substrate.

* * * * *